United States Patent
Imam et al.

(10) Patent No.: US 12,379,898 B1
(45) Date of Patent: *Aug. 5, 2025

(54) ASYNCHRONOUS FULL-ADDER WITH MAJORITY OR MINORITY GATES TO GENERATE SUM FALSE OUTPUT

(71) Applicant: Kepler Computing Inc., San Francisco, CA (US)

(72) Inventors: Nabil Imam, Atlanta, GA (US); Amrita Mathuriya, Portland, OR (US); Ikenna Odinaka, Durham, NC (US); Rafael Rios, Austin, TX (US); Rajeev Kumar Dokania, Beaverton, OR (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 727 days.

This patent is subject to a terminal disclaimer.

(21) Appl. No.: 17/650,226

(22) Filed: Feb. 7, 2022

Related U.S. Application Data

(63) Continuation of application No. 17/650,196, filed on Feb. 7, 2022.

(51) Int. Cl.
G06F 7/501 (2006.01)

(52) U.S. Cl.
CPC .................................. G06F 7/501 (2013.01)

(58) Field of Classification Search
CPC ........................................................ G06F 7/501
See application file for complete search history.

(56) References Cited

U.S. PATENT DOCUMENTS

| 3,260,863 A | 7/1966 | Burns et al. |
| 3,524,977 A | 8/1970 | Wang |

(Continued)

FOREIGN PATENT DOCUMENTS

| JP | 2000156472 A | 6/2000 |
| KR | 20160089141 A | 7/2016 |

OTHER PUBLICATIONS

"Kepler Logic", Named for Amalie Emmy Noether @ https://en.wikipedia.org/wiki/Emmy_Noether.

(Continued)

*Primary Examiner* — Andrew Caldwell
*Assistant Examiner* — Jonathan David Warner
(74) *Attorney, Agent, or Firm* — MUGHAL GAUDRY & FRANKLIN PC

(57) ABSTRACT

Asynchronous full-adder circuit is described. The full-adder includes majority and/or minority gates some of which receive two first inputs (A.t, A.f), two second inputs (B.t, B.f), two carry inputs (Cin.t, Cin.f), third acknowledgement input (Cout.e), and fourth acknowledgement input (Sum.e), and generate controls to control gates of transistors, wherein the transistors are coupled to generate two carry outputs (Cout.t, Cout.e), two sum outputs (Sum.t, Sum.e), first acknowledgement output (A.e), second acknowledgement output (B.e), and third acknowledgement output (Cin.e). The majority and/or minority gates comprise CMOS gates or multi-input capacitive circuitries. The multi-input capacitive circuitries include capacitive structures that may comprise linear dielectric, paraelectric dielectric, or ferroelectric dielectric. The capacitors can be planar or non-planar. The capacitors may be stacked vertically to reduce footprint of the asynchronous full-adder circuit. Asynchronous full-adders coupled in series is used to implement a carry-ripple adder.

14 Claims, 38 Drawing Sheets

(56) References Cited

U.S. PATENT DOCUMENTS

| | | | |
|---|---|---|---|
| 5,381,352 A | 1/1995 | Shou et al. | |
| 5,818,380 A | 10/1998 | Ito et al. | |
| 5,835,045 A | 11/1998 | Ogawa et al. | |
| 5,926,057 A | 7/1999 | Ogawa et al. | |
| 5,978,827 A | 11/1999 | Ichikawa | |
| 6,043,675 A | 3/2000 | Miyamoto | |
| 6,198,652 B1 | 3/2001 | Kawakubo et al. | |
| 6,208,282 B1 | 3/2001 | Miyamoto | |
| 7,837,110 B1 | 11/2010 | Hess et al. | |
| 7,897,454 B2 | 3/2011 | Wang et al. | |
| 8,247,855 B2 | 8/2012 | Summerfelt | |
| 9,276,040 B1 | 3/2016 | Marshall et al. | |
| 9,324,405 B2 | 4/2016 | Evans, Jr. et al. | |
| 9,697,882 B1 | 7/2017 | Evans, Jr. et al. | |
| 9,858,979 B1 | 1/2018 | Derner et al. | |
| 9,973,329 B2 | 5/2018 | Hood et al. | |
| 10,217,522 B2 | 2/2019 | Wang et al. | |
| 2001/0052619 A1 | 12/2001 | Noue et al. | |
| 2004/0025074 A1* | 2/2004 | Singh | G06F 9/3869 713/400 |
| 2004/0183508 A1 | 9/2004 | Toyoda et al. | |
| 2015/0337983 A1 | 11/2015 | Dolenti et al. | |
| 2017/0337983 A1 | 11/2017 | Wang et al. | |
| 2018/0076815 A1 | 3/2018 | Vigeant et al. | |
| 2019/0074295 A1 | 3/2019 | Schröder | |
| 2019/0318775 A1 | 10/2019 | Rakshit et al. | |
| 2019/0348098 A1 | 11/2019 | El-Mansouri et al. | |
| 2020/0091414 A1 | 3/2020 | Liu et al. | |
| 2020/0210233 A1 | 7/2020 | Chen et al. | |

OTHER PUBLICATIONS

Fichtner, S. et al., "AlScN: A III-V semiconductor based ferroelectric", Journal of Applied Physics 125, 114103 (2019); https://doi.org/10.1063/1.5084945, 2019, 28 pages.

Lent et al., Quantum Cellular Automata, nanotechnology 4 (1993) pp. 49-57.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., "Threshold Logic and its Applications", New York, Wiley-Interscience. published 1971.

Nowick et al., "Asynchronous Design—Part 1: Overview and Recent Advances." IEEE Design & Test ( vol. 32, Issue: 3, Jun. 2015).

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

Sutherland et al., "Computers without Clocks," Scientific American. Aug. 1, 2002;287(2):62-69.

\* cited by examiner

ASYNCHRONOUS FULL-ADDER WITH MAJORITY OR MINORITY GATES TO GENERATE SUM FALSE OUTPUT

CLAIM OF PRIORITY

This Application is a Continuation Application of, and claims the benefit of priority to U.S. patent application Ser. No. 17/650,196, filed Feb. 7, 2022, and which is incorporated by reference in its entirety for all purposes.

BACKGROUND

Logic circuits can be categorized as synchronous logic or asynchronous logic. Synchronous logic uses a global clock circuit to synchronize various logic components. For example, outputs of a combinational logic block are sampled by latches or flip-flops by a clock to generate synchronized data. Asynchronous logic does not use a global clock to synchronize its various logic components. Instead, asynchronous logic uses handshaking protocols as data propagates from one logic component to another. Existing asynchronous logic uses stacks of transistors between power supply rail and ground rail. Implementing a full-adder with such traditional stacks of transistors, where the stack can be greater than 4 transistors are challenging to use in low voltage conditions (e.g., 1V or less).

The background description provided here is for the purpose of generally presenting the context of the disclosure. Unless otherwise indicated here, the material described in this section is not prior art to the claims in this application and are not admitted as prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
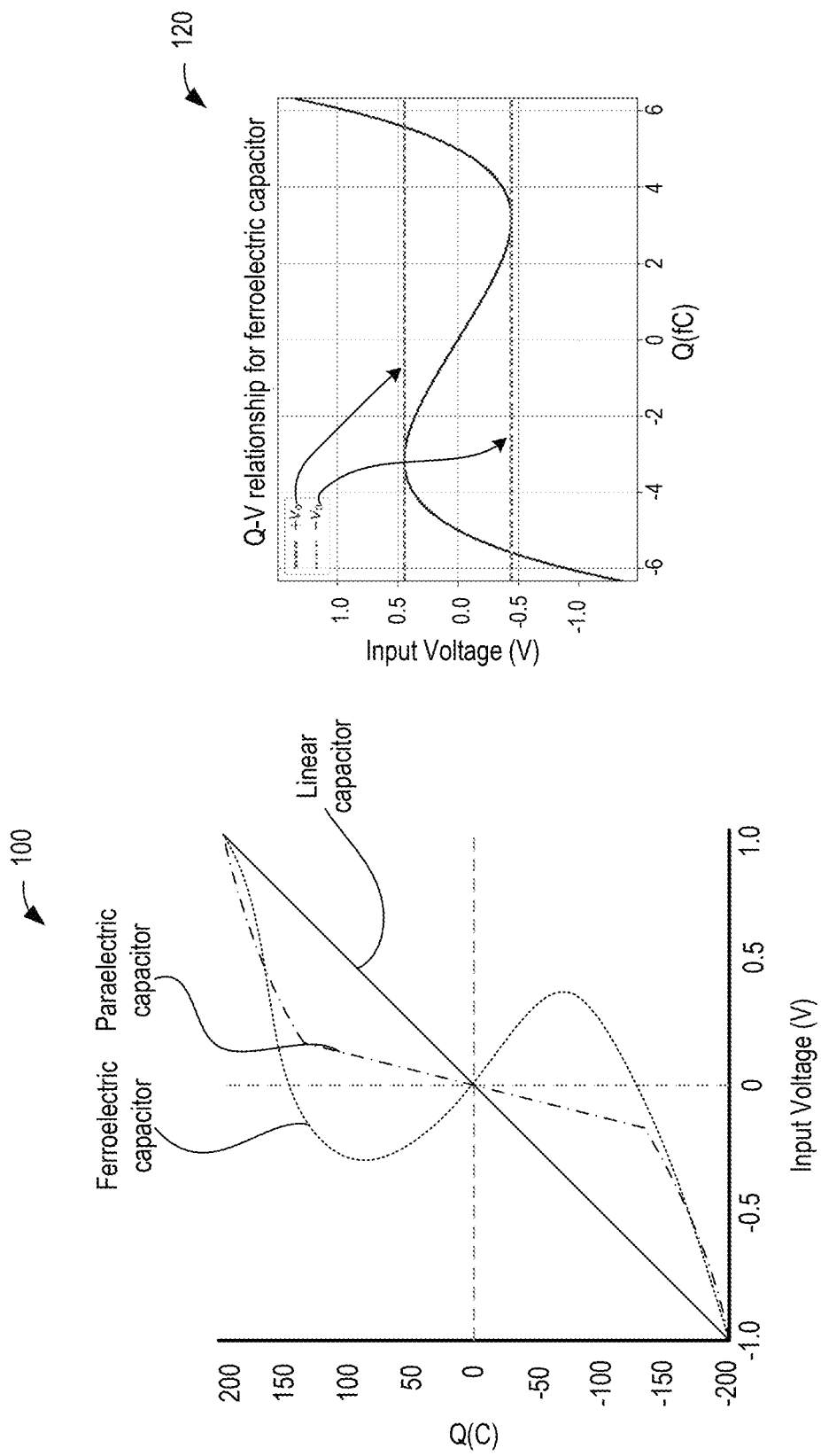
FIG. 1 illustrates a set of plots and showing behavior of a ferroelectric capacitor, a paraelectric capacitor, and a linear capacitor.

Some embodiments describe asynchronous circuits using threshold gate(s) and/or majority gate(s) (or minority gate(s)). The new class of asynchronous circuits can operate at lower power supply levels (e.g., less than 1V on advanced technology nodes) because stack of devices between a supply node and ground are significantly reduced compared to traditional asynchronous circuits. The asynchronous circuits here result in area reduction (e.g., 3× reduction compared to traditional asynchronous circuits) and provide higher throughput/mm$^2$ (e.g., 2× higher throughput compared to traditional asynchronous circuits). The threshold gate(s), majority/minority gate(s) can be implemented using capacitive input circuits. The capacitors of the capacitive input circuits can have linear dielectric or nonlinear polar material (e.g., paraelectric or ferroelectric) as dielectric. While the circuits here are described with reference to asynchronous circuits, the circuits can also be used in synchronous circuits. For example, combinational logic associated with synchronous circuits can use the asynchronous circuits discussed herein. In some embodiments, input signals to threshold or majority gates can be clock signals, which allow these asynchronous circuits to operate as synchronous circuits.

Some embodiments describe an asynchronous full-adder that includes majority and/or minority gates some of which receive two first inputs (A.t, A.f), two second inputs (B.t, B.f), two carry inputs (Cin.t, Cin.f), third acknowledgement input (Cout.e), and fourth acknowledgement input (Sum.e), and generate controls to control gates of transistors, wherein the transistors are coupled to generate two carry outputs (Cout.t, Cout.e), two sum outputs (Sum.t, Sum.e), first acknowledgement output (A.e), second acknowledgement output (B.e), and third acknowledgement output (Cin.e). The majority and/or minority gates comprise CMOS gates or multi-input capacitive circuitries. The multi-input capacitive circuitries include capacitive structures that may comprise linear dielectric, paraelectric dielectric, or ferroelectric dielectric. The capacitors can be planar or non-planar. The capacitors may be stacked vertically to reduce footprint of the asynchronous full-adder circuit. Some embodiments describe an asynchronous ripple carry adder comprises a parallel set of asynchronous full-adders where carry outputs are coupled from one adder to another. Some embodiments describe an asynchronous half-adder.

Some embodiments provide an apparatus and configuring scheme where capacitive input circuit can be programmed to perform different logic functions by adjusting the switching threshold of the capacitive input circuit. These capacitive circuits can become the basic building blocks for the c-element, the completion tree, and/or the validity tree. Digital inputs are received by respective capacitors on first terminals of those capacitors. In various embodiments, these capacitors comprise linear dielectric, paraelectric dielectric material, or ferroelectric dielectric material. The second terminals of the capacitors are connected to a summing node, in accordance with various embodiments. In some embodiments, a pull-up and/or pull-down device is coupled to the summing node. The pull-up and/or pull-down devices are controlled separately.

In some embodiments, during a reset phase, depending on the type of capacitor (linear, paraelectric, or ferroelectric), the inputs to the capacitive input circuit are conditioned and the pull-up or pull-down device is turned on or off. As such the threshold of the capacitive input circuit is set. In some embodiments, when the capacitors have linear dielectric or paraelectric dielectric, one of pull-up or pull-down devices may couple to the summing node. In some embodiments, when the capacitors have ferroelectric dielectric then both pull-up and pull-down devices may couple to the summing node. In one such embodiment, the pull-up and pull-down devices are turned on and off in a sequence and inputs are conditioned to adjust the threshold of the capacitive input circuit. After the reset phase, an evaluation phase follows, in accordance with some embodiments. In the evaluation phase, the output of the capacitive input circuit is determined based on the inputs and the logic function configured during the reset phase, in accordance with various embodiments. For example, the capacitive input circuit may operate as a NAND/AND gate, NOR/OR gate, majority/minority, threshold gate, or other complex gates based on its threshold configuration. In various embodiments, during the evaluation phase, the pull-up and pull-down devices coupled to the summing node are turned off. In some embodiments, all input capacitors have the same capacitance (e.g., same weight or ratio). In some embodiments, the input capacitors may have different capacitance. In that case, the switching threshold for the input capacitor circuit is modified differently by the reset phase. In some embodiments, a different logic gate can be realized by sequencing the turning on and off of the pull-up and pull-down devices and changing inputs to the input capacitor circuit during the reset phase.

While the embodiments are described with reference to up to 5-input capacitive circuit using equal ratio for the capacitance, the same idea can be expanded to any number of input capacitive circuit with equal or unequal ratio for capacitances. In various embodiments, the capacitances are nonlinear capacitors. For example, instead of linear dielectric, the capacitors include nonlinear dielectric material. Examples of nonlinear dielectric material include ferroelectric material and paraelectric material.

In some embodiments, the capacitor are planar capacitors. In some embodiments, the capacitors are pillar or trench capacitors. In some embodiments, the capacitors are vertically stacked capacitors to reduce the overall footprint of the multi-input capacitive circuit. In some embodiments, the transistors (MP1 and/or MN1) that charge or discharge the summing node n1 are planar or non-planar transistors. In some embodiments, transistors MP1 and/or MN1 are fabricated in the front-end of the die on a substrate. In some embodiments, when the capacitors have ferroelectric material, one of the transistors (e.g., MP1 or MN1) is fabricated in the front-end of the die while another one of the transistors is fabricated in the backend such that the stack of capacitors is between the frontend of the die and the backend of the die or between the two transistors. As such, the footprint of the multi-input capacitive circuit may be a footprint of a single transistor or slightly more than that. The various possible implementations of the c-element, the completion tree, and the validity tree using the adjustable threshold gate-based logic circuit allows for lower power and smaller area based asynchronous circuits compared to traditional asynchronous circuits.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction, and may be implemented with any suitable type of signal scheme.

It is pointed out that those elements of the figures having the same reference numbers (or names) as the elements of any other figure can operate or function in any manner like that described but are not limited to such.

FIG. 1 illustrates a set of plots showing behavior of a ferroelectric capacitor, a ferroelectric capacitor, and a linear capacitor. Plot 100 compares the transfer function for a linear capacitor, a paraelectric (PE) capacitor (a nonlinear capacitor) and a ferroelectric (FE) capacitor (a nonlinear capacitor). Here, the x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly nonlinear transfer function in the polarization versus voltage response. The threshold is related to: a) nonlinearity of switching transfer function; and b) the squareness of the FE switching. The nonlinearity of switching transfer function is the width of the derivative of the polarization versus voltage plot. The squareness is defined by the ratio of the remnant polarization to the saturation polarization, perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a nonlinear dielectric. The squareness of the FE switching can also be changed by the granularity of an FE layer. A perfectly epitaxial, single crystalline FE layer will show higher squareness (e.g., ratio is closer to 1) compared to a polycrystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 120 shows the charge and voltage relationship for a ferroelectric capacitor. A capacitor with ferroelectric material (also referred to as an FEC) is a nonlinear capacitor with its potential $V_F(Q_F)$ as a cubic function of its charge. Plot 120 illustrates characteristics of an FEC. Plot 120 is a charge-voltage (Q-V) plot for a block of $Pb(Zr_{0.5}Ti_{0.5})O_3$ of area $(100 \text{ nm})^2$ and thickness 30 nm (nanometer). Plot 120 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of atoms of B. In some embodiments, the perovskite can be doped (e.g., by La or lanthanides). In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, $BaTiO_3$, $KNbO_3$, $NaTaO_3$, etc. may be used for the FE material. Perovskites can be suitably doped to achieve a spontaneous distortion in a range of 0.3% to 2%. For example, for chemically substituted lead titanate such as Zr in Ti site; La or Nb in Ti site, the concentration of these substitutes is such that it achieves the spontaneous distortion in the range of 0.3% to 2%. For chemically substituted BiFeO3, BrCrO3, BuCoO3 class of materials, La or rare earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between conductive oxides. In various embodiments, when FE material is a perovskite, the conductive oxides are of the type $AA'BB'O_3$. A' is a dopant for atomic site A, it can be an element from the lanthanides series. B' is a dopant for atomic site B, it can be an element from the transition metal elements, especially Sc, Ti, V, Cr, Mn, Fe, Co, Ni, Cu, and Zn. A' may have the same valency of site A, with a different ferroelectric polarizability. In various embodiments, when metallic perovskite is used for the FE material, conductive oxides can include one or more of: $IrO_2$, $RuO_2$, $PdO_2$, $OsO_2$, or $ReO_3$. In some embodiments, the perovskite is doped with La or lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05 or 0.5, and y is 0.95), HfZrO2, Hf—Si—O, La-substituted PbTiO3, PMN-PT based relaxor ferroelectrics.

In some embodiments, the FE material comprises one or more of: hafnium (Hf), zirconium (Zr), aluminum (Al), silicon (Si), their oxides, or their alloyed oxides. In some embodiments, FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material includes one or more of: bismuth ferrite (BFO), lead zirconate titanate (PZT), BFO with a first doping material, or PZT with a second doping material, wherein the doping material is one of Nb or La and relaxor ferroelectrics such as PMN-PT.

In some embodiments, the FE material includes bismuth ferrite (BFO) with a first doping material where in the first doping material is one of lanthanum or any element from the lanthanide series of the periodic table. In some embodiments, FE material includes lead zirconium titanate (PZT) or PZT with a second doping material, wherein the second doping material is one of La or Nb. In some embodiments, FE material includes a relaxor ferroelectric including one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST).

In some embodiments, the FE material includes hafnium oxides of the form, Hf(1-x)ExOy where E can be Al, Ca, Ce, Dy, Er, Gd, Ge, La, Sc, Si, Sr, Sn, or Y. In some embodiments, the FE material includes niobate type compounds LiNbO3, LiTaO3, lithium iron tantalum oxy fluoride, barium strontium niobate, sodium barium niobate, or potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are 'n' octahedral layers in thickness can be used. In some embodiments, the FE material comprises organic material. For example, polyvinylidene fluoride or polyvinylidene difluoride (PVDF).

In some embodiments, the FE material comprises hexagonal ferroelectrics of the type h-RMnO3, where R is a rare earth element which includes one of cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 and 100. In some embodiments, the paraelectric material includes one of: SrTiO3, Ba(x)Sr(y)TiO3 (where x is −0.5, and y is 0.95), BaTiO3, HfZrO2, Hf—Si—O, La-substituted PbTiO3, or PMN-PT based relaxor ferroelectrics.

Figure 2:
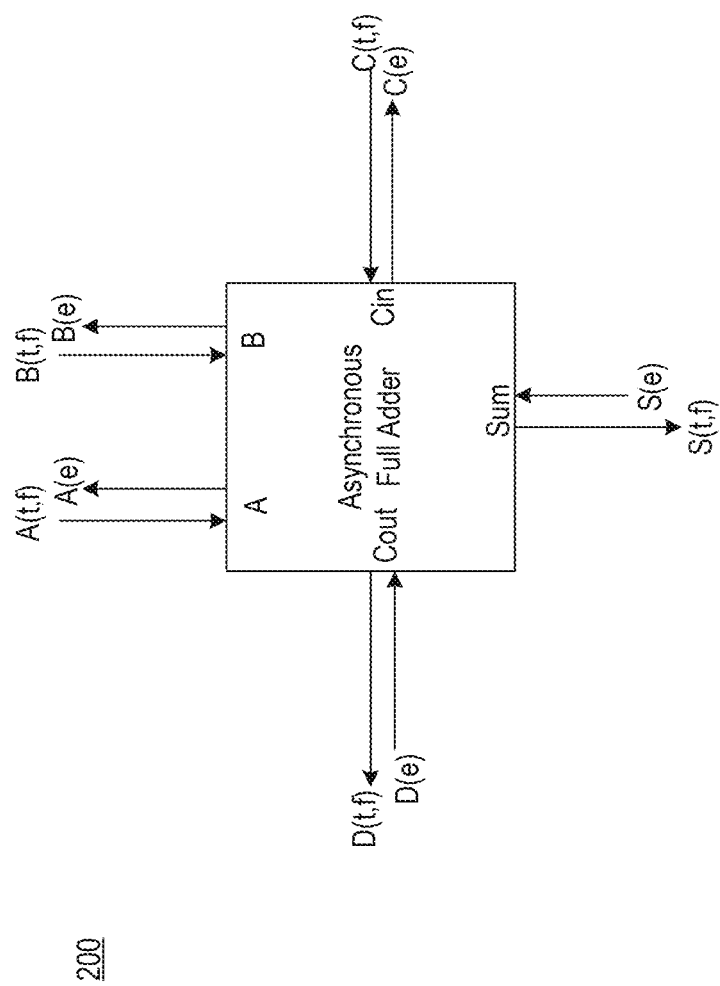
FIG. 2 illustrates an asynchronous full-adder with sets of signals including true, false, and acknowledgement signals associated with the inputs, carry-in input, carry-out output, and sum output, where the asynchronous full-adder comprises majority and/or minority gates, in accordance with some embodiments.

FIG. 2 illustrates asynchronous full-adder 200 with sets of signals including true, false, and acknowledgement signals associated with the inputs, carry-in input, carry-out output, and sum output, where the asynchronous full-adder comprises majority and/or minority gates, in accordance with some embodiments. The majority and/or minority gates are used to generate controls for transistors that are used to generate the bit signals associated with inputs, carry-in input, carry-out output, and sum output. The majority and/or minority gates can be implemented as CMOS logic gates, magnetoelectric spin orbit (MESO) based logic gate, or quantum cellular automata. In some embodiments, majority and/or minority gates can be implemented as capacitive input circuits. These capacitive input circuits can be implemented by configuring a threshold of an adjustable threshold gate. As such, the majority and/or minority gates can be implemented by threshold gates. The capacitors of the capacitive input circuits can be linear capacitors or non-linear capacitors (e.g., capacitors with non-linear polar material). Examples of non-linear polar material are paraelectric material and ferroelectric material.

In various embodiments, asynchronous full-adder uses two types of data channels. These data channels comprise true and false signals for every data bit, and an enable signal associated with every data bit. Assuming for explanation that the data channel is X, then the data channel X includes false bit X.f, true bit X.t, and enable bit X.e. If X is logic 0, then X.f is set to logic 1 and X.t is set to logic 0. If X is logic 1, then X.t is set to logic 1 and X.f is set to logic 0. The logic value of X is set by a sender of that signal. The enable signal X.e is set by the receiver of the data X. The enable signal is indicative of receipt of data or an acknowledgement. In some embodiments, receipt of data by the receiver is acknowledged by setting X.e to a logic 0. If the data signals are in neutral state (e.g., if X.t and X.f are both at logic 0), the receiver sets the enable signal to logic 1 (X.e is set to logic 1). Here, enable (e.g., X.e) is the inverted sense of the acknowledge. Once the acknowledge (which is inverted sense of enable) arrives (e.g., X.e=0), the signal (X.f or X.t) that was driven to Vdd, is driven back to ground.

In some embodiments, the data channel may include an additional signal referred to as a validity signal. Continuing with the example, the validity signal for data X is X.v. In some embodiments, data rails are passed through a validity tree to get X.v. A validity tree applies an OR function to the inputs, and the outputs of the OR function are input into C-elements to generate a validity signal.

In some embodiments, asynchronous full-adder 200 receives 1-bit operands via channel A and B, and 1-bit carry-in via channel C. Channel A has true bit input A.t, false bit input A.f, and enable bit output A.e. Channel B has true bit input B.t, false bit input B.f, and enable bit output B.e. Channel C has true bit input C.t, false bit input C.f, and enable bit output C.e. The carry output is provided via Channel D. Channel D has a true bit output D.t, a false but output D.f, and an enable input D.e. The sum output is generated by Channel S. Channel S has a true bit output S.t, a false but output S.f, and an enable input S.e. The logic for S and D (e.g., their pull-up and pull-down networks) are illustrated with reference to FIGS. 3-6.

Figure 3:
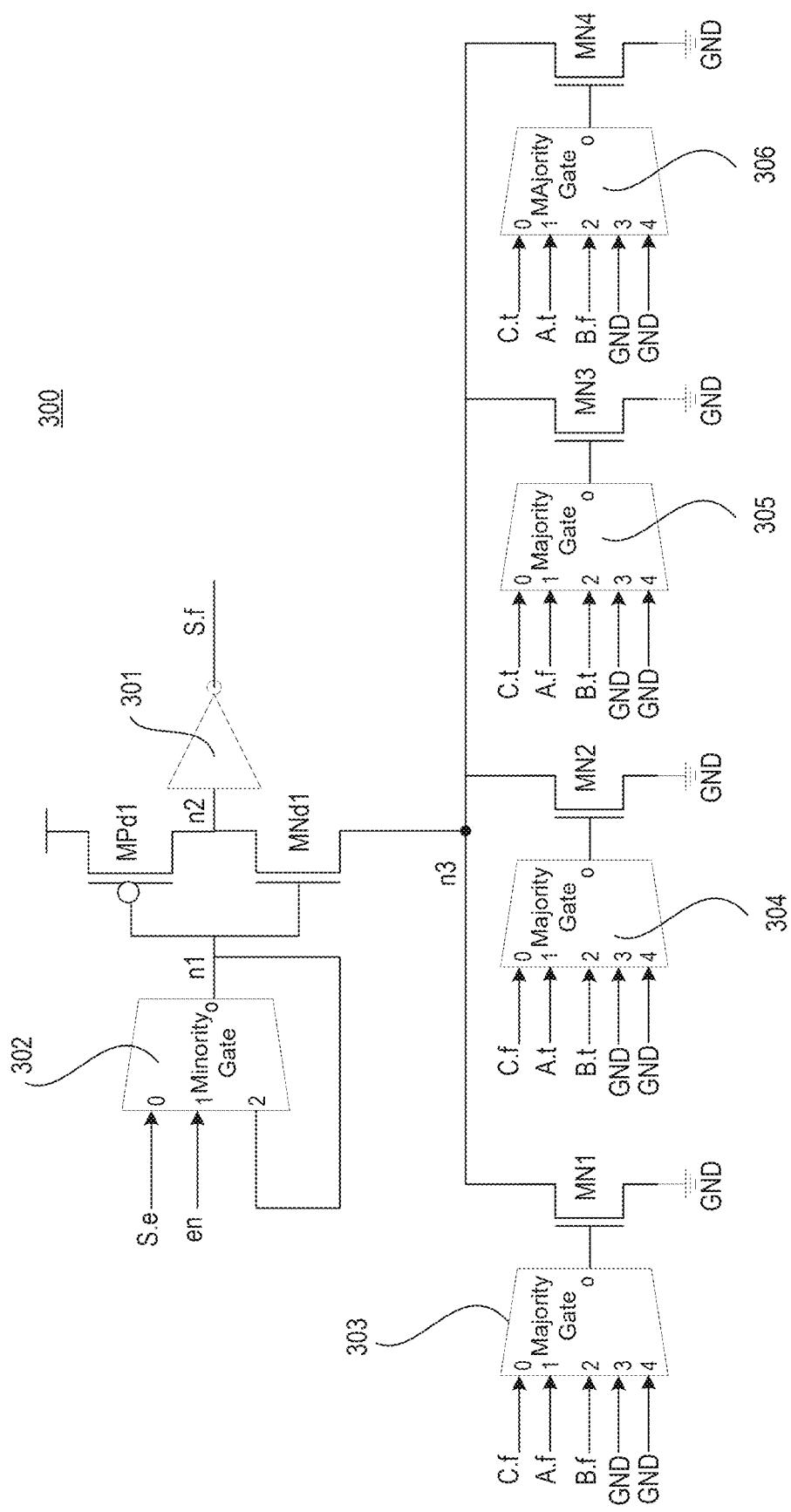
FIG. 3 illustrates a schematic for generating a sum false output for the asynchronous full-adder, in accordance with some embodiments.

FIG. 3 illustrates schematic 300 for generating a sum false output (S.f) for the asynchronous full-adder, in accordance with some embodiments. Schematic 300 comprises 3-input minority gate 302, first majority gate 303, second majority gate 304, third majority gate 305, fourth majority gate 306, p-type transistor MPd1, n-type transistor MNd1, n-type transistor MN1, n-type transistor MN2, n-type transistor MN3, n-type transistor MN4, supply rail Vdd, ground rail GND, nodes n1, n2, n3, and S.f, and inverter 301 coupled as shown. Signals for schematic 300 that generate S.f include A.f, B.f, C.f, GND, A.t, B.t, C.t, S.e, and enable en. In some embodiments, p-type transistor MPd1 is coupled in series with n-type transistor MNd1. The gate terminals of MPd1 and MNd1 are coupled with node n1. The drain terminals of MPd1 and MNd1 are coupled to node n2. Node n2 is coupled an input of inverter 301. The output of inverter 301 is S.f. In various embodiments, minority gate 302 receives three inputs, S.e, en, and node n1.

In some embodiments, source terminal n3 of MNd1 is coupled to transistors MN1, MN2, MN3, and MN4. Transistors MN1, MN2, MN3, and MN4 are coupled in parallel between nodes n3 and GND. In some embodiments, a gate terminal of transistor MN1 is controlled by an output of first majority gate 303. In some embodiments, first majority gate 303 performs a majority function of five inputs C.f, A.f, B.f, GND, and GND. In some embodiments, a gate terminal of transistor MN2 is controlled by an output of majority gate 304. In some embodiments, second majority gate 304 performs a majority function of five inputs C.f, A.t, B.t, GND, and GND. In some embodiments, a gate terminal of transistor MN3 is controlled by an output of third majority gate 305. In some embodiments, third majority gate 305 performs a majority function of five inputs C.t, A.f, B.t, GND, and GND. In some embodiments, a gate terminal of transistor MN4 is controlled by an output of fourth majority gate 306. In some embodiments, fourth majority gate 306 performs a majority function of five inputs C.t, A.t, B.f, GND, and GND.

In various embodiments, majority gates with ground inputs (e.g., gates 303, 304, 305, 306) can be replaced with a threshold gate having a threshold of 3. As a general example, for 'n' number of ground inputs to the gates (e.g., gate 303), a corresponding threshold gate may have a threshold of "n+1". Configurable threshold gates are described with reference to FIGS. 15-20.

Figure 4:
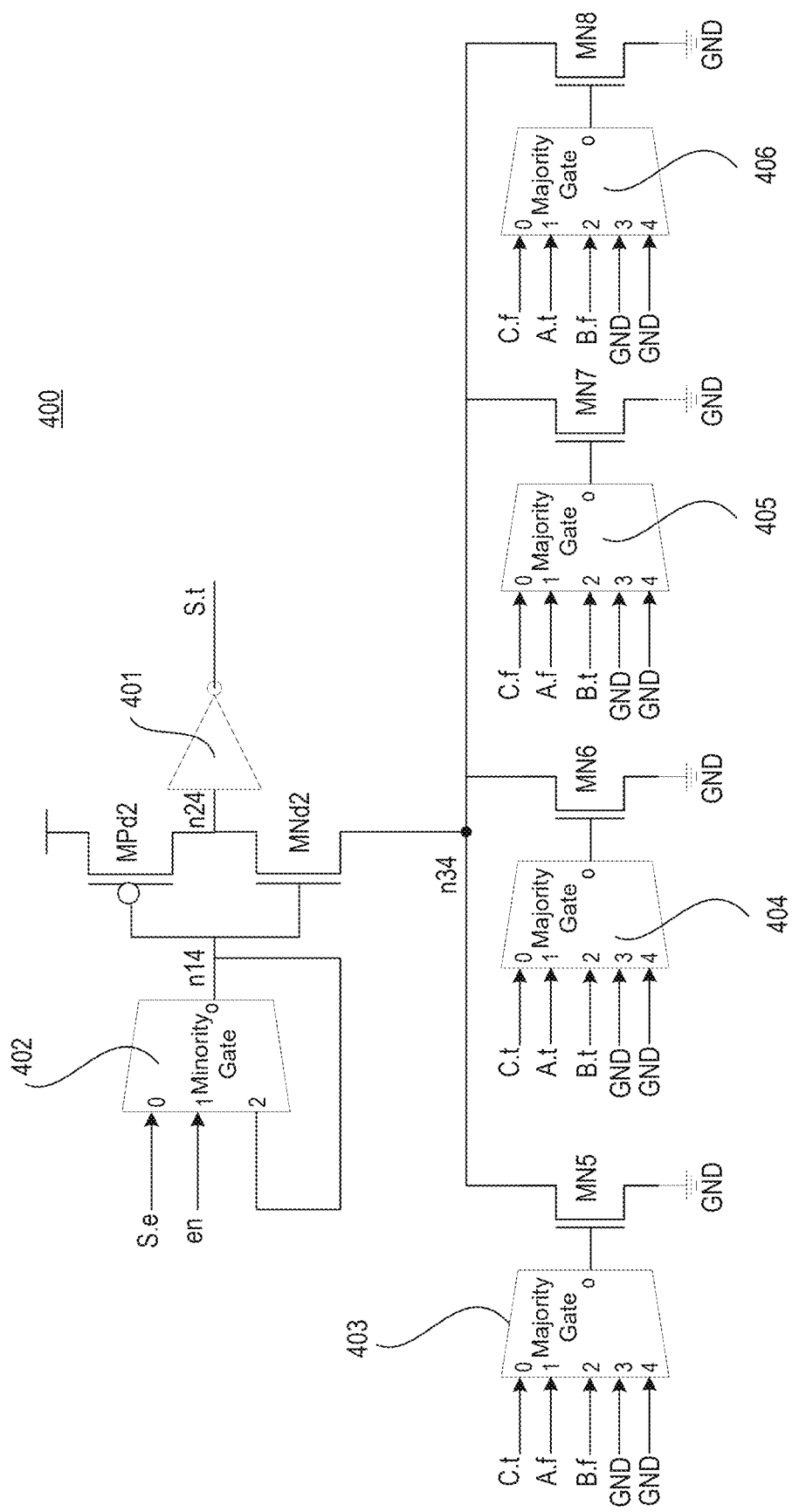
FIG. 4 illustrates a schematic for generating a sum true output for the asynchronous full-adder, in accordance with some embodiments.

FIG. 4 illustrates schematic 400 for generating a sum true output (S.t) for the asynchronous full-adder, in accordance with some embodiments. Schematic 400 comprises 3-input minority gate 402, first majority gate 403, second majority gate 404, third majority gate 405, fourth majority gate 406, p-type transistor MPd2, n-type transistor MNd2, n-type transistor MN5, n-type transistor MN6, n-type transistor MN7, n-type transistor MN8, supply rail Vdd, ground rail GND, nodes n14, n24, n34, and S.t, and inverter 401 coupled as shown. Signals for schematic 400 that generate S.t include A.f, B.f, C.f, GND, A.t, B.t, C.t, S.e, enable en. In some embodiments, p-type transistor MPd2 is coupled in series with n-type transistor MNd2. The gate terminals of MPd2 and MNd2 are coupled with node n14. The drain terminals of MPd2 and MNd2 are coupled to node n24. Node n24 is coupled an input of inverter 401. The output of inverter 401 is S.t. In various embodiments, minority gate 402 receives three inputs, S.e, en, and node n14.

In some embodiments, source terminal n34 of MNd2 is coupled to transistors MN5, MN6, MN7, and MN8. Transistors MN5, MN6, MN7, and MN8 are coupled in parallel between nodes n34 and GND. In some embodiments, a gate terminal of transistor MN5 is controlled by an output of majority gate 403. In some embodiments, first majority gate 403 performs a majority function of five inputs C.t, A.f, B.f, GND, and GND. In some embodiments, a gate terminal of transistor MN6 is controlled by an output of second majority gate 404. In some embodiments, second majority gate 404 performs a majority function of five inputs C.t, A.t, B.t, GND, and GND. In some embodiments, a gate terminal of transistor MN7 is controlled by an output of third majority gate 405. In some embodiments, third majority gate 405 performs a majority function of five inputs C.f, A.f, B.t, GND, and GND. In some embodiments, a gate terminal of transistor MN8 is controlled by an output of majority gate 406. In some embodiments, fourth majority gate 406 performs a majority function of five inputs C.f, A.t, B.f, GND, and GND.

Figure 5:
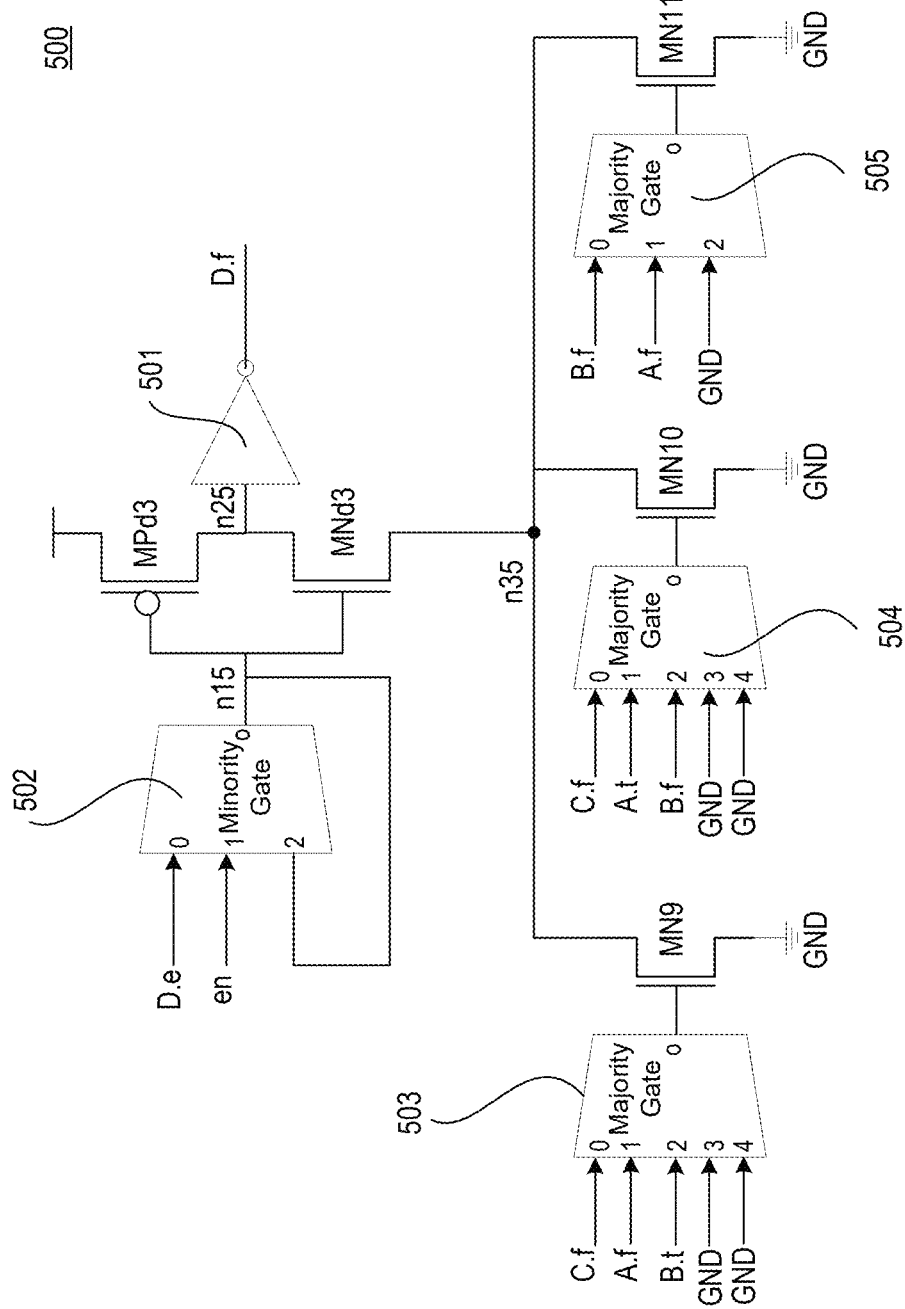
FIG. 5 illustrates a schematic for generating a carry-out false output for the asynchronous full-adder, in accordance with some embodiments.

FIG. 5 illustrates schematic 500 for generating a carry-out false output D.f for the asynchronous full-adder, in accordance with some embodiments. Schematic 500 comprises 3-input minority gate 502, first majority gate 503, second majority gate 504, third majority gate 505, p-type transistor MPd3, n-type transistor MNd3, n-type transistor MN9, n-type transistor MN10, n-type transistor MN11, supply rail Vdd, ground rail GND, nodes n15, n25, n35, and D.f, and inverter 501, coupled as shown. Signals for schematic 500 that generate D.f include A.f, B.f, C.f, GND, A.t, B.t, D.e, and enable en. In some embodiments, p-type transistor MPd3 is coupled in series with n-type transistor MNd3. The gate terminals of MPd3 and MNd3 are coupled with node n15. The drain terminals of MPd3 and MNd3 are coupled to node n25. Node n25 is coupled with an input of inverter 501. The output of inverter 501 is D.f. In various embodiments, minority gate 502 receives three inputs, D.e, en, and node n15.

In some embodiments, source terminal n35 of MNd3 is coupled to transistors MN9, MN10, and MN11. Transistors MN9, MN10, and MN11 are coupled in parallel between nodes n35 and GND. In some embodiments, a gate terminal of transistor MN9 is controlled by an output of first majority gate 503. In some embodiments, first majority gate 503 performs a majority function of five inputs C.f, A.f, B.f, GND, and GND. In some embodiments, a gate terminal of transistor MN10 is controlled by an output of second majority gate 504. In some embodiments, second majority gate 504 performs a majority function of five inputs C.f, A.t, B.f, GND, and GND. In some embodiments, a gate terminal of transistor MN11 is controlled by an output of third majority gate 505. In some embodiments, third majority gate 505 performs a majority function of three inputs B.f, A.f, and GND (ground).

Figure 6:
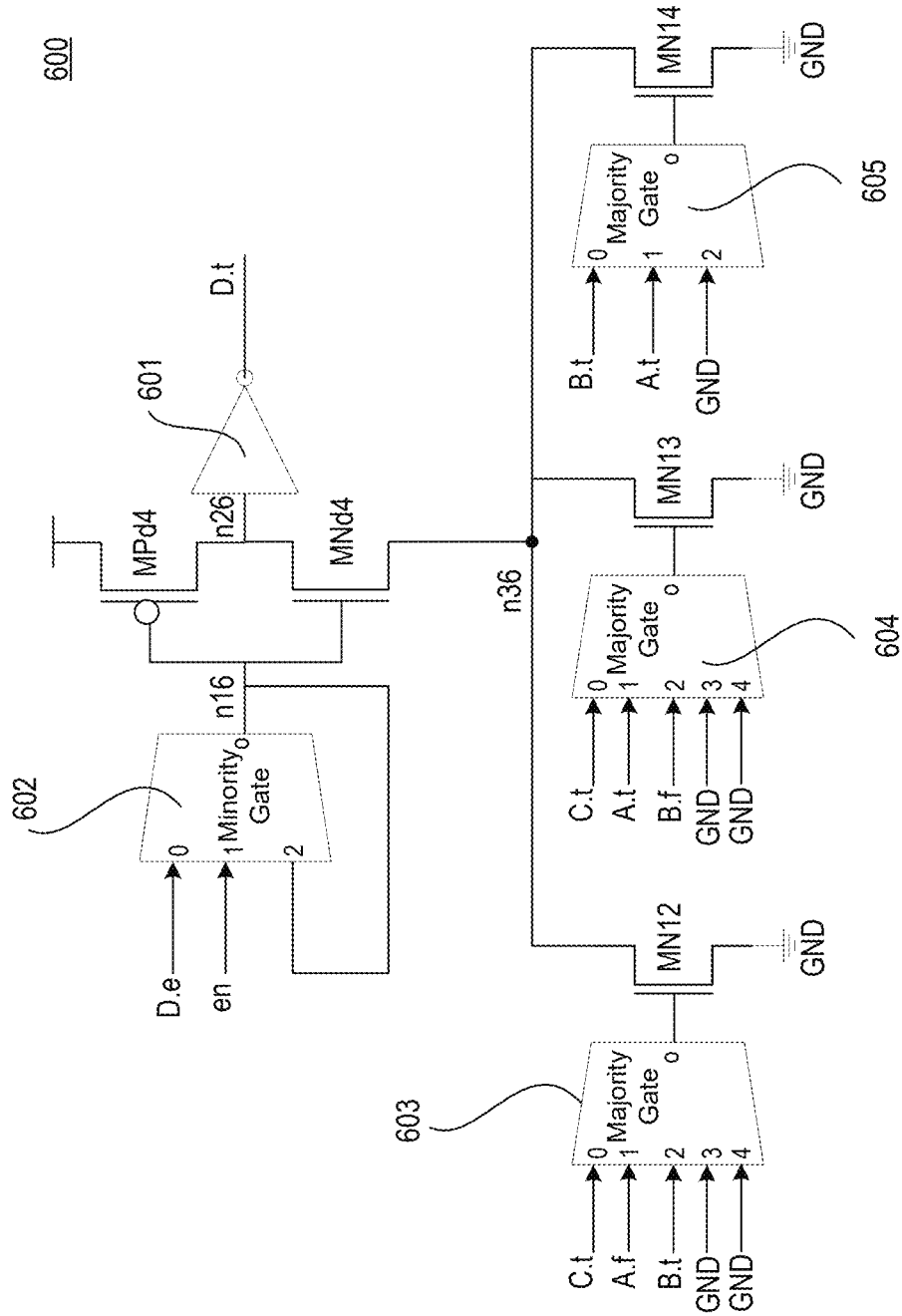
FIG. 6 illustrates a schematic for generating a carry-out true output for the asynchronous full-adder, in accordance with some embodiments.

FIG. 6 illustrates schematic 600 for generating a carry-out true output D.t for the asynchronous full-adder, in accordance with some embodiments. Schematic 600 comprises 3-input minority gate 602, first majority gate 603, second majority gate 604, third majority gate 605, p-type transistor MPd4, n-type transistor MNd4, n-type transistor MN12, n-type transistor MN13, n-type transistor MN14, supply rail Vdd, ground rail GND, nodes n16, n26, n36, and D.t, and inverter 601, coupled as shown. Signals for schematic 600 that generate D.t include A.f, B.f, C.t, GND, A.t, B.t, D.e, and enable en. In some embodiments, p-type transistor MPd4 is coupled in series with n-type transistor MNd4. The gate terminals of MPd4 and MNd4 are coupled with node n16. The drain terminals of MPd4 and MNd4 are coupled to node n26. Node n26 is coupled an input of inverter 601. The output of inverter 601 is D.t. In various embodiments, minority gate 602 receives three inputs, D.e, en, and node n16.

In some embodiments, source terminal n36 of MNd4 is coupled to transistors MN12, MN13, and MN14. Transistors MN12, MN13, and MN14 are coupled in parallel between nodes n36 and GND. In some embodiments, a gate terminal of transistor MN12 is controlled by an output of first majority gate 603. In some embodiments, first majority gate 603 performs a majority function of five inputs C.t, A.f, B.t, GND, and GND. In some embodiments, a gate terminal of transistor MN13 is controlled by an output of second majority gate 604. In some embodiments, second majority gate 604 performs a majority function of five inputs C.t, A.t, B.f, GND, and GND. In some embodiments, a gate terminal of transistor MN14 is controlled by an output of third majority gate 605. In some embodiments, third majority gate 605 performs a majority function of three inputs B.t, A.t, and GND.

Figure 7:
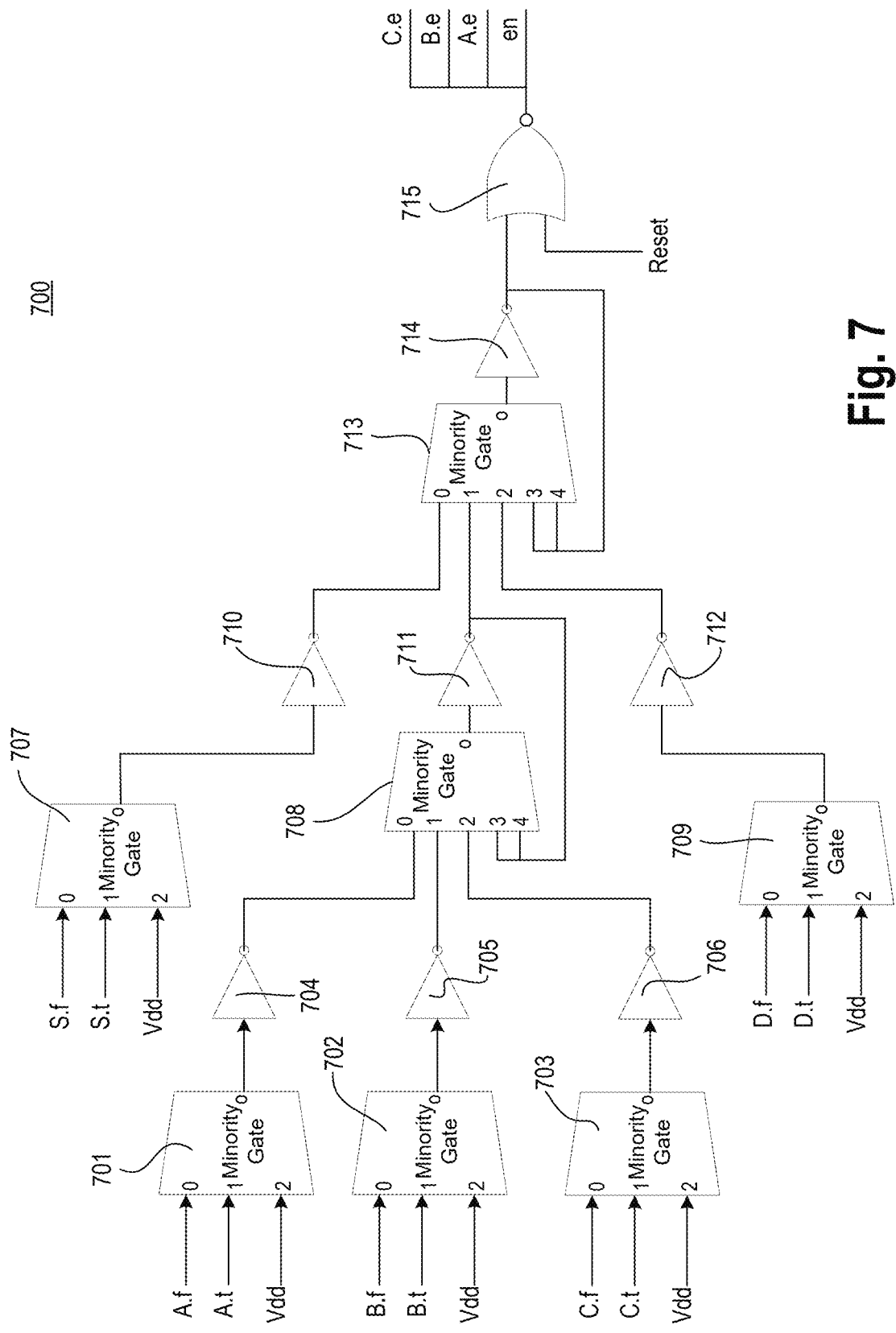
FIG. 7 illustrates a schematic for generating acknowledgement and enabling signals for the asynchronous full-adder, in accordance with some embodiments.

FIG. 7 illustrates schematic 700 for generating acknowledgement and enabling signals C.e, B.e, A.e, and en for the asynchronous full-adder, in accordance with some embodiments. Schematic 700 comprises first minority gate 701, second minority gate 702, third minority gate 703, first inverter 704, second inverter 705, third inverter 706, fourth minority gate 707, fifth minority gate 708, sixth minority gate 709, fourth inverter 710, fifth inverter 711, sixth inverter 712, seventh minority gate 713, seventh inverter 714, and NOR gate 715. The outputs of NOR gate 715 are the acknowledgement signals en, A.e, B.e, and C.e.

In some embodiments, first minority gate 701 receives three inputs, A.f, A.t, and Vdd. First minority gate 701 performs a minority function on inputs A.f, A.t and Vdd. The output of first minority gate 701 is inverted by first inverter 704. The output of first inverter 704 is provided to fifth minority gate 708. In some embodiments, second minority gate 702 receives three inputs, B.f, B.t, and Vdd. Second minority gate 702 performs a minority function on inputs B.f, B.t and Vdd. The output of second minority gate 702 is inverted by second inverter 705. The output of second inverter 705 is provided to fifth minority gate 708. In some embodiments, third minority gate 703 receives three inputs, C.f, C.t, and Vdd. Third minority gate 703 performs a minority function on inputs C.f, C.t and Vdd. The output of third minority gate 703 is inverted by third inverter 706. The output of third inverter 706 is provided to fifth minority gate 708. Other two inputs to the 5-input fifth minority gate 708 are output from fifth inverter 711. The output of 5-input fifth minority gate 708 is a majority function of the five inputs. The output of 5-input fifth minority gate 708 is received by fifth inverter 711.

In some embodiments, fourth minority gate 707 receives three inputs, S.f, S.t, and Vdd. Fourth minority gate 707 performs a minority function on inputs S.f, S.t and Vdd. The output of fourth minority gate 707 is inverted by fourth inverter 710. The output of fourth inverter 710 is provided to 5-input seventh minority gate 713. In various embodiments, the output of inverter 711 is provided to minority gate 713. In some embodiments, sixth minority gate 709 receives three inputs, D.f, D.t, and Vdd. Sixth minority gate 709 performs a minority function on inputs D.f, D.t and Vdd. The output of sixth minority gate 709 is inverted by sixth inverter 712. The output of fourth inverter 710 is provided to 5-input seventh minority gate 713. Other two inputs to the 5-input seventh minority gate 713 are output from seventh inverter 714. The output of 5-input seventh minority gate 713 is a majority function of the five inputs. The output of 5-input seventh minority gate 713 is received by seventh inverter 714. In some embodiments, the output of the seventh inverter 714 is received by NOR gate 715. The other input of NOR gate 715 is a reset signal. The output of NOR gate 715 are the acknowledgement signals en, A.e, B.e, and C.e. In some embodiments, the NOR gate is implemented as a threshold gate.

In various embodiments, minority gates with Vdd inputs (e.g., gates 701, 702, 703) can be replaced with a threshold gate having a threshold of 1. In one such example, the Vdd input is removed when the gate is a 2-input threshold gate of threshold of 1. Configurable threshold gates are described with reference to FIGS. 15-20.

Figure 8:
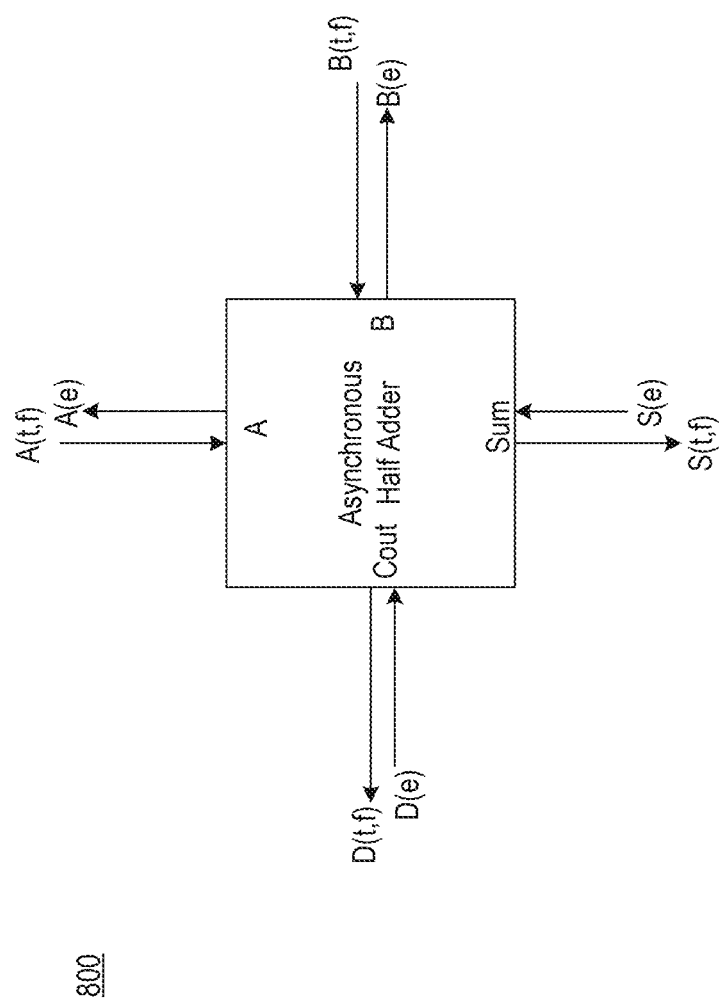
FIG. 8 illustrates an asynchronous half-adder with sets of signals including true, false, and acknowledgement signals associated with the inputs, carry-in input, carry-out output, and sum output, where the asynchronous half-adder comprises majority and/or minority gates, in accordance with some embodiments.

FIG. 8 illustrates asynchronous half-adder 800 with sets of signals including true, false, and acknowledgement signals associated with the inputs, carry-in input, carry-out output, and sum output, where the asynchronous half-adder comprises majority and/or minority gates, in accordance with some embodiments. In some embodiments, asynchronous half-adder 800 receives 1-bit operands via channels A and B. Channel A has true bit input A.t, false bit input A.f, and enable bit output A.e. Channel B has true bit input B.t, false bit input B.f, and enable bit output B.e. The carry output is provided via Channel D. Channel D has a true bit output D.t, a false but output D.f, and an enable input D.e. The sum output is generated by Channel S. Channel S has a true bit output S.t, a false but output S.f, and an enable input S.e. Compared to asynchronous full-adder 200, asynchronous half-adder 800 does not include carry-in input.

Figure 9:
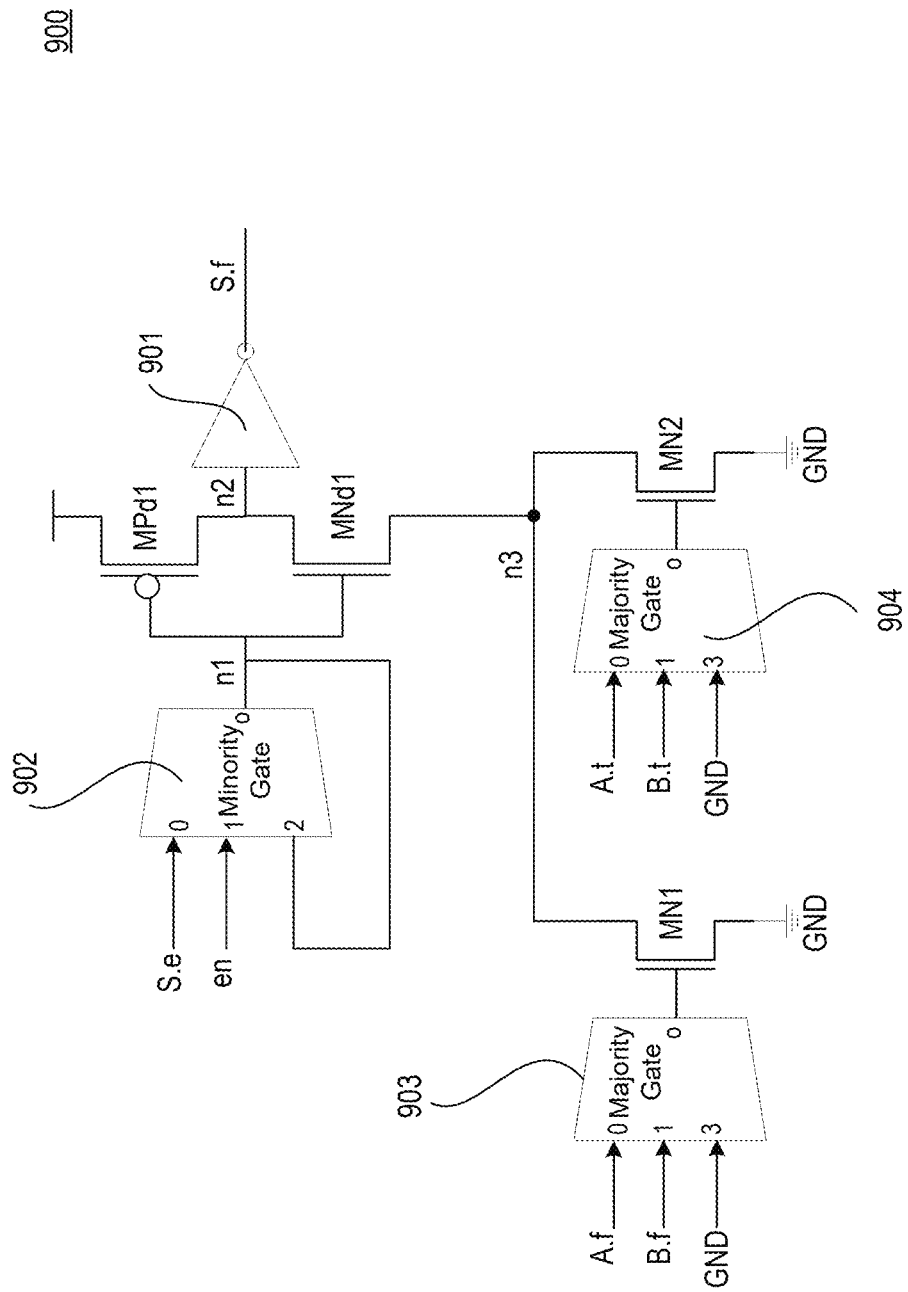
FIG. 9 illustrates a schematic for generating a sum false output for the asynchronous half-adder, in accordance with some embodiments.

FIG. 9 illustrates schematic 900 for generating a sum false output S.f for the asynchronous half-adder, in accordance with some embodiments. Schematic 900 comprises 3-input minority gate 902, first majority gate 903, second majority gate 904, p-type transistor MPd1, n-type transistor MNd1, n-type transistor MN1, n-type transistor MN2, supply rail Vdd, ground rail GND, nodes n1, n2, n3, and S.f, and inverter 901 coupled as shown. Signals for schematic 900 that generate S.f include A.f, B.f, GND, A.t, B.t, S.e, and enable en. In some embodiments, p-type transistor MPd1 is coupled in series with n-type transistor MNd1. The gate terminals of MPd1 and MNd1 are coupled with node n1. The drain terminals of MPd1 and MNd1 are coupled to node n2. Node n2 is coupled to an input of inverter 901. The output of inverter 901 is S.f. In various embodiments, 3-input minority gate 902 receives three inputs, S.e, en, and node n1.

In some embodiments, source terminal n3 of MNd1 is coupled to transistors MN1 and MN2. Transistors MN1 and MN2 are coupled in parallel between nodes n3 and GND. In some embodiments, a gate terminal of transistor MN1 is controlled by an output of first majority gate 903. In some embodiments, first majority gate 903 performs a majority function of three inputs A.f, B.f, and GND. In some embodiments, a gate terminal of transistor MN2 is controlled by an output of second majority gate 904. In some embodiments, second majority gate 904 performs a majority function of three inputs A.t, B.t, and GND.

Figure 10:
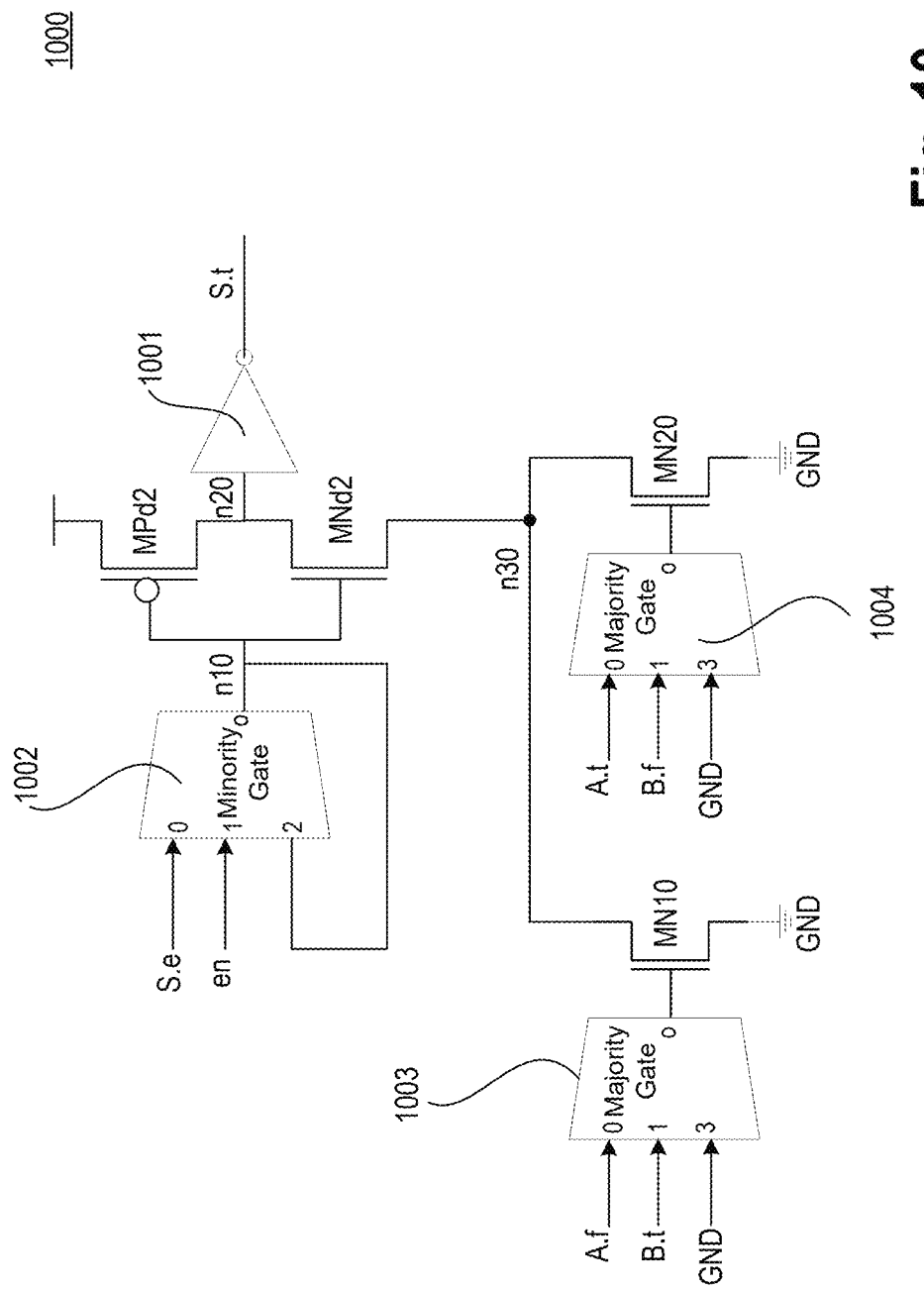
FIG. 10 illustrates a schematic for generating a sum true output for the asynchronous half-adder, in accordance with some embodiments.

FIG. 10 illustrates schematic 1000 for generating a sum true output S.t for the asynchronous half-adder, in accordance with some embodiments. Schematic 1000 comprises 3-input minority gate 1002, first majority gate 1003, second majority gate 1004, p-type transistor MPd2, n-type transistor MNd2, n-type transistor MN10, n-type transistor MN20, supply rail Vdd, ground rail GND, nodes n10, n20, n30, and S.t, and inverter 901, coupled as shown. Signals for schematic 1000 that generate S.t include A.f, B.f, GND, A.t, B.t, S.e, and enable en. In some embodiments, p-type transistor MPd2 is coupled in series with n-type transistor MNd2. The gate terminals of MPd2 and MNd2 are coupled with node n1. The drain terminals of MPd2 and MNd2 are coupled to node n20. Node n20 is coupled to an input of inverter 1001. The output of inverter 1001 is S.t. In various embodiments, first minority gate 1002 receives three inputs, S.e, en, and node n10.

In some embodiments, source terminal n30 of MNd2 is coupled to transistors MN10 and MN20. Transistors MN10 and MN20 are coupled in parallel between nodes n30 and GND. In some embodiments, a gate terminal of transistor MN10 is controlled by an output of first majority gate 1003. In some embodiments, first majority gate 1003 performs a majority function of three inputs A.f, B.t, and GND. In some embodiments, a gate terminal of transistor MN20 is controlled by an output of second majority gate 1004. In some embodiments, second majority gate 1004 performs a majority function of three inputs A.t, B.f, and GND.

Figure 11:
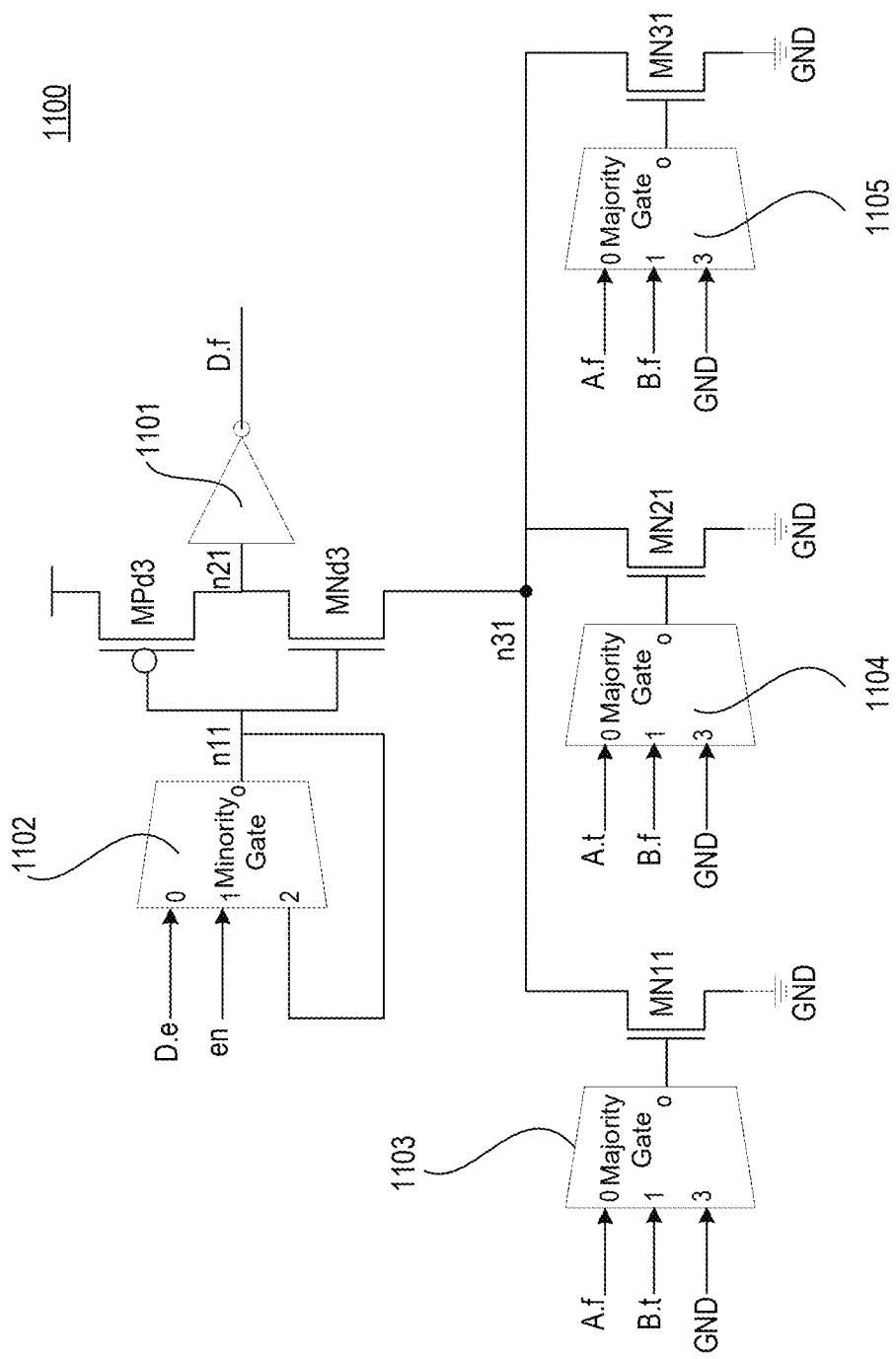
FIG. 11 illustrates a schematic for generating a carry-out false output for the asynchronous half-adder, in accordance with some embodiments.

FIG. 11 illustrates schematic 1100 for generating a carry-out false output D.f for asynchronous half-adder, in accordance with some embodiments. Schematic 1100 comprises 3-input minority gate 1102, first majority gate 1103, second majority gate 1104, third majority gate 1105, p-type transistor MPd3, n-type transistor MNd3, n-type transistor MN11, n-type transistor MN21, supply rail Vdd, ground rail GND, nodes n11, n21, n31, and D.f, and inverter 1101 coupled as shown. Signals for schematic 1100 that generate D.f include A.f, B.f, GND, A.t, B.t, D.e, and enable en. In some embodiments, p-type transistor MPd3 is coupled in series with n-type transistor MNd3. The gate terminals of MPd3 and MNd3 are coupled with node n1. The drain terminals of MPd3 and MNd3 are coupled to node n21. Node n21 is coupled to an input of inverter 1101. The output of inverter 1101 is D.f. In various embodiments, 3-input minority gate 1102 receives three inputs, D.e, en, and node n11.

In some embodiments, source terminal n31 of MNd3 is coupled to transistors MN11 and MN21. Transistors MN11 and MN21 are coupled in parallel between nodes n31 and GND. In some embodiments, a gate terminal of transistor MN11 is controlled by an output of first majority gate 1103. In some embodiments, first majority gate 1103 performs a majority function of three inputs A.f, B.t, and GND. In some embodiments, a gate terminal of transistor MN21 is controlled by an output of second majority gate 1104. In some embodiments, second majority gate 1104 performs a majority function of three inputs A.t, B.f, and GND. In some embodiments, a gate terminal of transistor MN31 is controlled by an output of third majority gate 1105. In some embodiments, third majority gate 1105 performs a majority function of three inputs A.f, B.f, and GND.

Figure 12:
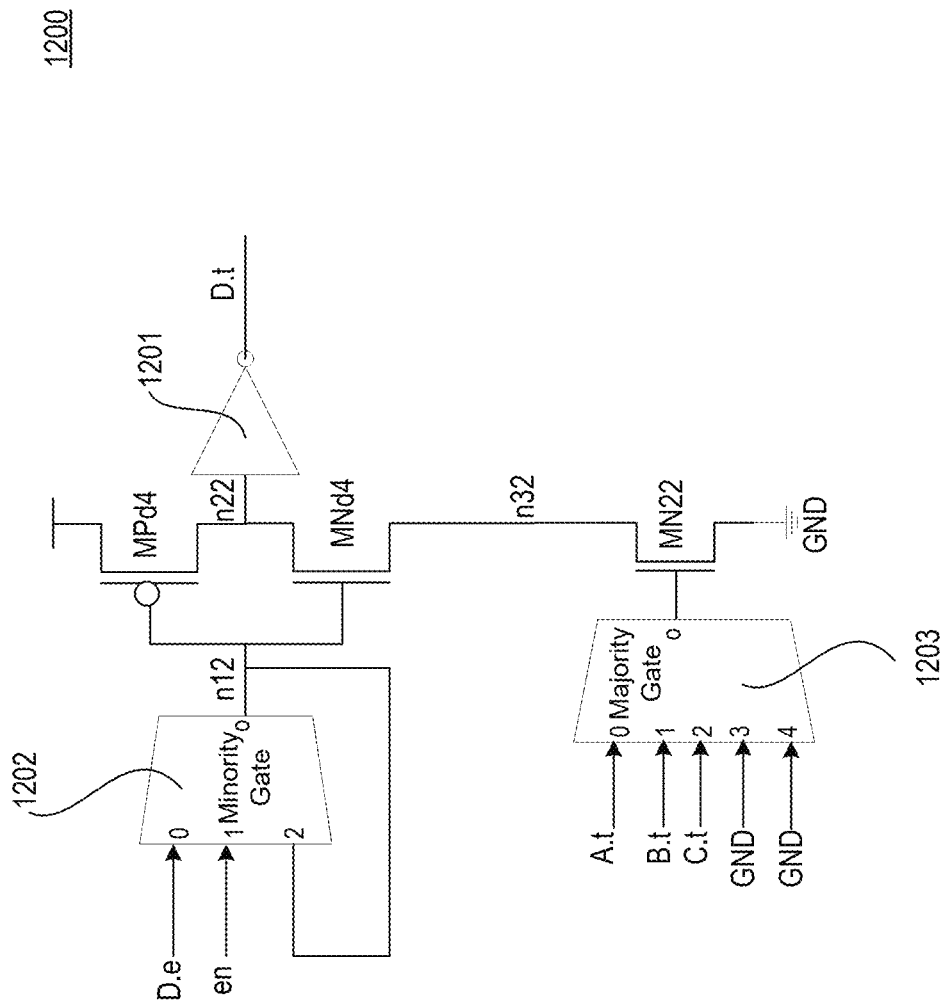
FIG. 12 illustrates a schematic for generating a carry-out true output for the asynchronous half-adder, in accordance with some embodiments.

FIG. 12 illustrates schematic 1200 for generating a carry-out true output D.t for asynchronous half-adder, in accordance with some embodiments. Schematic 1200 comprises 3-input minority gate 1202, majority gate 1203, p-type transistor MPd4, n-type transistor MNd4, n-type transistor MN22, supply rail Vdd, ground rail GND, nodes n12, n22, n32, and D.t, and inverter 1201 coupled as shown. Signals for schematic 1200 that generate D.t include A.t, B.t, C.t, GND, D.e, and enable en. In some embodiments, p-type transistor MPd4 is coupled in series with n-type transistor MNd4. The gate terminals of MPd4 and MNd4 are coupled with node n12. The drain terminals of MPd4 and MNd4 are coupled to node n22. Node n22 is coupled an input of inverter 1201. The output of inverter 1201 is D.t. In various embodiments, minority gate 1202 receives three inputs, D.e, en, and node n12.

In some embodiments, source terminal n32 of MNd4 is coupled to transistor MN22. In some embodiments, a gate terminal of transistor MN22 is controlled by an output of majority gate 1203. In some embodiments, majority gate 1203 performs a majority function of five inputs A.t, B.t, C.t, GND, and GND.

Figure 13:
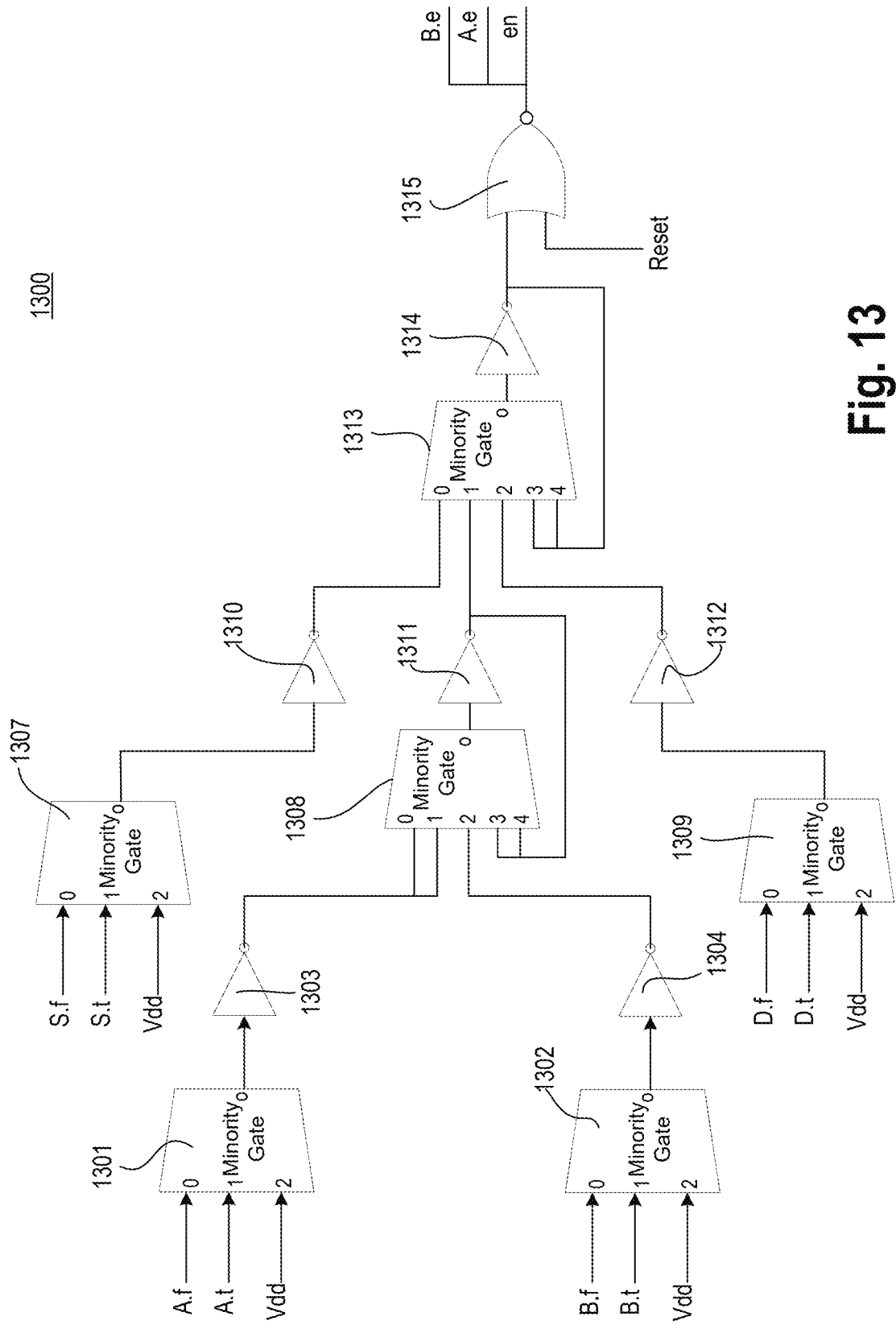
FIG. 13 illustrates a schematic for generating acknowledgement and enabling signals for asynchronous half-adder, in accordance with some embodiments.

FIG. 13 illustrates schematic 1300 for generating acknowledgement and enabling signals A.e, B.e, and en for asynchronous half-adder, in accordance with some embodiments. Schematic 1300 comprises first minority gate 1301, second minority gate 1302, first inverter 1303, second inverter 1304, third minority gate 1307, fourth minority gate 1308, fifth minority gate 1309, third inverter 1310, fourth inverter 1311, fifth inverter 1312, sixth minority gate 1313, sixth inverter 1314, and NOR gate 1315. The outputs of NOR gate 1315 are the acknowledgement signals en, A.e, and B.e.

In some embodiments, first minority gate 1301 receives three inputs, A.f, A.t, and Vdd. First minority gate 1301 performs a minority function on inputs A.f, A.t and Vdd. The output of first minority gate 1301 is inverted by first inverter 1303. The output of first inverter 1303 is provided to two inputs of fourth minority gate 1308. In some embodiments, second minority gate 1302 receives three inputs, B.f, B.t, and Vdd. Second minority gate 1302 performs a minority function on inputs B.f, B.t and Vdd. The output of second minority gate 1302 is inverted by second inverter 1304. The output of second inverter 1304 is provided to fourth minority gate 1308. Other two inputs to the 5-input fourth minority gate 1308 are output from fourth inverter 1311. The output of 5-input fourth minority gate 1308 is a majority function of the five inputs. The output of 5-input fourth minority gate 1308 is received by fourth inverter 1311.

In some embodiments, third minority gate 1307 receives three inputs, S.f, S.t, and Vdd. Third minority gate 1307 performs a minority function on inputs S.f, S.t and Vdd. The output of third minority gate 1307 is inverted by third inverter 1310. The output of third inverter 1310 is provided to 5-input sixth minority gate 1313. In various embodiments, the output of fourth inverter 1311 is provided to sixth minority gate 1313. In some embodiments, fifth minority gate 1309 receives three inputs, D.f, D.t, and Vdd. Fifth minority gate 1309 performs a minority function on inputs D.f, D.t and Vdd. The output of fifth minority gate 1309 is inverted by fifth inverter 1312. The output of fifth inverter 1310 is provided to 5-input sixth minority gate 1313. Other two inputs to the 5-input sixth minority gate 1313 are output from sixth inverter 1314. The output of 5-input sixth minority gate 1313 is a majority function of the five inputs. The output of 5-input sixth minority gate 1313 is received by sixth inverter 1314. In some embodiments, the output of the sixth inverter 1314 is received by NOR gate 1315. The other input of NOR gate 1315 is a reset signal. The output of NOR gate 1315 are the acknowledgement signals en, A.e, and B.e. In various embodiments, the reset signal gets engaged (e.g., to force an output on the NOR gate) during initialization. In some embodiments, initialization may be a power-up event, power state change event, soft reset, etc.

Figure 14:
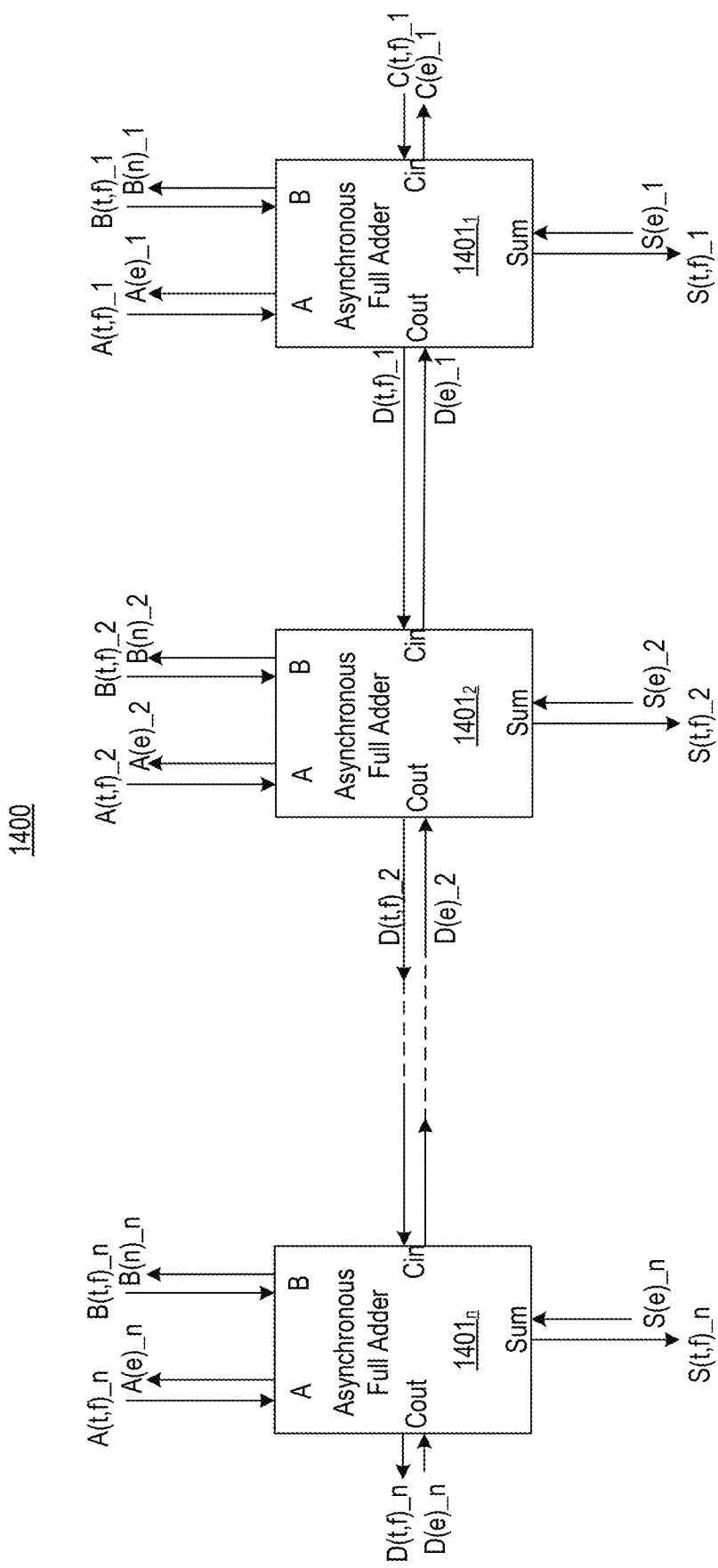
FIG. 14 illustrates an asynchronous carry ripple adder comprising a plurality of asynchronous full-adders, wherein an individual asynchronous full-adder includes majority or minority gates, in accordance with some embodiments.

FIG. 14 illustrates asynchronous carry ripple adder 1400 comprising a plurality of asynchronous full-adders 1401$_1$ through 1401$_n$, where 'n' is a number, wherein an individual asynchronous full-adder (e.g., 1401$_1$) includes majority or minority gates, in accordance with some embodiments. In some embodiments, asynchronous full-adder 1401$_1$ (e.g., asynchronous full-adder 200) receives 1-bit operands via channel A_1 and B_1, and 1-bit carry-in via channel C_1. Channel A_1 has true bit input A_1.t, false bit input A_1.f, and enable bit output A_i.e. Channel B_1 has true bit input B_1.t, false bit input B_1.f, and enable bit output B_i.e. Channel C_1 has true bit input C_1.t, false bit input C_1.f, and enable bit output C_i.e. The carry output is provided via Channel D_1. Channel D_1 has a true bit output D_i.t, a false bit output D_1.f, and an enable input D_1.e. The sum output is generated by Channel S_1. Channel S_1 has a true bit output S_i.t, a false bit output S_1.f, and an enable input S_1.e.

In some embodiments, asynchronous full-adder 1401$_2$ (e.g., asynchronous full-adder 200) is coupled to or with full-adder 1401$_1$ such that the carry output from full-adder 1401$_1$ is received by carry input of full-adder 1401$_2$. In some embodiments, full-adder 1401$_2$ receives 1-bit operands via channel A_2 and B_2, and 1-bit carry-in via channel C_2. Channel A_2 has true bit input A_2.t, false bit input A_2.f, and enable bit output A_2.e. Channel B_2 has true bit input B_2.t, false bit input B_2.f, and enable bit output B_2.e. Channel C_2 has true bit input C_2.t which is connected to true bit output D_1.t. Channel C_2 has a false bit input C_2.f which is connected to false bit output D_i.t. Channel C_2 has an enable bit output which is coupled to and enable bit input D_1.e. The carry output is provided via Channel D_2. Channel D_2 has a true bit output D_2.t, a false bit output D_2.f, and an enable input D_2.e. The sum output is generated by Channel S_2. Channel S_2 has a true bit output S_2.t, a false bit output S_2.f, and an enable input S_2.e.

In some embodiments, asynchronous full-adder 140$_1$. (e.g., asynchronous full-adder 200) is coupled to or with full-adder 140$_{n-1}$ such that the carry output from full-adder 140$_{n-1}$ is received by carry input of full-adder 140$_n$. As such, a serial chain of asynchronous full-adders is formed which realizes a ripple carry adder. In some embodiments, full-adder 140$_1$. receives 1-bit operands via channel A_n and B_n, and 1-bit carry-in via channel C_n. Channel A_n has true bit input A_n.t, false bit input A_n.f, and enable bit output A_n.e. Channel B_n has true bit input B_n.t, false bit input B_n.f, and enable bit output B_n.e. Channel C_n has true bit input C_n.t which is connected to true bit output D_(n-1).t. Channel C_n has a false bit input C_n.f which is connected to false bit output D_(n-1).t. Channel C_n has an enable bit output which is coupled to and enable bit input D_(n-1).e. The carry output is provided via Channel D_n. Channel D_n has a true bit output D_(n-1).t, a false bit output D_n.f, and an enable input D_n.e. The sum output is generated by Channel S_n. Channel S_n has a true bit output S_n.t, a false bit output S_n.f, and an enable input S_n.e.

While the embodiment is described with reference to an asynchronous carry-ripple adder, the asynchronous full-adder can be used to implement other adders such as carry-select adder, carry-increment adder, carry-save adder, carry-lookahead adder, etc.

The following section describes various embodiments of adjustable threshold gate that can be used as basis for the c-element, completion tree, and/or validity tree, in accordance with various embodiments.

Figure 15A:
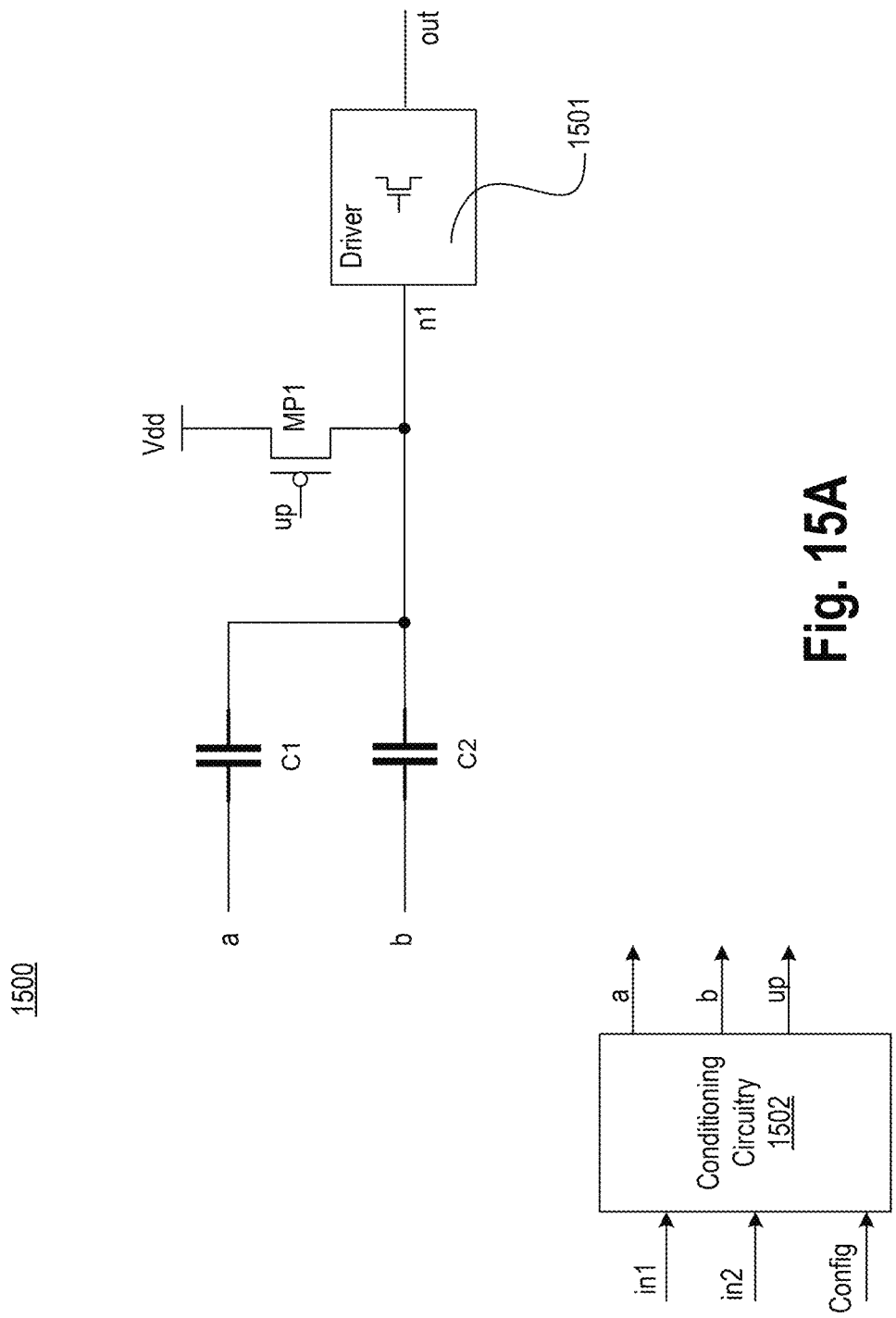
FIG. 15A illustrates a 2-input adjustable threshold gate with linear or paraelectric capacitors and a pull-up device on a summing node, in accordance with some embodiments.

FIG. 15A illustrates a 2-input adjustable threshold gate 1500 (also referred to as a 2-input capacitive circuit with schematic 500) with linear or paraelectric capacitors and a pull-up device on a summing node, in accordance with some embodiments. In some embodiments, 2-input capacitive circuit 1500 comprises a first input a, a second input b, summing node n1, first capacitor C1, second capacitor C2, pull-up-device MP1, driver 1501, and output out coupled as shown. In some embodiments, the first capacitor C1 includes a first terminal coupled to the first input and a second terminal coupled to the summing node n1. In some embodiments, the second capacitor C2 includes a third terminal coupled to the second input and a fourth terminal coupled to the summing node n1. In some embodiments, the pull-up device MP1 is coupled to the summing node n1 and a power supply rail Vdd, wherein the pull-up device MP1 is controlled by a first control up.

In various embodiments, during the reset phase, node n1 is pulled up by transistor MP1 to Vdd, and inputs 'a' and 'b' are conditioned via conditioning circuit 1502 to adjust the threshold of 2-input capacitive circuit 1500. Conditioning circuitry 1502 may receive inputs in1 and in2, and configuration setting (e.g., reset or evaluation) to determine the outputs 'a', 'b', and control "up". During the evaluation phase, in1 is passed on to output 'a' and in2 is passed on to 'b'. During the reset phase, depending on a desired threshold, outputs 'a' and 'b' are conditioned.

Here, the term threshold generally refers to a number that indicates a number of inputs that should be set to logic high to perform a function of a threshold gate. For instance, by turning on/off the pull-up device MP1 and conditioning the inputs 'a' and 'b' during a reset phase, the charge at node n1 is set so that in an evaluation phase when the pull-up device MP1 is disabled, the input capacitive circuit attains a desired function. In one instance, when the threshold is set to 2 in a reset phase by a particular sequencing of turning on/off the pull-up device and conditioning of the inputs 'a' and 'b'; it means that during an evaluation phase when both inputs 'a' and 'b' are logic high, then voltage on node n1 is logic high. Continuing with this example, when any of the inputs 'a' and 'b' is a logic low, then the voltage on node n1 resolves to logic low. As such, 2-input capacitive circuit 1500 is programmed or configured as an AND gate at node n1 and a NAND gate at output out.

Likewise, when the threshold is set to 1 in a reset phase by a particular sequencing of turning on/off the pull-up device and conditioning of the inputs 'a' and 'b'; it means that during an evaluation phase when either input 'a' and 'b' is logic high, then voltage on node n1 is logic high. Continuing with this example, when both the inputs 'a' and 'b' are a logic low, then the voltage on node n1 resolves to logic low. As such, 2-input capacitive circuit 1500 is programmed or configured as an OR gate at node n1 and an NOR gate at output out. So, the same circuit can be used as an AND/NAND or OR/NOR gate by conditioning the inputs and resetting or setting the voltage on the summing node during a reset phase. Subsequently, in the evaluation phase the circuit will behave as AND/NAND or OR/NOR gate.

In some embodiments, conditioning circuitry 1502 turns off the pull-up device MP1 during an evaluation phase separate from the reset phase. The reset phase or evaluation phase are indicated by the logic level of Config. For example, conditioning circuitry 1502 sets the first control (up) to logic high (Vdd) and the second control (down) to logic low (ground) during an evaluation phase (e.g., Config is set to logic 1). Likewise, in a reset phase, Config is set to 0. This is just an example, and the logic level of Config can be modified to present the evaluation phase and the reset phase.

Table 1 illustrates that when inputs 'a' and 'b' are conditioned as logic 1 and pull-up device MP1 is enabled during the reset phase, then the threshold is set to 1. In the evaluation phase, 2-input capacitive circuit 1500 can then behave as an NOR gate. Here, the capacitors comprise linear dielectric. Note, this example assumes equal weights (or substantially equal) for C1 and C2 (e.g., C1=C2). In some embodiments, the threshold may change (e.g., from 1 to 2) when the ratio of capacitances of capacitors C1 and C2 are modified.

TABLE 1

| Input 'a' | Input 'b' | First control (Up) | Threshold |
|---|---|---|---|
| 0 | 0 | 0 (enable MP1) | 0 |
| 1 | 0 | 0 (enable MP1) | 0 |
| 1 | 1 | 0 (enable MP1) | 1 |

A threshold of 0 means that the capacitive-input circuit is an always-on circuit regardless of the logic levels of the inputs. In one such embodiment, during the evaluation phase for the circuit configured with threshold of zero, the logic value on node n1 is logic 1, and the logic value on output out is logic 0 (assuming the driver is an inverter).

When the capacitors comprise paraelectric material, different thresholds are achieved compared to the linear dielectric material for the same input conditioning.

Table 2 illustrates that when inputs 'a' and 'b' are conditioned as logic 1 and pull-up device MP1 is enabled during the reset phase, then the threshold is set to 1. In the evaluation phase, 2-input capacitive circuit 1500 can then behave as a NOR gate. In some embodiments, when inputs 'a' and 'b' are conditioned as logic 1 and logic 0, respectively, and pull-up device MP1 is enabled during the reset phase, then the threshold is set to 1. In the evaluation phase, 2-input capacitive circuit 1500 can then behave as an OR/NOR gate when the threshold is set to 1. In some embodiments, when inputs 'a' and 'b' are conditioned as logic 0 and pull-up device MP1 is enabled during the reset phase, then the threshold is set to 0. Note, this example assumes equal weights (or substantially equal) for C1 and C2 (e.g., C1=C2). In some embodiments, the threshold may change (e.g., from 1 to 2 or to some other level) when the ratio of capacitances of capacitors C1 and C2 are modified. Table 2 is the case when capacitors are paraelectric capacitors.

TABLE 2

| Input 'a' | Input 'b' | First control (Up) | Threshold |
|---|---|---|---|
| 0 | 0 | 0 (enable MP1) | 0 |
| 1 | 0 | 0 (enable MP1) | 1 |
| 1 | 1 | 0 (enable MP1) | 1 |

While the embodiment of FIG. 15A illustrates an inverter as driver 1501, driver 1501 can be any suitable logic. In some embodiments, driver 1501 is a non-inverting circuit such as a buffer, an AND, an OR, a capacitive input circuit, or any non-inverting circuit. In some embodiments, driver 1501 is an inverting circuit such as an inverter, a NAND, a NOR, an XOR, an XNOR, or any inverting circuit, etc. In some embodiments, driver 1501 is a multiplexer that connects summing nodes of other capacitive circuits to its inputs. In some embodiments, one or more inputs of the multiplexer are driven from a transistor-based logic. As such, the multiplexer can selectively output a desired output. In some embodiments, driver 1501 is another capacitive input circuit where one of the inputs is coupled to the summing node n1 and other input(s) are coupled to other inputs. As such, complex logic can be formed with configurable threshold and thus function(s).

Figure 15B:
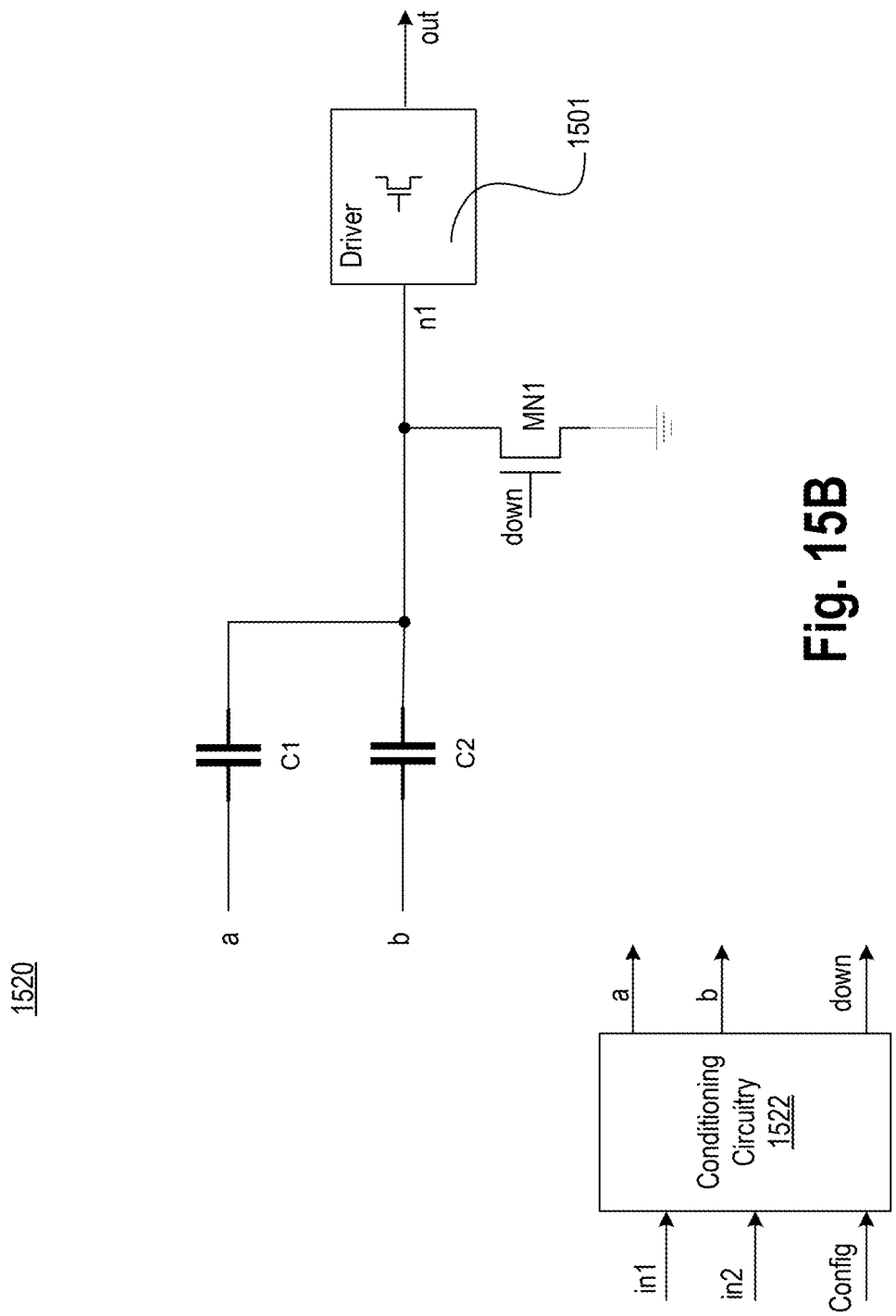
FIG. 15B illustrates a 2-input adjustable threshold gate with linear or paraelectric capacitors and a pull-down device on a summing node, in accordance with some embodiments.

FIG. 15B illustrates 2-input adjustable threshold gate 1520 with linear or paraelectric capacitors and a pull-down device on a summing node, in accordance with some embodiments. Compared to FIG. 15A, here pull-up device MP1 is removed and replaced with a pull-down device MN1 coupled to summing node n1 and ground supply terminal.

In various embodiments, during the reset phase, node n1 is pulled-down by transistor MN1 to ground, and inputs 'a' and 'b' are conditioned via conditioning circuit 1522 to adjust the threshold of 2-input capacitive circuit 1520. Table 3 illustrates input conditioning that provides a threshold of 2 when capacitors are linear capacitors. Conditioning circuitry 1522 may receive inputs in1 and in2, and configuration setting (e.g., reset or evaluation) to determine the outputs 'a', 'b', and down. During the evaluation phase, in1 is passed on to output 'a' and in2 is passed on to 'b'. During the reset phase, depending on a desired threshold, outputs 'a' and 'b' are conditioned.

TABLE 3

| Input 'a' | Input 'b' | Second control (down) | Threshold |
|---|---|---|---|
| 0 | 0 | 1 (enable MN1) | 2 |
| 1 | 0 | 1 (enable MN1) | 2 |
| 1 | 1 | 1 (enable MN1) | 2 |

In this case, when inputs 'a' and 'b' are conditioned as shown in Table 3 and pull-down device MN1 is enabled during the reset phase, then the threshold is set to 2. In the evaluation phase, 2-input capacitive circuit 1520 can then behave as a NAND gate. Note, this example assumes equal weights for C1 and C2 (e.g., C1=C2). In some embodiments, the threshold may change (e.g., from 2 to 1) when the ratio of capacitances of capacitors C1 and C2 are modified.

Table 4 illustrates input conditioning that provides a threshold of 2. When the capacitors comprise paraelectric material, different thresholds are achieved compared to the linear dielectric material for the same input conditioning. Table 4 is the case when capacitors comprise paraelectric material.

Conditioning circuitry 1522 may receive inputs in1 and in2, and configuration setting (e.g., reset or evaluation) to determine the outputs 'a', 'b', and down. During the evaluation phase, in1 is passed on to output 'a' and in2 is passed on to 'b'. During the reset phase, depending on a desired threshold, outputs 'a' and 'b' are conditioned.

TABLE 4

| Input 'a' | Input 'b' | Second control (down) | Threshold |
|---|---|---|---|
| 0 | 0 | 1 (enable MN1) | 2 |
| 1 | 0 | 1 (enable MN1) | 2 |
| 1 | 1 | 1 (enable MN1) | 3 |

In this case, when inputs 'a' and 'b' are conditioned as shown in Table 4 and pull-down device MN1 is enabled during the reset phase, then the threshold is set to 2. In the evaluation phase, 2-input capacitive circuit 1520 can then behave as an AND or a NAND gate. In some embodiments, when inputs 'a' and 'b' are conditioned as logic 1 and pull-down device MN1 is enabled during the reset phase, then the threshold is set to 3. In the evaluation phase, when the threshold is higher than the number of inputs, 2-input capacitive circuit 1520 behaves as a disconnected circuit where internal node n1 is floating and the output of driver out may be a do not care logic value. Note, this example assumes equal weights for C1 and C2 (e.g., C1=C2). In some embodiments, the threshold may change (e.g., from 2 to 1) when the ratio of capacitances of capacitors C1 and C2 are modified.

While the embodiments are illustrated with reference to same capacitances for first capacitor C1 and the second capacitor C2, the threshold can be affected by changing the capacitive ratio of C1 and C2. For example, the input conditioning scheme and the pull-up and pull-down device control can result in a different threshold than that in Table 4 when the capacitive ratio of C1 and C2 is not 1:1. Overall, the configuring scheme of various embodiments herein provide the flexibility of programming the threshold for 2-input capacitive circuit 1520 in a reset phase to achieve a certain logic function in the evaluation phase.

Figure 16A:
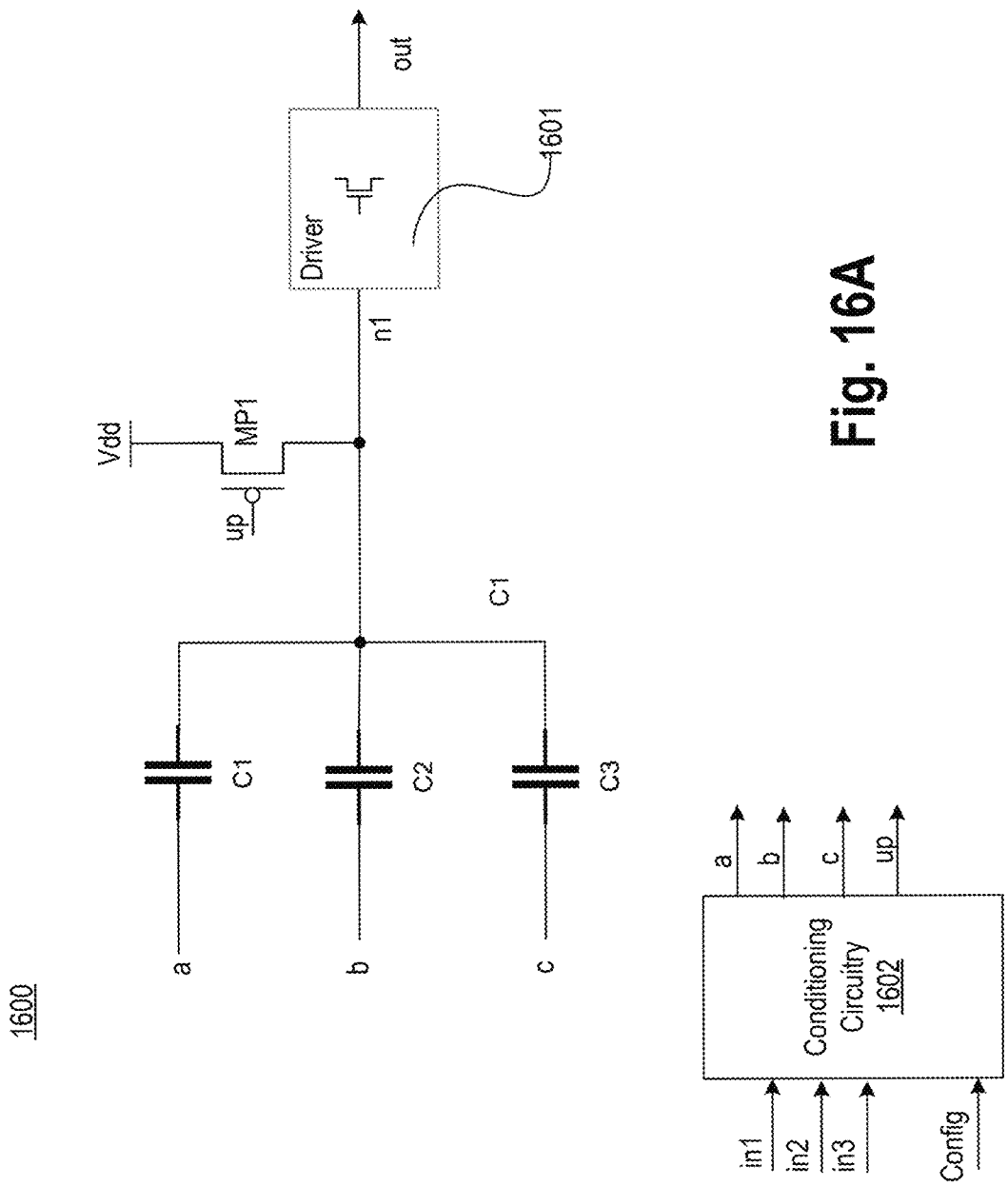
FIG. 16A illustrates a 3-input adjustable threshold gate with linear or paraelectric capacitors and a pull-up device on a summing node, in accordance with some embodiments.

FIG. 16A illustrates 3-input adjustable threshold gate 1600 with linear or paraelectric capacitors and a pull-up device on a summing node, in accordance with some embodiments. 3-input capacitive circuit 1600 is like 2-input capacitive circuit 1500 but for additional input 'c' and associated capacitor C3. In some embodiments, a first terminal of capacitor C3 is coupled to input 'c' while a second terminal of capacitor C3 is coupled to summing node n1. Conditioning circuit 1502 is replaced with a conditioning circuit 1602. Conditioning circuitry 1602 may receive inputs in1, in2, and in3 and configuration setting (e.g., reset or evaluation) to determine the outputs 'a', 'b', 'c', and up. During the evaluation phase, in1 is passed on to output 'a', in2 is passed on to 'b', and in3 is passed on to 'c'. During the reset phase, depending on a desired threshold, outputs 'a', 'b', and 'c' are conditioned.

In some embodiments, by turning on/off the pull-up device MP1 and conditioning the inputs 'a', 'b', and 'c' during a reset phase, the charge at node n1 is set so that in an evaluation phase when the pull-up device is disabled, 3-input capacitive circuit 1600 attains a desired function.

In one instance, when the threshold is set to 2 in a reset phase by a particular sequencing of turning on/off the pull-up device and conditioning of the inputs 'a', 'b', and 'c'; it means that during an evaluation phase when at least two of the three inputs 'a', 'b', and 'c' are logic high, then voltage on node n1 is logic high. Continuing with this example, when at least two inputs of the three inputs 'a' 'b', and 'c' is a logic low, then the voltage on node n1 resolves to logic low. As such, 3-input capacitive circuit 1600 is programmed or configured as a majority gate at node n1 and a minority gate at output out (when the driver circuitry is an inverter). In some cases, depending upon the leakage balance of pull-up transistor MP1 as it impacts charge on the summing node n1, 3-input capacitive circuit 1600 may lose its majority logic functionality over time. This loss in functionality of the majority function can be restored by resetting the summing node n1 via transistor MP1, in accordance with some embodiments.

In some embodiments, when the threshold is set to 3 in a reset phase by a particular sequencing of turning on/off the pull-up device and conditioning of the inputs 'a', 'b', and 'c'; it means that during an evaluation phase when all three inputs 'a', 'b', and 'c' are logic high, then voltage on node n1 is logic high. Continuing with this example, when any of the three inputs 'a' 'b', and 'c' is a logic low, then the voltage on node n1 resolves to logic low. As such, 3-input capacitive circuit 1600 is programmed or configured as a 3-input AND at node n1 and a 3-input NAND gate at output out (assuming the driver circuitry is an inverter).

In some embodiments, when the threshold is set to 1 in a reset phase by a particular sequencing of turning on/off the pull-up device and conditioning of the inputs 'a' and 'b; it means that during an evaluation phase when any of the inputs 'a' 'b', or 'c' is logic high, then voltage on node n1 is logic high. Continuing with this example, when all inputs 'a', 'b', or 'c' is a logic low, then the voltage on node n1 resolves to logic low. As such, 3-input capacitive circuit 1600 is programmed or configured as an OR gate at node n1 and a NOR gate at output out.

So, the same circuit can be used as a majority/minority gate, AND/NAND or OR/NOR gate by conditioning the inputs and resetting or setting the voltage on the summing node during a reset phase. Subsequently, in the evaluation phase the circuit will behave as a 3-input majority/minority, 3-input AND/NAND or 3-input OR/NOR gate.

In some embodiments, conditioning circuitry 1602 sets the threshold to 0 in a reset phase by enabling the pull-up device MP1 and providing logic 1 to the first input 'a', logic 0 to the second input 'b', and logic 0 to the third input 'c'. In some embodiments, conditioning circuitry 1602 sets the threshold to 0 in a reset phase by turning on or enabling the pull-up device MP1 and providing logic 0 to all inputs 'a', 'b', and 'c'. A threshold of 0 means that the capacitive-input circuit is an always-on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 1602 (or any other conditioning circuit) sets the threshold to 4. A threshold of 4 for a 3-input capacitive circuit means that capacitive input circuit is an always off circuit regardless of the logic levels of the inputs. In one such embodiment, during the evaluation phase for the circuit configured with threshold of n+1 (e.g., 4, where 'n' is the number of capacitive inputs), the logic value on node n1 is floating and may eventually discharge to ground or charge to supply level. In some embodiments, the voltage on node n1 is zero volts regarding of input setting when the threshold in 4 (e.g., n+1).

Table 5 illustrates that when inputs 'a', 'b', and 'c' are conditioned and pull-up device MP1 is enabled during the reset phase, then the threshold is set to 0, 1, or 2. In this example, the capacitors comprise linear dielectric.

TABLE 5

| 'a' | 'b' | 'c' | First control (Up) | Threshold |
|---|---|---|---|---|
| 0 | 0 | 0 | 0 (enable MP1) | 0 |
| 1 | 0 | 0 | 0 (enable MP1) | 0 |
| 1 | 1 | 0 | 0 (enable MP1) | 1 |
| 1 | 1 | 1 | 0 (enable MP1) | 2 |

In the evaluation phase, 3-input capacitive circuit 1600 can then behave as an OR/NOR gate (when threshold is 1) or a majority/minority gate (when threshold is 2). Note, this example assumes equal weights for C1, C2, and C3 (e.g., C1=C2=C3). In some embodiments, the threshold may change (e.g., from 1 to 2) when the ratio of capacitances of capacitors C1, C2, and/or C3 are modified.

Table 6 illustrates that when inputs 'a', 'b', and 'c' are conditioned and pull-up device MP1 is enabled during the reset phase, then the threshold is set to 0, 1, or 2. When the capacitors comprise paraelectric material, different thresholds are achieved compared to the linear dielectric material for the same input conditioning. Table 6 is the case when capacitors comprise paraelectric material.

TABLE 6

| 'a' | 'b' | 'c' | First control (Up) | Threshold |
|---|---|---|---|---|
| 0 | 0 | 0 | 0 (enable MP1) | 0 |
| 1 | 0 | 0 | 0 (enable MP1) | 1 |
| 1 | 1 | 0 | 0 (enable MP1) | 1 |
| 1 | 1 | 1 | 0 (enable MP1) | 2 |

In the evaluation phase, 3-input capacitive circuit 1600 can then behave as a logic1/logic0 driver (when threshold is 0), an OR/NOR gate (when threshold is 1), a minority/minority gate (when threshold is 2). Note, this example assumes equal weights for C1, C2, and C3 (e.g., C1=C2=C3). In some embodiments, the threshold may change (e.g., from 1 to 2 or to another other value) when the ratio of capacitances of capacitors C1, C2, and/or C3 are modified.

Figure 16B:
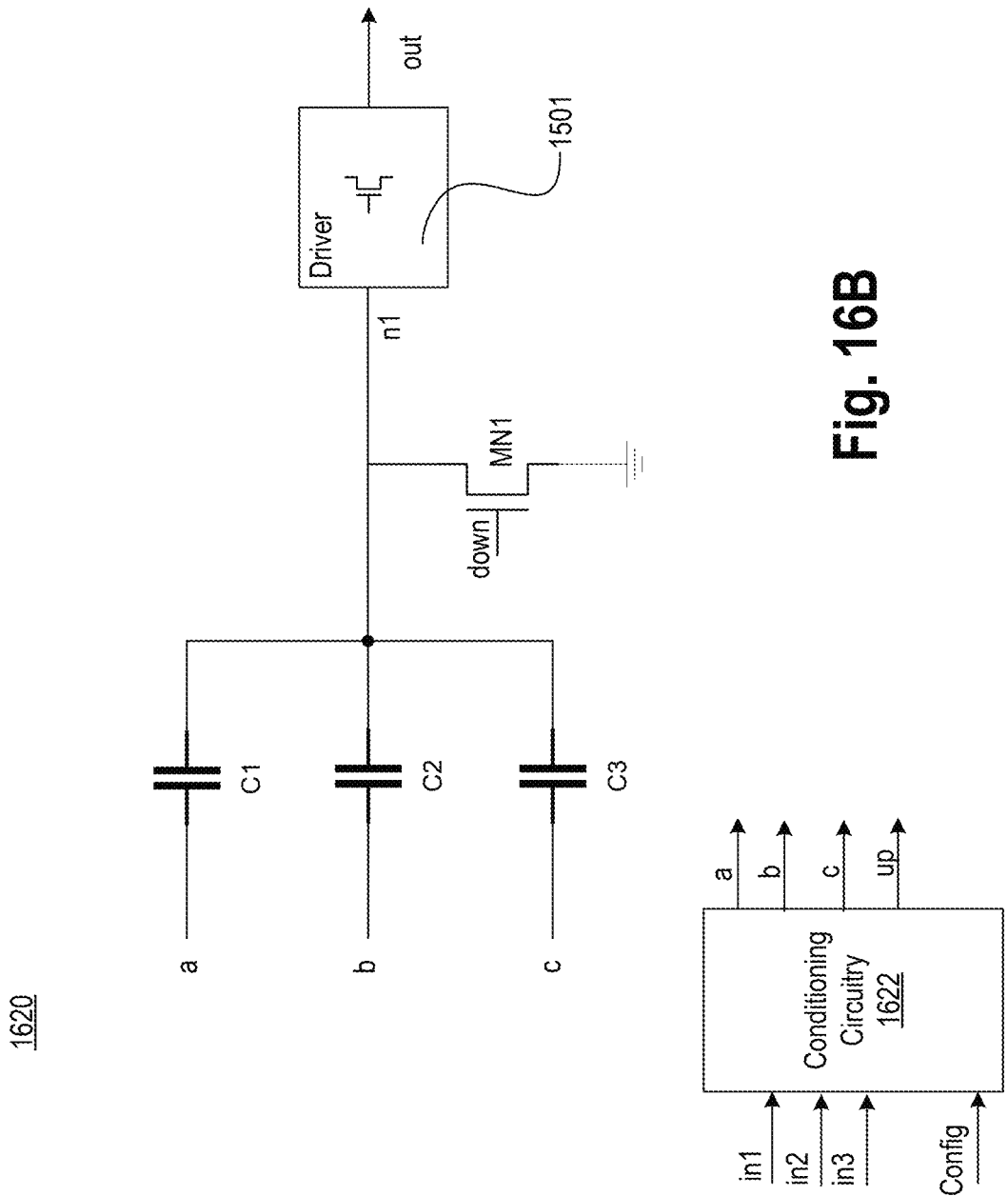
FIG. 16B illustrates a 3-input adjustable threshold gate with linear or paraelectric capacitors and a pull-down device on a summing node, in accordance with some embodiments.

FIG. 16B illustrates a 3-input adjustable threshold gate 1620 with linear or paraelectric capacitors and a pull-down device on a summing node, in accordance with some embodiments. Compared to FIG. 16A, here the pull-up device MP1 is removed and pull-down device MN1 is added which is coupled to node n1 and ground supply rail. In various embodiments, during the reset phase, node n1 is pulled-down by MN1 to ground, and inputs 'a', 'b', and 'c' are conditioned via configuration circuit 1622 to adjust the threshold of 3-input capacitive circuit 1620. Conditioning circuitry 1622 may receive inputs in1, in2, and in3 and configuration setting(s) (e.g., reset or evaluation) to determine the outputs 'a', 'b', 'c', and down. During the evaluation phase, in1 is passed on to output 'a', in2 is passed on to 'b', and in3 is passed on to 'c'. During the reset phase, depending on a desired threshold, outputs 'a', 'b', and 'c' are conditioned. Table 7 illustrates that when inputs 'a', 'b', and 'c' are conditioned and pull-down device MN1 is enabled during the reset phase, then the threshold is set to 2 or 3. In this example, the capacitors comprise linear dielectric material.

TABLE 7

| 'a' | 'b' | 'c' | Second control (down) | Threshold |
|---|---|---|---|---|
| 0 | 0 | 0 | 1 (enable MN1) | 2 |
| 1 | 0 | 0 | 1 (enable MN1) | 3 |
| 1 | 1 | 0 | 1 (enable MN1) | 3 |
| 1 | 1 | 1 | 1 (enable MN1) | 3 |

In the evaluation phase, 3-input capacitive circuit 1620 can then behave as a majority/majority gate (when threshold is 2) or an AND/NAND gate (when threshold is 3). Note, this example assumes equal weights for C1, C2, and C3 (e.g., C1=C2=C3). In some embodiments, the threshold may change (e.g., from 3 to 2 or to 1) when the ratio of capacitances of capacitors C1, C2, and/or C3 are modified.

Table 8 illustrates that when inputs 'a', 'b', and 'c' are conditioned and pull-down device MN1 is enabled during the reset phase, then the threshold is set to 2, 3, or 4. When the capacitors comprise paraelectric material, different thresholds are achieved compared to the linear dielectric material for the same input conditioning. Table 8 is the case when capacitors comprise paraelectric material.

TABLE 8

| 'a' | 'b' | 'c' | Second control (down) | Threshold |
|---|---|---|---|---|
| 0 | 0 | 0 | 1 (enable MN1) | 2 |
| 1 | 0 | 0 | 1 (enable MN1) | 3 |
| 1 | 1 | 0 | 1 (enable MN1) | 3 |
| 1 | 1 | 1 | 1 (enable MN1) | 4 |

In the evaluation phase, 3-input capacitive circuit 1620 can then behave as a logic1/logic0 driver (when threshold is 0), a majority/majority gate (when threshold is 2), an AND/NAND gate (when threshold is 3), or a disconnected circuit (when threshold is 4). Note, this example assumes equal weights for C1, C2, and C3 (e.g., C1=C2=C3). In some embodiments, the threshold may change (e.g., from 3 to 2 or to 1, or any other value) when the ratio of capacitances of capacitors C1, C2, and/or C3 are modified.

Figure 17A:
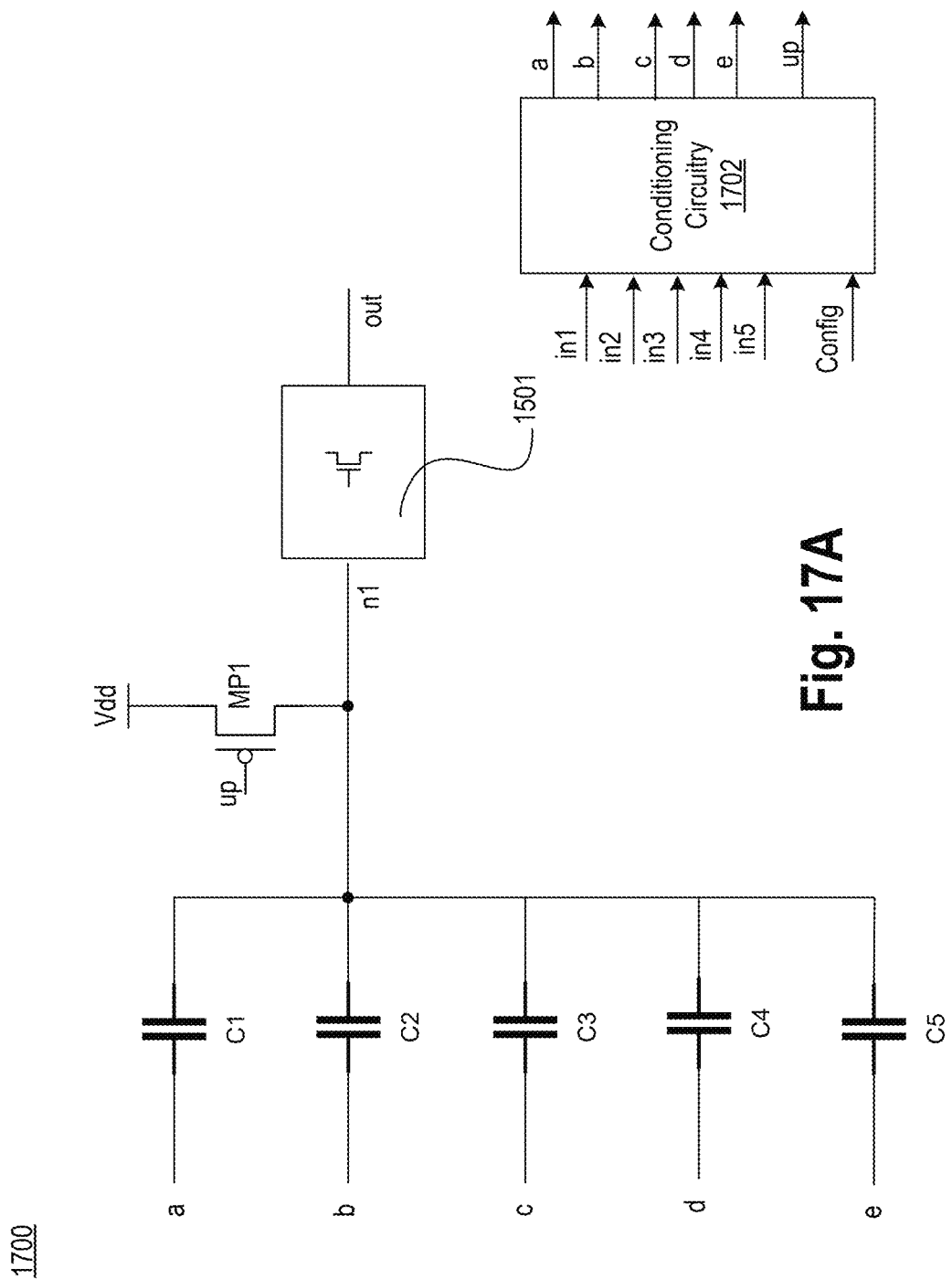
FIG. 17A illustrates a 5-input adjustable threshold gate with linear or paraelectric capacitors and a pull-up device on a summing node, in accordance with some embodiments.

FIG. 17A illustrates 5-input adjustable threshold gate 1700 with linear or paraelectric capacitors and a pull-up device on a summing node, in accordance with some embodiments. FIG. 17A is comparable to FIG. 16A, but for additional input 'd' and associated capacitor C4 and additional input 'e' and associated capacitor C5. In some embodiments, a first terminal of capacitor C4 is coupled to input 'd' while a second terminal of capacitor C4 is coupled to summing node n1. In some embodiments, a first terminal of capacitor C5 is coupled to input 'e' while a second terminal of capacitor C5 is coupled to summing node n1. Conditioning circuit 1602 is replaced with a conditioning circuit 1702. Conditioning circuitry 1702 may receive inputs in1, in2, in3, in4, and in5 and configuration setting (e.g., reset or evaluation) to determine the outputs 'a', 'b', 'c', 'd', 'e', and control "up". During the evaluation phase, in1 is passed on to output 'a', in2 is passed on to 'b', in3 is passed on to 'c', in4 is passed on to 'd', and in5 is passed on to 'e'. During the reset phase, depending on a desired threshold, outputs 'a', 'b', 'c' 'd', and 'e' are conditioned.

In various embodiments, during the reset phase, node n1 is pulled-up by MP1 to Vdd, and inputs 'a', 'b', 'c', 'd', and 'e' are conditioned via configuration circuitry 1702 to adjust the threshold of 5-input capacitive circuit 1700. Conditioning circuitry 1702 may receive inputs in1, in2, in3, in4, and in5 and configuration setting (e.g., reset or evaluation) to determine the outputs 'a', 'b', 'c', 'd', 'e', and control "up". During the evaluation phase, in1 is passed on to output 'a', in2 is passed on to 'b', in3 is passed on to 'c', in4 is passed on to 'd', and in5 is passed on to 'e'. During the reset phase, depending on a desired threshold, outputs 'a', 'b', 'c' 'd', and 'e' are conditioned. Table 9 illustrates that when inputs 'a', 'b', 'c', 'd', and 'e' are conditioned and pull-up device MP1 is enabled during the reset phase, then the threshold is set to 1 or 3. In this example, the capacitors comprise linear dielectric material.

TABLE 9

| 'a' | 'b' | 'c' | 'd' | 'e' | First control (Up) | Threshold |
|---|---|---|---|---|---|---|
| 0 | 0 | 0 | 0 | 0 | 0 (enable MP1) | 0 |
| 1 | 0 | 0 | 0 | 0 | 0 (enable MP1) | 0 |
| 1 | 1 | 0 | 0 | 0 | 0 (enable MP1) | 0 |
| 1 | 1 | 1 | 0 | 0 | 0 (enable MP1) | 1 |
| 1 | 1 | 1 | 1 | 0 | 0 (enable MP1) | 2 |
| 1 | 1 | 1 | 1 | 1 | 0 (enable MP1) | 3 |

In the evaluation phase, 5-input capacitive circuit 1700 can then behave as an OR/NOR gate (when threshold is 1), a majority-0/minority-0 gate (when threshold is 2), or a majority/minority gate (when threshold is 3). Note, this example assumes equal weights for C1, C2, C3, C4, and C5 (e.g., C1=C2=C3=C4=C5). In some embodiments, the threshold may change (e.g., from 1 to 2 or to 3, 4, or 5) when the ratio of capacitances of capacitors C1, C2, C3, C4, and/or C5 are modified.

Table 10 illustrates that when inputs 'a', 'b', 'c', 'd', and 'e' are conditioned and the pull-up device MP1 is enabled during the reset phase, then the threshold is set to 1 or 3. When the capacitors comprise paraelectric material, different thresholds are achieved compared to the linear dielectric material for the same input conditioning. Table 10 is the case when capacitors comprise paraelectric material.

TABLE 10

| 'a' | 'b' | 'c' | 'd' | 'e' | First control (Up) | Threshold |
|---|---|---|---|---|---|---|
| 0 | 0 | 0 | 0 | 0 | 0 (enable MP1) | 0 |
| 1 | 0 | 0 | 0 | 0 | 0 (enable MP1) | 1 |
| 1 | 1 | 0 | 0 | 0 | 0 (enable MP1) | 1 |
| 1 | 1 | 1 | 0 | 0 | 0 (enable MP1) | 2 |
| 1 | 1 | 1 | 1 | 0 | 0 (enable MP1) | 2 |
| 1 | 1 | 1 | 1 | 1 | 0 (enable MP1) | 3 |

In the evaluation phase, 5-input capacitive circuit 1700 can then behave as an always-on circuit that drives a constant logic value on node n1 (when threshold is 0), an OR/NOR gate (when threshold is 1), a majority-0/minority-0 gate or a threshold gate (when threshold is 2), or a majority/minority gate (when threshold is 3). Note, this example assumes equal weights for C1, C2, C3, C4, and C5 (e.g., C1=C2=C3=C4=C5). In some embodiments, the threshold may change (e.g., from 1 to 2 or to 3, 4, or 5 or any other value) when the ratio of capacitances of capacitors C1, C2, C3, C4, and/or C5 are modified.

Figure 17B:
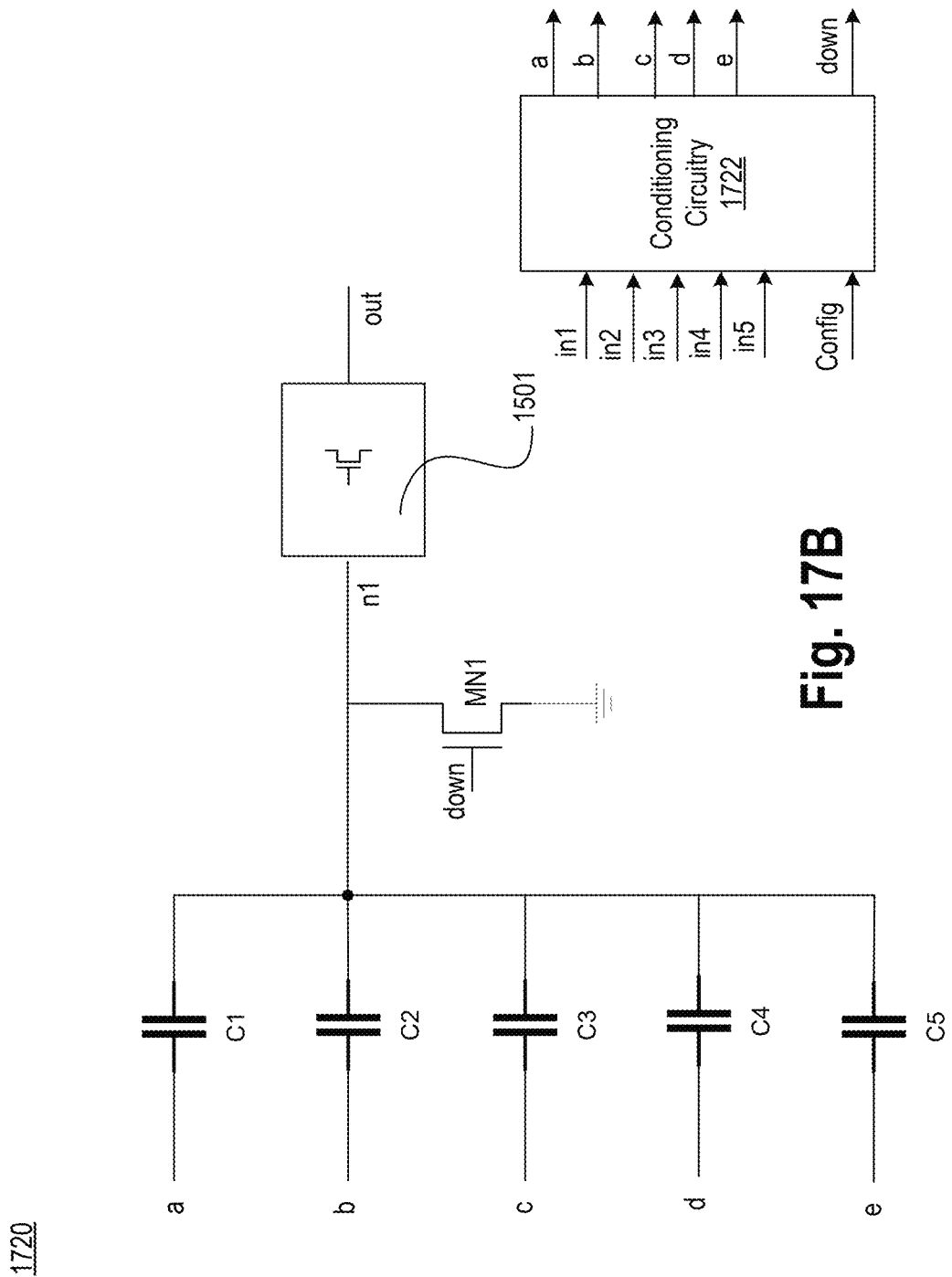
FIG. 17B illustrates a 5-input adjustable threshold gate with linear or paraelectric capacitors and a pull-down device on a summing node, in accordance with some embodiments.

FIG. 17B illustrates 5-input adjustable threshold gate 1720 with linear or paraelectric capacitors and a pull-down device on a summing node, in accordance with some embodiments. Compared to FIG. 17A, here pull-up device MP1 is removed and pull-down device MN1 is coupled to node n1 and ground power supply rail. In various embodiments, during the reset phase, node n1 is pulled-down by MN1 to ground, and inputs 'a', 'b', 'c', 'd' and 'e' are conditioned via configuration circuit 1722 to adjust the threshold of 5-input capacitive circuit 1700. Conditioning circuitry 1722 may receive inputs in1, in2, in3, in4, and in5 and configuration setting (e.g., reset or evaluation) to determine the outputs 'a', 'b', 'c', 'd', 'e', and control "down". During the evaluation phase, in1 is passed on to output 'a', in2 is passed on to 'b', in3 is passed on to 'c', in4 is passed on to 'd', and in5 is passed on to 'e'. During the reset phase, depending on a desired threshold, outputs 'a', 'b', 'c' 'd', and 'e' are conditioned. Table 11 illustrates that when inputs 'a', 'b', 'c', 'd', and 'e' are conditioned and pull-down device MN1 is enabled during the reset phase, then the threshold is set to 3, 4, or 5. In this example, the capacitors comprise linear dielectric material.

TABLE 11

| 'a' | 'b' | 'c' | 'd' | 'e' | Second control (down) | Threshold |
|---|---|---|---|---|---|---|
| 0 | 0 | 0 | 0 | 0 | 1 (enable MN1) | 3 |
| 1 | 0 | 0 | 0 | 0 | 1 (enable MN1) | 4 |
| 1 | 1 | 0 | 0 | 0 | 1 (enable MN1) | 5 |
| 1 | 1 | 1 | 0 | 0 | 1 (enable MN1) | 5 |
| 1 | 1 | 1 | 1 | 0 | 1 (enable MN1) | 5 |
| 1 | 1 | 1 | 1 | 1 | 1 (enable MN1) | 5 |

In the evaluation phase, 5-input capacitive circuit 1720 can then behave as a majority/minority gate (when threshold is 3) or a threshold gate (when threshold is 4), or an AND/NAND gate (when threshold is 5). Note, this example assumes equal weights for C1, C2, C3, C4, and C5 (e.g., C1=C2=C3=C4=C5). In some embodiments, the threshold may change (e.g., from 3 to 2 or to 1, 4, or 5 or any other value) when the ratio of capacitances of capacitors C1, C2, C3, C4 and/or C5 are modified.

While the various embodiments illustrate the first input 'a', second input 'b', third input 'c', fourth input 'd', and/or fifth input 'e', these inputs are labeled for reference purposes and can be swapped in any order assuming all capacitors have the same capacitance. Input associated with capacitors of the same capacitance can be swapped with one another, in accordance with some embodiments. While the embodiments are illustrated for capacitive input circuits with up to 5 inputs, the adaptive or configurable threshold for the capacitive circuit can be achieved for any number of inputs (e.g., n number of inputs) using the scheme discussed herein.

Table 12 illustrates that when inputs 'a', 'b', 'c', 'd', and 'e' are conditioned and pull-down device MN1 is enabled during the reset phase, then the threshold is set to 3, 4, 5, or 6. When the capacitors comprise paraelectric material, different thresholds are achieved compared to the linear dielectric material for the same input conditioning. Table 12 is the case when capacitors comprise paraelectric material.

TABLE 12

| 'a' | 'b' | 'c' | 'd' | 'e' | Second control (down) | Threshold |
|---|---|---|---|---|---|---|
| 0 | 0 | 0 | 0 | 0 | 1 (enable MN1) | 3 |
| 1 | 0 | 0 | 0 | 0 | 1 (enable MN1) | 4 |
| 1 | 1 | 0 | 0 | 0 | 1 (enable MN1) | 4 |
| 1 | 1 | 1 | 0 | 0 | 1 (enable MN1) | 5 |
| 1 | 1 | 1 | 1 | 0 | 1 (enable MN1) | 5 |
| 1 | 1 | 1 | 1 | 1 | 1 (enable MN1) | 6 |

In the evaluation phase, 5-input capacitive circuit 1720 can then behave as a majority/minority gate (when threshold is 3), a threshold gate (when threshold is 4), an AND/NAND gate (when threshold is 5), or a disconnected circuit (when threshold is 6). Note, this example assumes equal weights for C1, C2, C3, C4, and C5 (e.g., C1=C2=C3=C4=C5). In some embodiments, the threshold may change (e.g., from 3 to 2 or to 1, 4, or 5 or any other value) when the ratio of capacitances of capacitors C1, C2, C3, C4 and/or C5 are modified.

Figure 18:
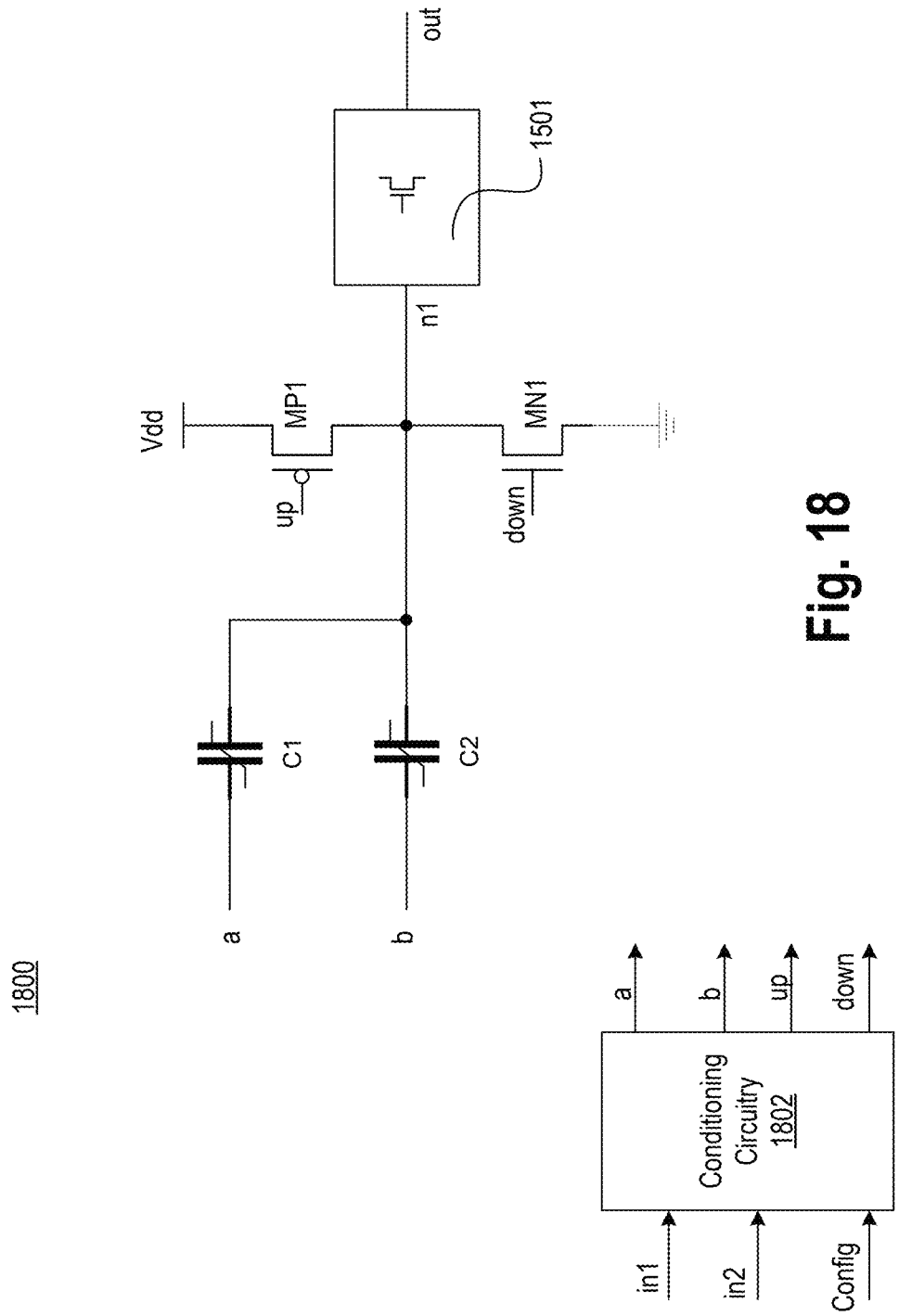
FIG. 18 illustrates a 2-input adjustable threshold gate with ferroelectric capacitors and a pull-down device and a pull-up device on a summing node, in accordance with some embodiments.

FIG. 18 illustrates 2-input adjustable threshold gate 1800 with ferroelectric capacitors and a pull-down device and a pull-up device on a summing node, in accordance with some embodiments. In some embodiments, 2-input capacitive circuit 1800 comprises a first input a, a second input b, a summing node n1, a first capacitor C1, a second capacitor C2, a pull-up-device MP1, a pull-down device MN1, a driver 1501, and an output (out) coupled as shown. In some embodiments, the first capacitor C1 includes a first terminal coupled to the first input and a second terminal coupled to the summing node n1. In some embodiments, the second capacitor C2 includes a third terminal coupled to the second input and a fourth terminal coupled to the summing node n1. In some embodiments, the pull-up device MP1 is coupled to the summing node n1 and a power supply rail Vdd, wherein the pull-up device MP1 is controlled by a first control (up). In some embodiments, the pull-down device MN1 is coupled to the summing node n1 and a ground, wherein the pull-down device is controlled by a second control (down).

In some embodiments, conditioning circuitry 1802 is provided which is used to control or condition the first input, the second input, the first control, and the second control during a reset phase to adjust a threshold of 2-input capacitive circuit 1800. Conditioning circuitry 1802 may receive inputs in1 and in2, and configuration setting (e.g., reset or evaluation) to determine the outputs 'a', 'b', up, and down. During the evaluation phase, in1 is passed on to output 'a' and in2 is passed on to 'b'. During the reset phase, depending on a desired threshold, outputs 'a' and 'b' are conditioned. In various embodiments, the pull-up device MP1 and pull-down device MN1 are turned on in a sequence during reset phase while inputs to the capacitors are kept constant for a particular threshold setting. In some embodiments, for different input values, the threshold can be configured differently. The sequence of turning on the pull-up device MP1 first and then the pull-down device MN1 can be reversed to readjust the threshold of the circuit. In various embodiments, the pull-up device MP1 and pull-down device MN1 are turned off after the reset phase is complete.

Here, the term threshold generally refers to a number that indicates a number of inputs that should be set to logic high to perform a function of a threshold gate. For instance, by turning on/off one or more of the pull-up device MP1 and/or pull-down device MN1, and conditioning the inputs 'a' and 'b' during a reset phase, the charge at node n1 is set so that in an evaluation phase when the pull-up and pull-down devices (MP1 and MN1) are disabled, the input capacitive circuit attains a desired function.

In one instance, when the threshold is set to 2 in a reset phase by a particular sequencing of turning on/off the pull-up and/or the pull-down devices and conditioning of the inputs 'a' and 'b; it means that during an evaluation phase when both inputs 'a' and 'b' are logic high, then voltage on node n1 is logic high. Continuing with this example, when any of the inputs 'a' and 'b' is a logic low, then the voltage on node n1 resolves to logic low. As such, 2-input capacitive circuit 1800 is programmed or configured as a AND gate at node n1 and a NAND gate at output out.

Likewise, when the threshold is set to 1 in a reset phase by a particular sequencing of turning on/off the pull-up and the pull-down devices and conditioning of the inputs 'a' and 'b; it means that during an evaluation phase when either input 'a' and 'b' is logic high, then voltage on node n1 is logic high. Continuing with this example, when both the inputs 'a' and 'b' is a logic low, then the voltage on node n1 resolves to logic low. As such, 2-input capacitive circuit 1800 is programmed or configured as an OR gate at node n1 and a NOR gate at output out. So, the same circuit can be used as an AND/NAND or OR/NOR gate by conditioning the inputs and resetting or setting the voltage on the summing node during a reset phase. Subsequently, in the evaluation phase the circuit will behave as AND/NAND or OR/NOR gate.

In some embodiments, conditioning circuitry 1802 turns off the pull-up device MP1 and the pull-down device MN1 during an evaluation phase separate from the reset phase. The reset phase or evaluation phase are indicated by the logic level of Config. For example, conditioning circuitry 1802 sets the first control (up) to logic high (Vdd) and the second control (down) to logic low (ground) during an evaluation phase (e.g., Config is set to logic 1). Likewise, in a reset phase, Config is set to 0. This is just an example, and the logic level of Config can be modified to present the evaluation phase and the reset phase.

In some embodiments, conditioning circuitry 1802 sets the threshold to 0 in a reset phase by first enabling or turning on the pull-down device MN1, and then turning on or enabling the pull-up device MP1, and providing logic 0 to the first input and the second input. A threshold of 0 means that the capacitive input circuit is an always on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 1802 sets the threshold to 1 in a reset phase by first enabling or turning on the pull-down device MN1, and then turning on the pull-up device MP1, and providing logic 1 to the first input 'a' and logic 0 to the second input 'b'. In some embodiments, conditioning circuitry 1802 sets the threshold to 1 in a reset phase by first enabling or turning on the pull-up device MP1, and then turning on or enabling the pull-down device MN1, and providing logic 0 to the first input 'a' and to the second input 'b'.

In some embodiments, conditioning circuitry 1802 sets the threshold to 2 in a reset phase by first enabling or turning on the pull-up device MP1, and then turning on the pull-down device MN1, and providing logic 1 to the first input 'a' and logic 0 the second input 'b'. In some embodiments, conditioning circuitry 1802 sets the threshold to 2 in a reset phase by first enabling or turning on the pull-down device MN1, and then turning on the pull-up device MP1, and providing logic 1 (e.g., Vdd) to the first input 'a' and to the second input 'b'.

In some embodiments, conditioning circuitry 1802 sets the threshold to 3 in a reset phase by first enabling or turning on the pull-up device MP1, and then turning on or enabling the pull-down device MN1, and providing logic 1 to the first input and the second input. A threshold of 3 for a 2-input capacitive circuit means that capacitive input circuit is an always off circuit regardless of the logic levels of inputs. In one such embodiment, during the evaluation phase for the circuit configured with threshold of n+1 (e.g., 3, where 'n' is the number of capacitive inputs), the logic value on node n1 is floating or drifting and the charge on that node may eventually discharge to ground. In some cases, the voltage on node n1 may charge to supply level via the pull-up device when the node n1 is floating. For example, initially the voltage on the floating node discharges to zero voltages, but then it may charge up via leakage to the supply voltage over time. In some embodiments, when the threshold is n+1, the capacitive input circuit may not turn on even when the inputs to the capacitors are changing. In some embodiments, the voltage on node n1 is zero volts regarding of input setting when the threshold in n+1.

In some embodiments, a logic decides about the kind of logic function to configure 2-input capacitive circuit 1800. For example, a control logic block or a conditioning circuit 1802 may determine whether 2-input capacitive circuit 1800 is to behave as an AND/NAND gate, an OR/NOR gate, an always-on circuit, or a disconnected circuit.

In some embodiments, control logic block or a conditioning circuit 1802 places 2-input capacitive circuit 1800 in a reset phase. In the reset phase, the inputs 'a' and 'b' and controls for the pull-up device MP1 and pull-down device MN1 are set or conditioned to configure or adjust the threshold for the 2-input capacitive circuit. In some embodiments, control logic block or conditioning circuit 1802 may adjust a threshold of 2-input capacitive circuit 1800 to configure the 2-input capacitive circuit 1800 as a particular logic function. When the input capacitors are ferroelectric capacitors (because they include ferroelectric material for their dielectric), control logic block or conditioning circuit 1802 sequences the turning on of the pull-up device MP1 and the pull-down device MN1 to achieve a particular threshold for a given set of inputs to the capacitors. In some embodiments, the pull-up device MP1 is turned on before the pull-down device MN1. In some embodiments, the pull-down device MN1 is turned on before the pull-up device MP1.

Table 13 illustrates an example of input conditioning to set various thresholds during a reset phase for 2-input capacitive circuit 1800. In various embodiments, during the sequence one of pull-up or pull-down devices is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more).

2-input capacitive circuit 1800 in a reset phase to achieve a certain logic function in the evaluation phase.

In some embodiments, control logic block or a conditioning circuit 1802 releases the reset phase and allows the 2-input capacitive circuit to evaluate the inputs in the evaluation phase. Table 14 illustrates a logic function achieved in the evaluation phase by configuring or adjusting the threshold in the reset phase for 2-input capacitive circuit 1800. In various embodiments, the pull-up device MP1 and the pull-down device MN1 are disabled during the evaluation phase.

TABLE 14

| Threshold | Logic Function on node n1 | Logic function on node "out" |
|---|---|---|
| 3 | Logic 0 | Logic 1 |
| 2 | AND | NAND |
| 1 | OR | NOR |
| 0 | Logic 1 | Logic 0 |

Figure 19:
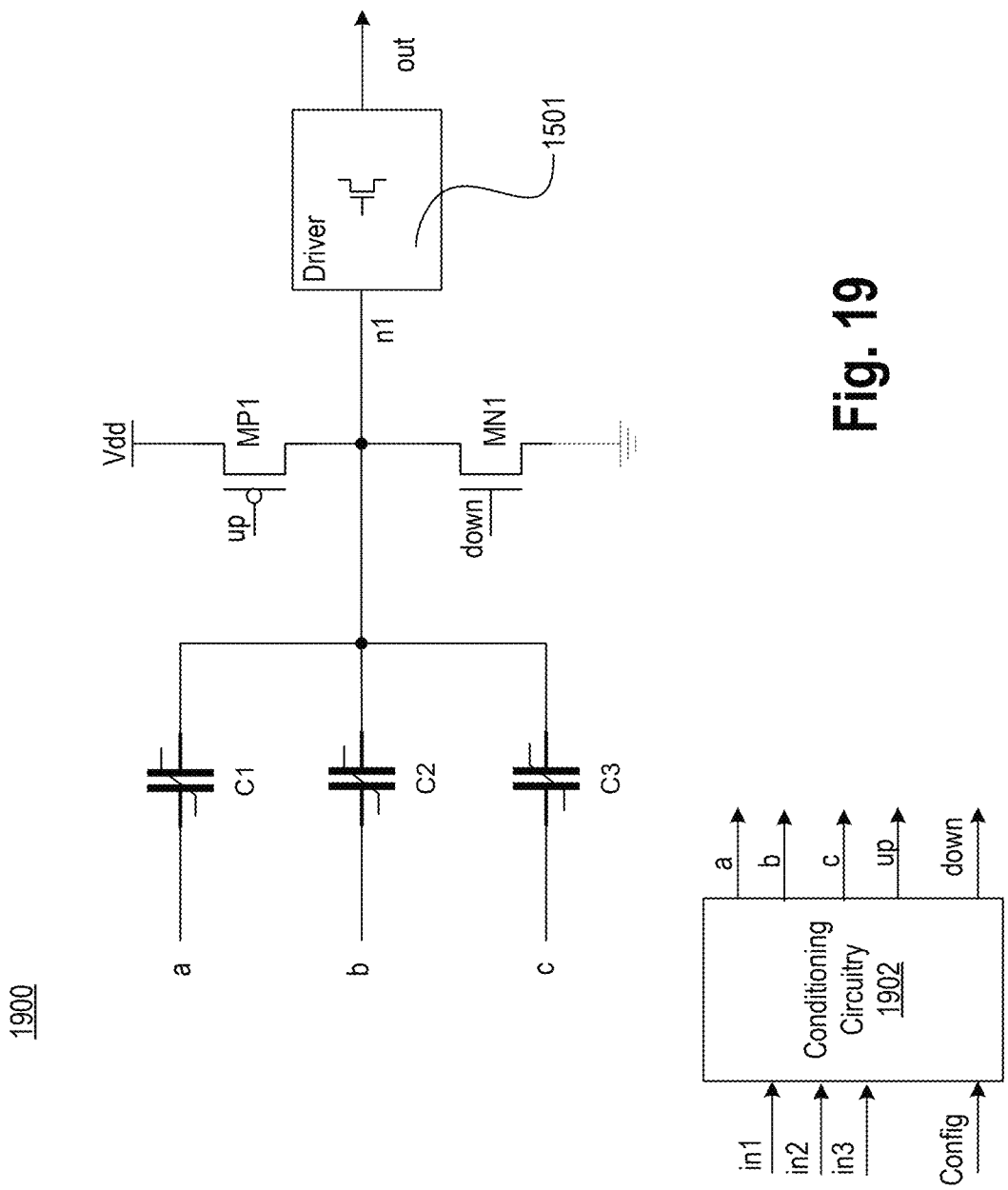
FIG. 19 illustrates a 3-input adjustable threshold gate with ferroelectric capacitors and a pull-down device and a pull-up device on a summing node, in accordance with some embodiments.

FIG. 19 illustrates 3-input adjustable threshold gate 1900 with ferroelectric capacitors and a pull-down device and a pull-up device on a summing node, in accordance with some embodiments. 3-input capacitive circuit 1900 is like 2-input capacitive circuit 1800 but for additional input 'c' and associated capacitor C3. In some embodiments, a first terminal of capacitor C3 is coupled to input 'c' while a second terminal of capacitor C3 is coupled to summing node n1. Conditioning circuit 1802 is replaced with a conditioning circuit 1902. Conditioning circuitry 1902 may receive inputs in1, in2, and in3 and configuration setting (e.g., reset or evaluation) to determine the outputs 'a', 'b', 'c', controls "up", and "down". During the evaluation phase, in1 is passed on to output 'a', in2 is passed on to 'b', and in3 is passed on to 'c'. During the reset phase, depending on a desired threshold, outputs 'a', 'b', and 'c' are conditioned.

In some embodiments, by turning on/off the pull-up device MP1 and pull-down device MN1 in a sequence, and conditioning the inputs 'a', 'b', and 'c' during a reset phase, the charge at node n1 is set. As such, in an evaluation phase when the pull-up and the pull-down devices (MP1 and MN1) are disabled, the 3-input capacitive circuit attains a desired function.

TABLE 13

| Input 'a' | Input 'b' | Time T1 | Time T2 | Time T3 | Threshold |
|---|---|---|---|---|---|
| 0 | 0 | 1 (enable MN1) | 0 (disable MN1) | 0 (enable MP1) | 0 |
| 1 | 0 | 1 (enable MN1) | 0 (disable MN1) | 0 (enable MP1) | 1 |
| 1 | 1 | 1 (enable MN1) | 0 (disable MN1)) | 0 (enable MP1) | 2 |
| 0 | 0 | 0 (enable MP1) | 1 (disable MP1) | 1 (enable MN1) | 1 |
| 1 | 0 | 0 (enable MP1) | 1 (disable MP1) | 1 (enable MN1) | 2 |
| 1 | 1 | 0 (enable MP1) | 1 (disable MP1) | 1 (enable MN1) | 3 |

While the embodiments are illustrated with reference to same capacitances for first capacitor C1 and the second capacitor C2, the threshold can be affected by changing the capacitive ratio of C1 and C2. For example, the input conditioning scheme and the pull-up and pull-down devices control can result in a different threshold than that in Table 13 when the capacitive ratio of C1 and C2 is not 1:1. Overall, the configuring scheme of various embodiments herein provide the flexibility of programming the threshold for In some embodiments, conditioning circuitry 1902 sets the threshold to 0 in a reset phase by first enabling or turning on the pull-down device MN1, and then turning on or enabling the pull-up device MP1, and providing logic 0 to the first input 'a', logic 0 to the second input 'b', and logic 0 to the third input 'c'. A threshold of 0 means that the capacitive input circuit is an always on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 1902 sets the threshold to 1 in a reset phase by first enabling or turning on the pull-down device MN1, and then turning on or enabling the pull-up device MP1, and providing logic 1 to the first input 'a', logic 0 to the second input 'b', and logic 0 to the third input 'c'. In some embodiments, conditioning circuitry 1902 sets the threshold to 1 in a reset phase by first enabling or turning on the pull-up device MP1, and then turning on or enabling the pull-down device MN1, and providing logic 0 to the first input 'a', logic 0 to the second input 'b', and logic 0 to the third input 'c'. In some embodiments, when the threshold is set to 1 in a reset phase by a particular sequencing of turning on/off the pull-up and the pull-down devices and conditioning of the inputs 'a', 'b', and 'c'; it means that during an evaluation phase when any of the inputs 'a' 'b', or 'c' is logic high, then voltage on node n1 is logic high. Continuing with this example, in the evaluation phase when all inputs 'a', 'b', or 'c' are a logic low, then the voltage on node n1 resolves to logic low. As such, 3-input capacitive circuit 1900 is programmed or configured as an OR gate at node n1 and a NOR gate at output out (assuming the driver circuitry is an inverter).

In some embodiments, conditioning circuitry 1902 sets the threshold to 2 in a reset phase by first enabling or turning on the pull-down device MN1, and then turning on or enabling the pull-up device MP1, and providing logic 1 to the first input 'a', logic 1 to the second input 'b', and logic 0 to the third input 'c'. In some embodiments, conditioning circuitry 1902 sets the threshold to 2 in a reset phase by first enabling or turning on the pull-up device MP1, and then turning on or enabling the pull-down device MN1, and providing logic 1 to the first input 'a', logic 0 to the second input 'b', and logic 0 to the third input 'c'. In some embodiments, when the threshold is set to 2 in a reset phase by a particular sequencing of turning on/off the pull-up and the pull-down devices and conditioning of the inputs 'a', 'b', and 'c'; it means that during an evaluation phase when at least two of the three inputs 'a', 'b', and 'c' are logic high, then voltage on node n1 is logic high. Continuing with this example, when at least two inputs of the three inputs 'a' 'b', and 'c' is a logic low, then the voltage on node n1 resolves to logic low. As such, 3-input capacitive circuit 1900 is programmed or configured as a majority gate at node n1 and a minority gate at output out (when the driver circuitry is an inverter). In some cases, depending upon the leakage balance of pull-up transistor MP1 and pull-down transistor MN1 as it impacts charge on the summing node n1, 3-input capacitive circuit 1900 may lose its majority logic functionality over time. This loss in functionality of the majority function can be restored by resetting the summing node n1 via transistors MP1 and MN1, in accordance with some embodiments.

In some embodiments, conditioning circuitry 1902 sets the threshold to 3 in a reset phase by first enabling or turning on the pull-down device MN1, and then turning on or enabling the pull-up device MP1, and providing logic 1 to the first input 'a', logic 1 to the second input 'b', and logic 1 to the third input 'c'. In some embodiments, conditioning circuitry 1902 sets the threshold to 3 in a reset phase by first enabling or turning on the pull-up device MP1, and then turning on or enabling the pull-down device MN1, and providing logic 1 to the first input 'a', logic 1 to the second input 'b', and logic 0 to the third input 'c'. In some embodiments, when the threshold is set to 3 in a reset phase by a particular sequencing of turning on/off the pull-up and the pull-down devices and conditioning of the inputs 'a', 'b', and 'c', it means that during an evaluation phase when all three inputs 'a', 'b', and 'c' are logic high, then voltage on node n1 is logic high. Continuing with this example, when any of the three inputs 'a' 'b', and 'c' is a logic low, then the voltage on node n1 resolves to logic low. As such, 3-input capacitive circuit 1900 is programmed or configured as a 3-input AND at node n1 and a 3-input NAND gate at output out (assuming the driver circuitry is an inverter).

In some embodiments, conditioning circuitry 1902 sets the threshold to 4 in a reset phase by first enabling or turning on the pull-up device MP1, and then turning on or enabling the pull-down device MN1, and providing logic 1 to the first input 'a', the second input 'b', and the third input 'c'. A threshold of 4 for a 3-input capacitive circuit means that capacitive input circuit is an always off circuit regardless of the logic levels of the inputs. In one such embodiment, during the evaluation phase for the circuit configured with threshold of n+1 (e.g., 4, where 'n' is the number of capacitive inputs), the logic value on node n1 is floating and may eventually discharge to ground or charge to supply level. In some embodiments, the voltage on node n1 is zero volts regarding of input setting when the threshold in 4 (e.g., n+1).

So, the same circuit can be used as a majority/minority gate, AND/NAND, OR/NOR, always-on gate, or a disconnected gate by conditioning the inputs and resetting or setting the voltage on the summing node during a reset phase. Subsequently, in the evaluation phase the circuit will behave as a 3-input majority/minority, a 3-input AND/NAND, a 3-input OR/NOR gate, a 3-input always-on gate, or a 3-input disconnected gate.

In some embodiments, a logic decides about the kind of logic function to configure 3-input capacitive circuit 1900. For example, a control logic block or a conditioning circuit 1902 may determine whether 3-input capacitive circuit 1900 is to behave as an always-on circuit, always disconnected circuit, a majority/minority, an AND/NAND gate, or an OR/NOR gate. In some embodiments, control logic block or conditioning circuit 1902 may adjust a threshold of 3-input capacitive circuit 1900 to configure the 3-input capacitive circuit 1900 as a particular logic function.

In some embodiments, control logic block or a conditioning circuit 1902 places 3-input capacitive circuit 1900 in a reset phase. In the reset phase, the inputs 'a', 'b', and 'c' and controls for the pull-up device MP1 and pull-down device MN1 are set or conditioned to configure or adjust the threshold for the 3-input capacitive circuit. In some embodiments, control logic block or a conditioning circuit 1902 may adjust a threshold of 3-input capacitive circuit 1900 to configure the 3-input capacitive circuit 1900 as a particular logic function. When the input capacitors are ferroelectric capacitors (because they include ferroelectric material for their dielectric), control logic block or a conditioning circuit 1902 sequences the turning on of the pull-up device MP1 and the pull-down device MN1 to achieve a particular threshold for a given set of inputs to the capacitors. In some embodiments, the pull-up device MP1 is turned on before the pull-down device MN1. In some embodiments, the pull-down device MN1 is turned on before the pull-up device MP1.

Table 15 illustrates an example of input conditioning to set various thresholds during a reset phase for 3-input capacitive circuit 1900. In various embodiments, during the sequence, one of pull-up or pull-down devices is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more).

TABLE 15

| 'a' | 'b' | 'c' | T1 | T2 | T3 | Threshold |
|---|---|---|---|---|---|---|
| 0 | 0 | 0 | 1 (enable MN1) | ( (disable MN1) | 0 (enable MP1) | 0 |
| 1 | 0 | 0 | 1 (enable MN1) | 0 (disable MN1) | 0 (enable MP1) | 1 |
| 1 | 1 | 0 | 1 (enable MN1) | 0 (disable MN1) | 0 (enable MP1) | 2 |
| 1 | 1 | 1 | 1 (enable MN1) | 0 (disable MN1) | 0 (enable MP1) | 3 |
| 0 | 0 | 0 | 0 (enable MP1) | 1 (disable MP1) | 1 (enable MN1) | 1 |
| 1 | 0 | 0 | 0 (enable MP1) | 1 (disable MP1) | 1 (enable MN1) | 2 |
| 1 | 1 | 0 | 0 (enable MP1) | 1 (disable MP1) | 1 (enable MN1) | 3 |
| 1 | 1 | 1 | 0 (enable MP1) | 1 (disable MP1) | 1 (enable MN1) | 4 |

While the embodiments are illustrated with reference to the same capacitances for the first capacitor C1, the second capacitor C2, and the third capacitor C3, the threshold can be affected by changing the capacitive ratio of C1, C2, and C3 relative to one another. For example, the input conditioning scheme and the pull-up and pull-down devices control can result in a different threshold than that in Table 15 when the capacitive ratio of C1, C2, and C3 is not 1:1:1. Overall, the configuring scheme of various embodiments herein provide the flexibility of programming or adjusting the threshold for 3-input capacitive circuit 1900 in a reset phase to achieve a certain logic function in the evaluation phase.

In some embodiments, control logic block or a conditioning circuit 1902 releases the reset phase and allows 3-input capacitive circuit to evaluate the inputs in the evaluation phase. Table 16 illustrates a logic function achieved in the evaluation phase by configuring the threshold in the reset phase for 3-input capacitive circuit 1900. In various embodiments, the pull-up device MP1 and the pull-down device MN1 are disabled during the evaluation phase.

TABLE 16

| Threshold | Logic Function on node n1 | Logic function on node "out" |
|---|---|---|
| 0 | Logic 1 | Logic 0 |
| 1 | OR | NOR |
| 2 | Majority | Minority |
| 3 | AND | NAND |
| 4 | Logic 0 | Logic 1 |

Figure 20:
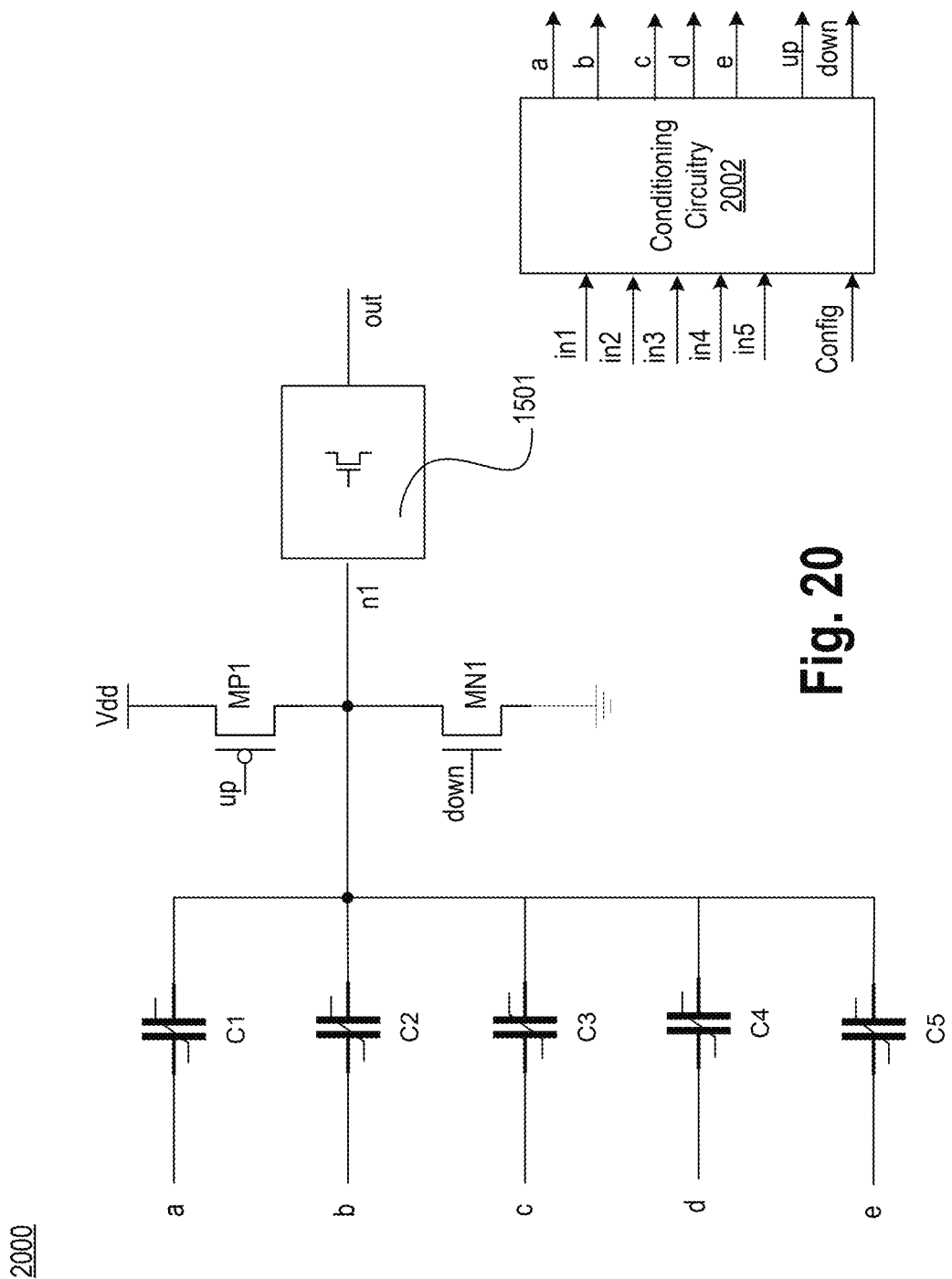
FIG. 20 illustrates a 5-input adjustable threshold gate with ferroelectric capacitors and a pull-down device and a pull-up device on a summing node, in accordance with some embodiments.

FIG. 20 illustrates 5-input adjustable threshold gate 2000 with ferroelectric capacitors and a pull-down device and a pull-up device on a summing node, in accordance with some embodiments. 5-input capacitive circuit 2000 is like 3-input capacitive circuit 1800 but for additional inputs 'd' and 'e' and associated capacitors C4 and C5. In some embodiments, a first terminal of capacitor C4 is coupled to input 'd' while a second terminal of capacitor C4 is coupled to summing node n1. In some embodiments, a first terminal of capacitor C5 is coupled to input 'e' while a second terminal of capacitor C5 is coupled to summing node n1. Conditioning circuit 1902 is replaced with a conditioning circuit 2002. Conditioning circuitry 2002 may receive inputs in1, in2, in3, in4, and in5 and configuration setting (e.g., reset or evaluation) to determine the outputs 'a', 'b', 'c', 'd', 'e', controls "up", and "down". During the evaluation phase, in1 is passed on to output 'a', in2 is passed on to 'b', in3 is passed on to 'c', in4 is passed on to 'd', and in5 is passed on to 'e'. During the reset phase, depending on a desired threshold, outputs 'a', 'b', 'c' 'd', and 'e' are conditioned.

In some embodiments, by turning on/off the pull-up device MP1 and pull-down device MN1 in a sequence, and conditioning the inputs 'a', 'b', 'c', 'd', and 'e' during a reset phase, the charge at node n1 is set. As such, in an evaluation phase when the pull-up and pull-down devices (MP1 and MN1) are disabled, the 5-input capacitive circuit attains a desired function.

In some embodiments, conditioning circuitry 2002 sets the threshold to 0 in a reset phase by first enabling or turning on the pull-down device MN1, and then turning on or enabling the pull-up device MP1, and providing logic 0 to the first input 'a', logic 0 to the second input 'b', and logic 0 to the third input 'c', logic 0 to the fourth input 'd', and logic 0 to the fifth input 'e'. A threshold of 0 means that conditioning circuitry 2002 is an always-on circuit regardless of the logic levels of inputs. In one such embodiment, during the evaluation phase for the circuit configured with threshold of zero, the logic value on node n1 is logic 1, and the logic value on output out is logic 0 (assuming the driver is an inverter).

In some embodiments, conditioning circuitry 2002 sets the threshold to 1 in a reset phase by first enabling or turning on the pull-down device MN1, and then turning on or enabling the pull-up device MP1, and providing logic 1 to the first input 'a', logic 0 to the second input 'b', and logic 0 to the third input 'c', logic 0 to the fourth input 'd', and logic 0 to the fifth input 'e'. In some embodiments, conditioning circuitry 2002 sets the threshold to 1 in a reset phase by first enabling or turning on the pull-up device MP1, and then turning on or enabling the pull-down device MN1, and providing logic 0 to the first input 'a', logic 0 to the second input 'b', and logic 0 to the third input 'c', logic 0 to the fourth input 'd', and logic 0 to the fifth input 'e'. In some embodiments, when the threshold is set to 1 in a reset phase by a particular sequencing of turning on/off the pull-up and the pull-down devices and conditioning of the inputs 'a' 'b', 'c', 'd', and 'e'; it means that during an evaluation phase when any of the inputs 'a' 'b', 'c', 'd', or 'e' is logic high, then voltage on node n1 is logic high. Continuing with this example, when all inputs 'a', 'b', 'c' 'd', or 'e' is a logic low, then the voltage on node n1 resolves to logic low. As such, 5-input capacitive circuit 2000 is programmed or configured as an OR gate at node n1 and an NOR gate at output out.

In some embodiments, conditioning circuitry 2002 sets the threshold to 2 in a reset phase by first enabling or turning on the pull-down device MN1, and then turning on or enabling the pull-up device MP1, and providing logic 1 to the first input 'a', logic 1 to the second input 'b', and logic 0 to the third input 'c', logic 0 to the fourth input 'd', and logic 0 to the fifth input 'e'. In some embodiments, conditioning circuitry 2002 sets the threshold to 2 in a reset phase by first enabling or turning on the pull-up device MP1, and then turning on or enabling the pull-down device MN1, and providing logic 1 to the first input 'a', logic 0 to the second input 'b', and logic 0 to the third input 'c', logic 0 to the fourth input 'd', and logic 0 to the fifth input 'e'. In one instance, when the threshold is set to 2 in a reset phase by a particular sequencing of turning on/off the pull-up and the pull-down devices and conditioning of the inputs 'a', 'b', 'c', 'd', and 'e'; it means that during an evaluation phase when at least two of the five inputs 'a', 'b' 'c', 'd', and 'e' are logic high, then voltage on node n1 is logic high. Continuing with this example, when one or zero inputs of the five inputs 'a' 'b', 'c', 'd', and 'e' are a logic high, then the voltage on node n1 resolves to logic low. As such, 5-input capacitive circuit 2000 is programmed or configured as a 5-input majority 0 gate-like logic (e.g., a threshold gate with a threshold of 2) at node n1 and a 5-input minority 0 gate-like logic (e.g., an inverted threshold gate with a threshold of 2) at output out.

In some embodiments, conditioning circuitry 2002 sets the threshold to 3 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 0 to the fourth input 'd', and logic 0 to the fifth input 'e'. In some embodiments, conditioning circuitry 2002 sets the threshold to 3 in a reset phase by first enabling or turning on the pull-up device MP1, and then turning on or enabling the pull-down device MN1, and providing logic 1 to the first input 'a', logic 1 to the second input 'b', and logic 0 to the third input 'c', logic 0 to the fourth input 'd', and logic 0 to the fifth input 'e'. In one instance, when the threshold is set to 3 in a reset phase by a particular sequencing of turning on/off the pull-up and/or the pull-down devices and conditioning of the inputs 'a', 'b', 'c', 'd', and 'e'; it means that during an evaluation phase when at least three of the five inputs 'a', 'b' 'c', 'd', and 'e' are logic high, then voltage on node n1 is logic high. Continuing with this example, when at least two inputs of the five inputs 'a' 'b', 'c', 'd', and 'e' is a logic low (or 2 or fewer inputs are logic high), then the voltage on node n1 resolves to logic low. As such, 5-input capacitive circuit 2000 is programmed or configured as a 5-input majority gate logic at node n1 and a 5-input minority gate logic at output out (assuming driver circuitry 1501 is an inverter).

In some embodiments, conditioning circuitry 2002 sets the threshold to 4 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 1 to the fourth input 'd', and logic 0 to the fifth input 'e'. In some embodiments, conditioning circuitry 2002 sets the threshold to 4 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 0 to the fourth input 'd', and logic 0 to the fifth input 'e'. In some embodiments, when the threshold is set to 4 in a reset phase by a particular sequencing of turning on/off the pull-up and the pull-down devices and conditioning of the inputs 'a', 'b', 'c', 'd', and 'e'; it means that during an evaluation phase when at least four inputs from the five inputs 'a', 'b' 'c', 'd' and 'e' are logic high, then voltage on node n1 is logic high. Continuing with this example, when three or fewer inputs from the five inputs 'a' 'b', 'c', 'd' and 'e' are logic high, then the voltage on node n1 resolves to logic low. As such, 5-input capacitive circuit 2000 is programmed or configured as a 5-input majority 1 gate-like logic (e.g., a threshold gate with a threshold of 4) at node n1 and a 5-input minority 1 gate-like logic (e.g., an inverted threshold gate with a threshold of 4) at output out.

In some embodiments, conditioning circuitry 2002 sets the threshold to 5 in a reset phase by first enabling or turning on the pull-down device MN1, and then turning on or enabling the pull-up device MP1, and providing logic 1 to the first input 'a', logic 1 to the second input 'b', and logic 1 to the third input 'c', logic 1 to the fourth input 'd', and logic 1 to the fifth input 'e'. In some embodiments, conditioning circuitry 2002 sets the threshold to 5 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 1 to the fourth input 'd', and logic 0 to the fifth input 'e'. In some embodiments, when the threshold is set to 5 in a reset phase by a particular sequencing of turning on/off the pull-up and the pull-down devices and conditioning of the inputs 'a', 'b', 'c', 'd', and 'e'; it means that during an evaluation phase when all five inputs 'a', 'b' 'c', 'd', and 'e' are logic high, then voltage on node n1 is logic high. Continuing with this example, when any of the five inputs 'a' 'b', 'c', 'd', and 'e' is a logic low, then the voltage on node n1 resolves to logic low. As such, 5-input capacitive circuit 2000 is programmed or configured as a 5-input AND at node n1 and a 5-input NAND gate at output out (assuming that the driver circuitry 1501 is an inverter).

In some embodiments, conditioning circuitry 2002 sets the threshold to 6 in a reset phase by first enabling or turning on the pull-up device MP1, and then turning on or enabling the pull-down device MN1, and providing logic 1 to the first input 'a', logic 1 to the second input 'b', and logic 1 to the third input 'c', logic 1 to the fourth input 'd', and logic 1 to the fifth input 'e'. A threshold of 6 for a 5-input capacitive circuit means that capacitive input circuit is an always off circuit regardless of the logic levels of the inputs. In one such embodiment, during the evaluation phase for the circuit configured with threshold of n+1 (e.g., 6, where 'n' is the number of capacitive inputs), the logic value on node n1 is floating and may eventually discharge to ground or charge to supply level. In some embodiments, the voltage on node n1 is zero volts regardless of input setting when the threshold in 6 (e.g., n+1).

The same circuit can be used as a majority/minority gate logic majority/minority gate-like logic (or threshold logic gate), AND/NAND, OR/NOR gate, a gate driving a predetermined output, or a disconnected gate by conditioning the inputs and resetting or setting the voltage on the summing node in a sequence during a reset phase. Subsequently, in the evaluation phase the circuit will behave as a 5-input majority/minority gate logic, 5-input majority/minority gate-like or threshold logic, 5-input AND/NAND gate, 5-input OR/NOR gate, an always-on gate, or a disconnected gate.

Table 17 illustrates an example of input conditioning to set various thresholds during a reset phase for 5-input capacitive circuit 2000. In various embodiments, during the sequence one of pull-up or pull-down devices is on at a time to avoid crossbar current or short circuit current. For example, when the pull-down device MN1 is enabled, the pull-up device MP1 is disabled. Likewise, when the pull-up device MP1 is enabled, the pull-down device MN1 is disabled. Here, time T3 (or event T3) occurs after time T2 (or event T2) which occurs after time T1 (or event T1). In some embodiments, the separation between T1, T2, and T3 is between ½ cycle to 1 cycle, where a cycle is in GHz (e.g., 1 GHz or more).

TABLE 17

| a b c d e | T1 | T2 | T3 | Threshold |
|---|---|---|---|---|
| 0 0 0 0 0 | 1 (enable MN1) | 0 (disable MN1) | 0 (enable MP1) | 0 |
| 1 1 0 0 0 | 1 (enable MN1) | 0 (disable MN1) | 0 (enable MP1) | 1 |
| 1 1 0 0 0 | 1 (enable MN1) | 0 (disable MN1) | 0 (enable MP1) | 2 |

TABLE 17-continued

| a b c d e | T1 | T2 | T3 | Threshold |
|---|---|---|---|---|
| 1 1 1 0 0 | 1 (enable MN1) | 0 (disable MN1) | 0 (enable MP1) | 3 |
| 1 1 1 1 0 | 1 (enable MN1) | 0 (disable MN1) | 0 (enable MP1) | 4 |
| 1 1 1 1 1 | 1 (enable MN1) | 0 (disable MN1) | 0 (enable MP1) | 5 |
| 0 0 0 0 0 | 0 (enable MP1) | 1 (disable MP1) | 1 (enable MN1) | 1 |
| 1 0 0 0 0 | 0 (enable MP1) | 1 (disable MP1) | 1 (enable MN1) | 2 |
| 1 1 0 0 0 | 0 (enable MP1) | 1 (disable MP1) | 1 (enable MN1) | 3 |
| 1 1 1 0 0 | 0 (enable MP1) | 1 (disable MP1) | 1 (enable MN1) | 4 |
| 1 1 1 1 0 | 0 (enable MP1) | 1 (disable MP1) | 1 (enable MN1) | 5 |
| 1 1 1 1 1 | 0 (enable MP1) | 1 (disable MP1) | 1 (enable MN1) | 6 |

Table 18 illustrates a logic function achieved in the evaluation phase by configuring the threshold in the reset phase for 5-input capacitive circuit 2000. In various embodiments, the pull-up device MP1 and the pull-down device MN1 are disabled during the evaluation phase.

TABLE 18

| Threshold | Logic Function on node n1 | Logic function on node "out" |
|---|---|---|
| 0 | Logic 1 | Logic 0 |
| 1 | OR | NOR |
| 2 | Majority 0 gate-like (e.g., a threshold gate with a threshold of 2) | Minority 0 gate-like (e.g., an inverted threshold gate with a threshold of 2) |
| 3 | Majority gate | Minority gate |
| 4 | Majority 1 gate-like (e.g., a threshold gate with a threshold of 4) | Minority 1 gate-like (e.g., an inverted threshold gate with a threshold of 4) |
| 5 | AND | NAND |
| 6 | Logic 0 | Logic 1 |

By setting inputs to have a particular number of 0s and 1s and at the same time controlling the logic level appearing at the summation node (n1) by controlling the pull-up and pull-down devices in a sequence, two effects are accomplished, in accordance with various embodiments. First, each capacitor stores a deterministic charge. Second, a specific displacement charge is put on the summing or floating node n1. Setting a specific displacement charge value at the floating node n1 sets the threshold of when the floating node (n1) during the evaluation phase is allowed to go to the logic value of 0 or 1. For example, for an n-input threshold gate, if the threshold is set such that the floating node n1 goes closer to 1 logic level than 0 logic level, when all of the inputs are set to 1, then the capacitive input circuit becomes a NAND gate. Similarly, if it is desired that any one input becomes logic 1 in the evaluation phase to give voltage closer to logic level 1 at the floating node, then the circuit becomes an OR gate with n-inputs. Similarly, any intermediate threshold from 0 to n can be set. In some embodiments, a threshold of zero means that the gate becomes a buffer. For instance, the circuit is always turned on to input logic level 1. A threshold of n+1 for an n-input gate means that the summation node n1 may not go closer to logic level 1, even when all the inputs are set to 1. This would mean that that the capacitive input circuit becomes a disconnected circuit.

In general, the input capacitive circuit when configured as a threshold gate, it can be expressed as:

$$Y = 1 \text{ if } \sum_{j=1}^{m} W_j X_j \geq T,$$

$$Y = 0 \text{ if } \sum_{j=1}^{m} W_j X_j < T,$$

where 'Y' is the output (logic level on node n1), 'X' is the input, 'W' is the capacitive weight, and 'T' is the threshold. Assuming all Ws are ones (e.g., all capacitors have the same capacitance), when T is equal to the number of inputs, and gate is realized at node n1. In this example, for a 3-input capacitive circuit, a 3-input AND gate is realized when threshold is set to 3. In another example, when T equals 1, a NOR gate is realized at node n1. In yet another example, when T is equal to 0, the input capacitive circuit is always on, and the voltage on node n1 is logic 1. In yet another example, when T is greater than the number of inputs to the circuit, the circuit is always off or disconnected. In this case, voltage on node n1 is floating and may over time leak away.

While the embodiments are described with reference to up-to 5-input capacitive circuit using equal ratio for the capacitance, the same idea can be expanded to any number of input capacitive circuits with equal or unequal ratio for capacitances. In various embodiments, the capacitances are ferroelectric capacitors. In some embodiments, the ferroelectric capacitors are planar capacitors. In some embodiments, the ferroelectric capacitors are pillar or trench capacitors. In some embodiments, the ferroelectric capacitors are vertically stacked capacitors to reduce the overall footprint of the multi-input capacitive circuit.

In some embodiments, the transistors (MP1 and MN1) that charge or discharge the summing node n1 are planar or non-planar transistors. In some embodiments, transistors MP1 and MN1 are fabricated in the front-end of the die on a substrate. In some embodiments, one of the transistors (e.g., MP1 or MN1) is fabricated in the front-end of the die while another one of the transistors is fabricated in the backend of the end such that the stack of capacitors is between the frontend of the die and the backend of the die or between the two transistors. As such, the footprint of the multi-input capacitive circuit may be a footprint of a single transistor or slightly more than that. These backed transistors or switches can be fabricated using any suitable technology such as IGZO (indium gallium zinc oxide). In some embodiments, the ferroelectric capacitors can be formed using transistors configured as capacitors, where transistor gates have ferroelectric material. These capacitors can be on the frontend or the backend of the die.

While the various embodiments are described with reference to driver circuitry 1501 connected at node n1, driver circuitry 1501 can be removed. When input capacitors for a capacitive input circuit are linear capacitors (e.g., comprising linear dielectric material), the voltage developed at node n1 may not reach rail-to-rail. As such, the subsequent driver circuitry 1501 connected to node n1 may experience static leakage. Static leakage increases power consumption. In various embodiments, when input capacitors comprise nonlinear polar material (e.g., ferroelectric material), then the voltage developed on node n1 results in reduced static leakage in the subsequent driver circuitry 1501. One reason for this reduced leakage is because ferroelectric material in the input capacitors allow for voltage on node n1 to reach closer to rail-to-rail voltage, which reduces static leakage in subsequent driver circuitry 1501. Here, summation node n1 can maintain displacement charge (to provide logic 0 or logic 1 functions for the programmed threshold) for a longer period compared to linear capacitors. Consequently, the reset overhead of turning on/off the pull-up or pull-down devices is reduced. For example, when the leakage at the summation node n1 is low, the pull-up or pull-down devices may not need to turn on for tens of microseconds, which reduces the reset activity on node n1. Thus, circuit using nonlinear capacitors (e.g., ferroelectric capacitor) in this configuration becomes a viable option to realize low leakage logic circuits for advanced process technology nodes (e.g., advanced finFET process technology node).

Since the voltage on node n1 for the various threshold gates described herein is closer to rail-to-rail voltage compared to the case when linear input capacitors are used, subsequent driver circuitry 1501 can be removed. As such, the input capacitors with nonlinear polar material can drive another capacitive input circuit directly. Here, closer to rail-to-rail voltage on node n1 using nonlinear polar material based capacitors (e.g., ferroelectric or paraelectric capacitors) implies that the static leakage in the subsequent driver 1501 is reduced compared to the case when voltage on n1 is not close to rail-to-rail voltage. When linear capacitors are used, a voltage divider is formed on node n1 based on the number of capacitors and their logic inputs. Such a voltage divider results in non-rail-to-rail voltage on node n1 that results in static leakage in the subsequent driver 1501. When nonlinear capacitors are used, the voltage divider is not a linear voltage divider. This results in a much closer rail-to-rail voltage on n1 which reduces static leakage in the subsequent driver 1501. The higher the nonlinearity, the closer the voltage on node n1 is rail-to-rail. Nonlinear capacitors as shown in various embodiments allow the logic gate to have more inputs compared to the case when linear capacitors are used while keeping the leakage through diver 1501 low.

Figure 21:
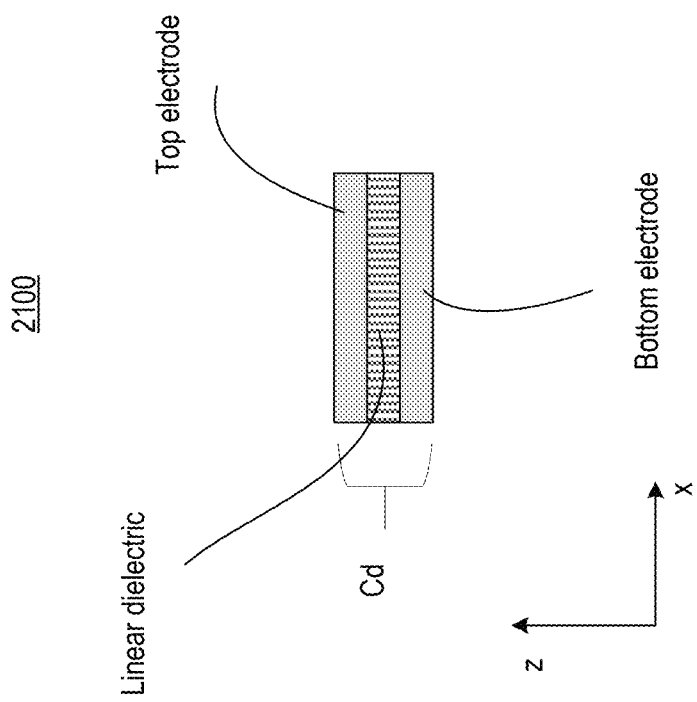
FIG. 21 illustrates a planar linear capacitor structure, in accordance with some embodiments.

FIG. 21 illustrates planar linear capacitor structure 2100, in accordance with some embodiments. In some embodiments, capacitors for the multi-input capacitive structures are linear capacitors. These capacitors can take any planar form. One such form is illustrated in FIG. 21. Here, planar capacitor structure 2100 is a metal-insulator-metal (MIM) capacitor comprising a bottom electrode, a top electrode, and a linear dielectric between the top electrode and the bottom electrode as shown. In some embodiments, conductive oxide layer(s) are formed between the bottom electrode and the linear dielectric. In some embodiments, conductive oxide layer(s) are formed between the top electrode and the linear dielectric. Examples of conductive oxides include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and B is Mn.

In some embodiments, the dielectric layer includes one or more of: SiO2, Al2O3, Li2O, HfSiO4, Sc2O3, SrO, HfO2, ZrO2, Y2O3, Ta2O5, BaO, WO3, MoO3, or TiO2. Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

Figure 22A:
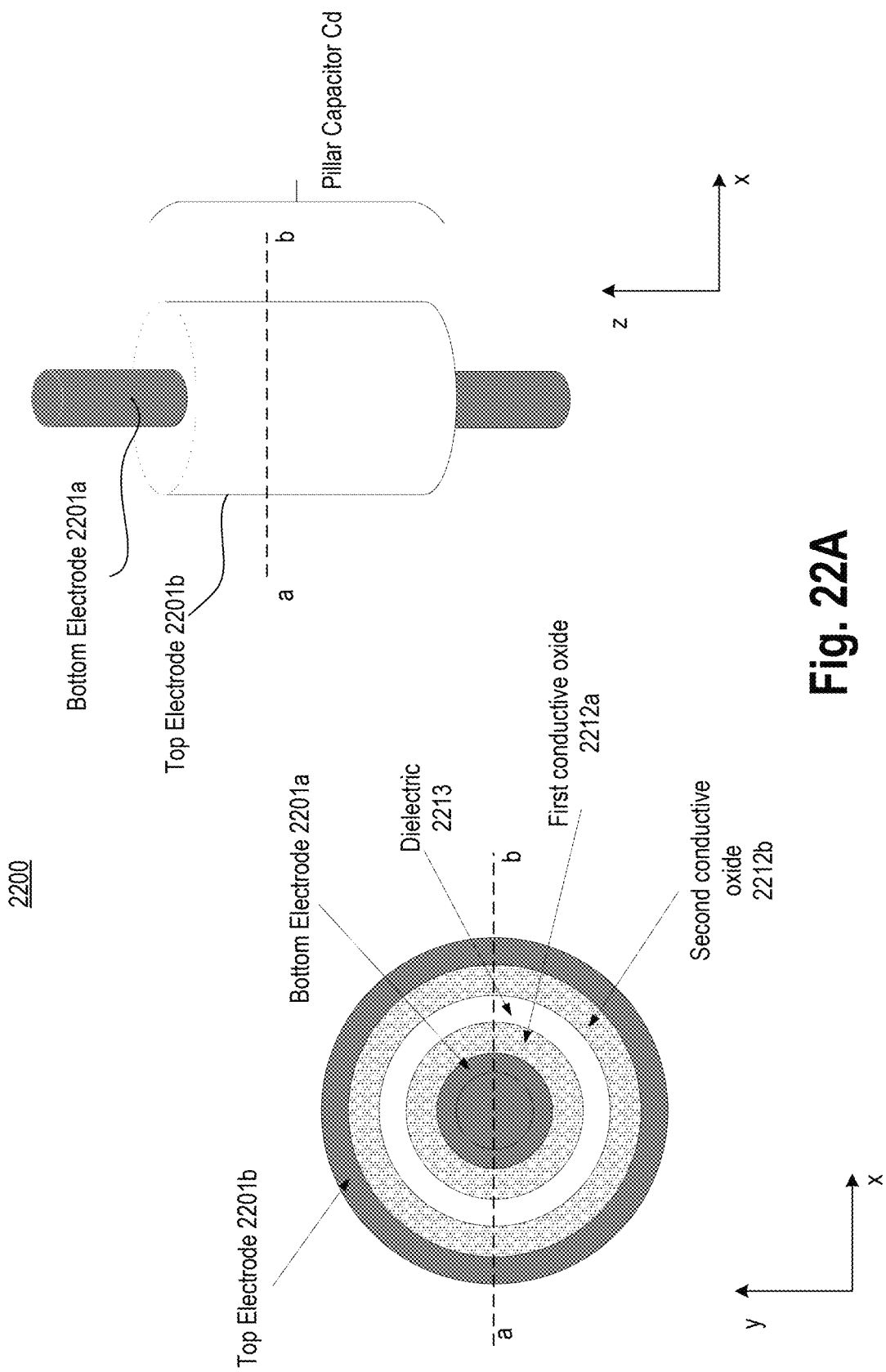
FIG. 22A illustrates a non-planar linear capacitor structure, in accordance with some embodiments.

FIG. 22A illustrates a non-planar linear capacitor structure 2200, in accordance with some embodiments. In some embodiments, non-planar capacitor structure 2200 is rectangular in shape. Taking the cylindrical shaped case for example, in some embodiments, the layers of non-planar capacitor structure 2200 from the center going outwards include bottom electrode 2201a, first conductive oxide 2212a, linear dielectric material 2213, second conductive oxide 2212b, and top electrode 2201b. A cross-sectional view along the "ab" dashed line is illustrated in the middle of FIG. 22A. In some embodiments, conducting oxides are removed and the linear dielectric is directly connected to top electrode 2201b and bottom electrodes 2201a. In some embodiments, linear dielectric material 2213 can include any suitable dielectric, where the thickness of dielectric film is a range of 1 nm to 20 nm. In some embodiments, linear dielectric material 2213 comprises a higher-K dielectric material. In some embodiments, linear dielectrics include one of: SIO2, Al2O3, Li2O, HfSiO4, Sc2O3, SrO, HfO2, ZrO2, Y2O3, Ta2O5, BaO, WO3, MoO3, or TiO2. The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide.

In some embodiments, first conductive oxide 2212a is conformally deposited over bottom electrode 2201a. In some embodiments, dielectric material 2213 is conformally deposited over first conductive oxide 2212a. In some embodiments, second conductive oxide 2212b is conformally deposited over dielectric material 2213. In some embodiments, top electrode 2201b is conformally deposited over second conductive oxide 2212b. In some embodiments, bottom electrode 2201a is in the center while top electrode 2201b is on an outer circumference of non-planar capacitor structure 2200.

In some embodiments, material for bottom electrode 2201a may include one or more of: Cu, Al, Ag, Au, W, or Co, or their alloys. In some embodiments, material for first conductive oxide 2212a include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and B is Mn. In some embodiments, material for second conductive oxide 2212b may be same as the material for first conductive oxide 2212a. In some embodiments, material for top electrode 2201b may include one or more of: Cu, Al, Ag, Au, W, or Co, or their alloys.

In some embodiments, a first refractive inter-metallic layer (not shown) is formed between dielectric material 2213 and first conductive oxide 2212a. In some embodiments, a second refractive inter-metallic layer (not shown) is formed between dielectric capacitor material 2213 and second conductive oxide 2212b. In these cases, the first and second refractive inter-metallic layers are directly adjacent to their respective conductive oxide layers and to dielectric capacitor material 2213. In some embodiments, refractive inter-metallic maintains the capacitive properties of the dielectric capacitor material 2213. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1% to 5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B, and Mg can markedly enhance other properties. The thicknesses of the layers of capacitor 2200 in the x-axis are in the range of 1 nm to 30 nm. In some embodiment, refractive inter-metallic layers are not used for non-planar capacitor structure 2200.

Figure 22B:
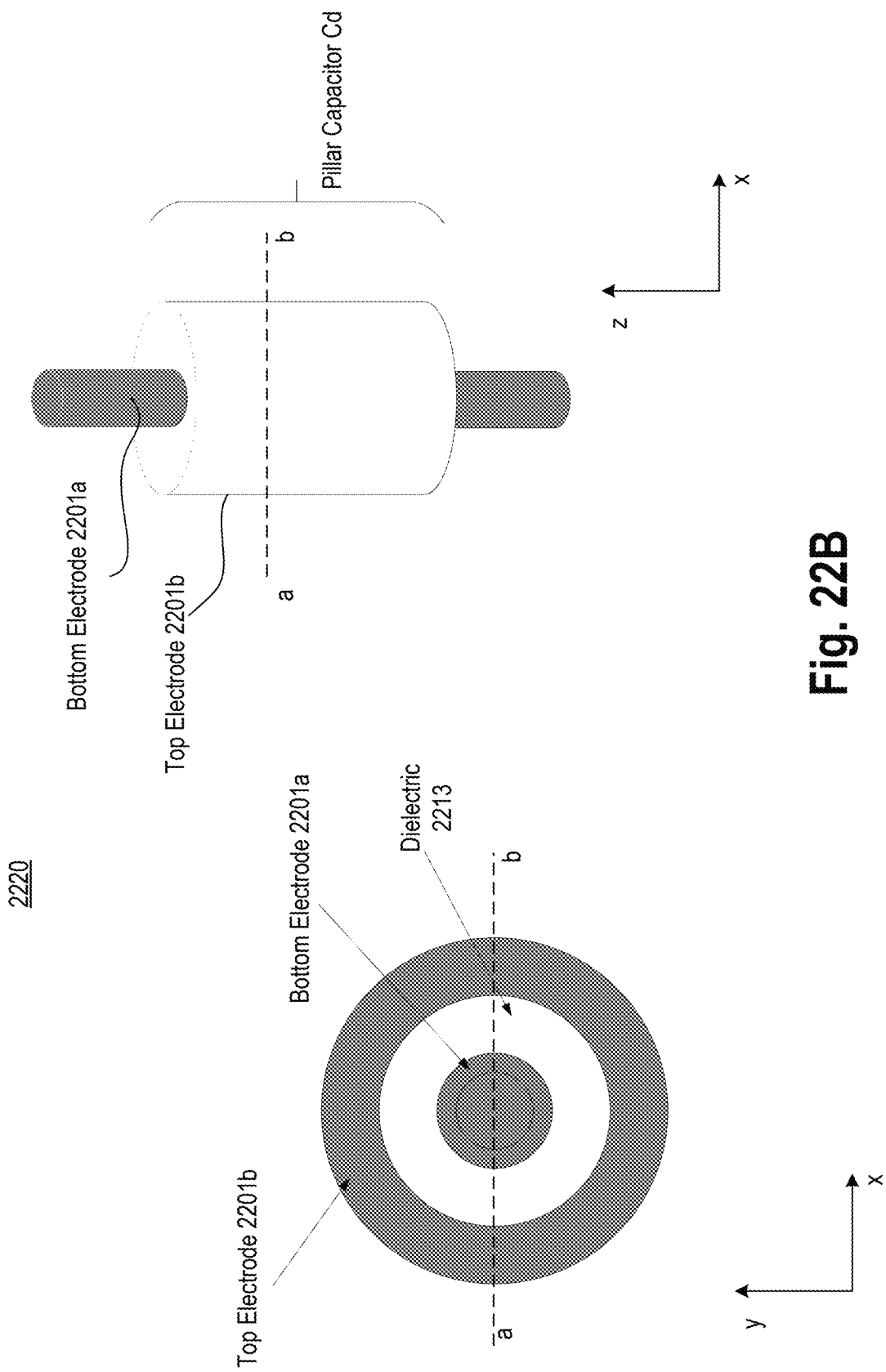
FIG. 22B illustrates a non-planar linear capacitor structure without conductive oxides, in accordance with some embodiments.

FIG. 22B illustrates non-planar linear capacitor structure 2220 without conductive oxides, in accordance with some embodiments. Compared to FIG. 22A, here the linear dielectric is adjacent to the top electrode and the bottom electrode.

Figure 23A:
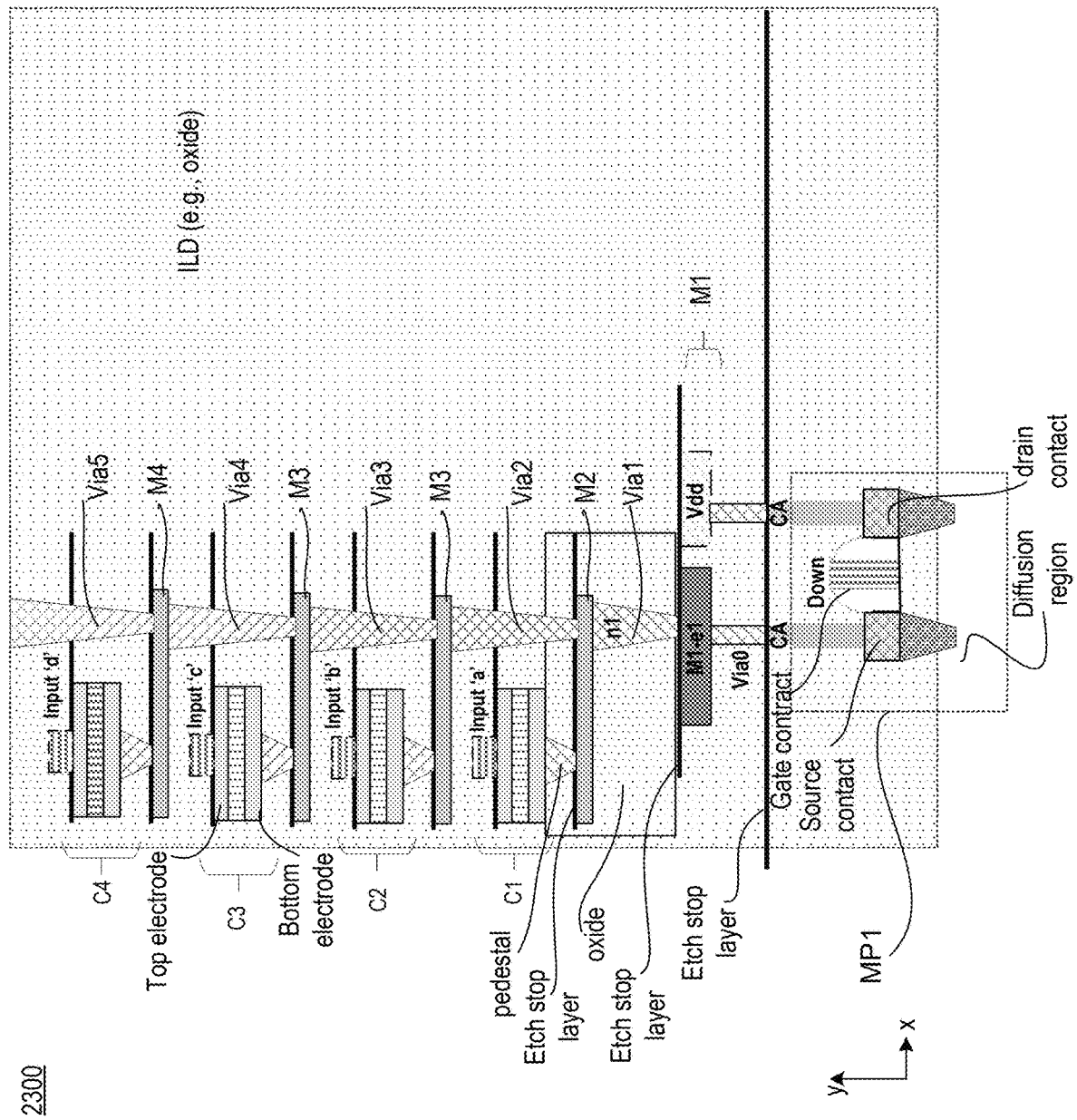
FIG. 23A illustrates a multi-input capacitive circuit with stacked planar capacitor structure, wherein the multi-input capacitive circuit includes a pull-up device, in accordance with some embodiments.

FIG. 23A illustrates multi-input capacitive circuit 2300 with stacked planar capacitor structure, wherein the multi-input capacitive circuit includes a pull-up device, in accordance with some embodiments. In this example, pull-up device is shown which is controlled by the Up control on its gate terminal. The source and drain terminals of transistor MP1 is coupled to contact (CA). Etch stop layer is used in the fabrication of vias (via0) to connect the source or drain of the transistors to summing node n1 on metal-1 (M1) layer. Another etch stop layer is formed over M1 layer to fabricate vias (via1) to couple to respective M1 layers. In some embodiments, metal-2 (M2) is deposited over vias (via1). M2 layer is then polished. In some embodiments, the capacitor can be moved further up in the stack, where the capacitor level processing is done between different layers.

In some embodiments, oxide is deposited over the etch stop layer. Thereafter, dry, or wet etching is performed to form holes for pedestals. The holes are filled with metal and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

A number of fabrication processes of deposition, lithography, and etching takes place to form the stack of layers for the planar capacitor. In some embodiments, the linear dielectric capacitors are formed in a backend of the die. In some embodiments, deposition of ILD is followed by surface polish. In some embodiments, a metal layer is formed over top electrode of each capacitor to connect to a respective input. For example, metal layer over the top electrode of capacitor C1 is connected to input 'a'. Metal layer over the top electrode of capacitor C2 is connected to input 'b'. Metal layer over the top electrode of capacitor C3 is connected to input 'c'. Metal layer over the top electrode of capacitor C4 is connected to input 'd'. The metal layers coupled to the bottom electrodes of capacitors C1, C2, C3, and C4 are coupled to summing node n1 through respective vias.

In this case, after polishing the surface, ILD is deposited, in accordance with some embodiments. Thereafter, holes are etched through the ILD to expose the top electrodes of the capacitors, in accordance with some embodiments. The holes are then filled with metal, in accordance with some embodiments. After the holes are filled, the top surface is polished, in accordance with some embodiments. As such, the capacitors are connected to input electrode (e.g., input 'a', input 'b', input 'c', and input 'd') and summing node n1 (through the pedestals), in accordance with some embodiments.

In some embodiments, ILD is deposited over the polished surface. Holes for via are then etched to contact the M2 layer, in accordance with some embodiments. The holes are filled with metal to form vias (via2), in accordance with some embodiments. The top surface is then polished, in accordance with some embodiments. In some embodiments, process of depositing metal over the vias (via2), depositing ILD, etching holes to form pedestals for the next capacitors of the stack, forming the capacitors, and then forming vias that contact the M3 layer are repeated. This process is repeated 'n' times for forming 'n' capacitors in a stack for 'n' number of inputs, in accordance with some embodiments.

In some embodiments, the bottom electrode of each capacitor is allowed to directly contact with the metal below. For example, the pedestals that connect to the top and bottom electrodes are removed. In this embodiment, the height of the stacked capacitors is lowered, and the fabrication process is simplified because the extra steps for forming the pedestals are removed.

In some embodiments, pedestals or vias are formed for both the top and bottom electrodes of the planar capacitors. In this embodiment, the height of the stacked capacitors is raised, and the fabrication process adds an additional step of forming a top pedestal or via which contacts with respective input electrodes (e.g., input 'a', input 'b', input 'c', and input 'd').

Figure 23B:
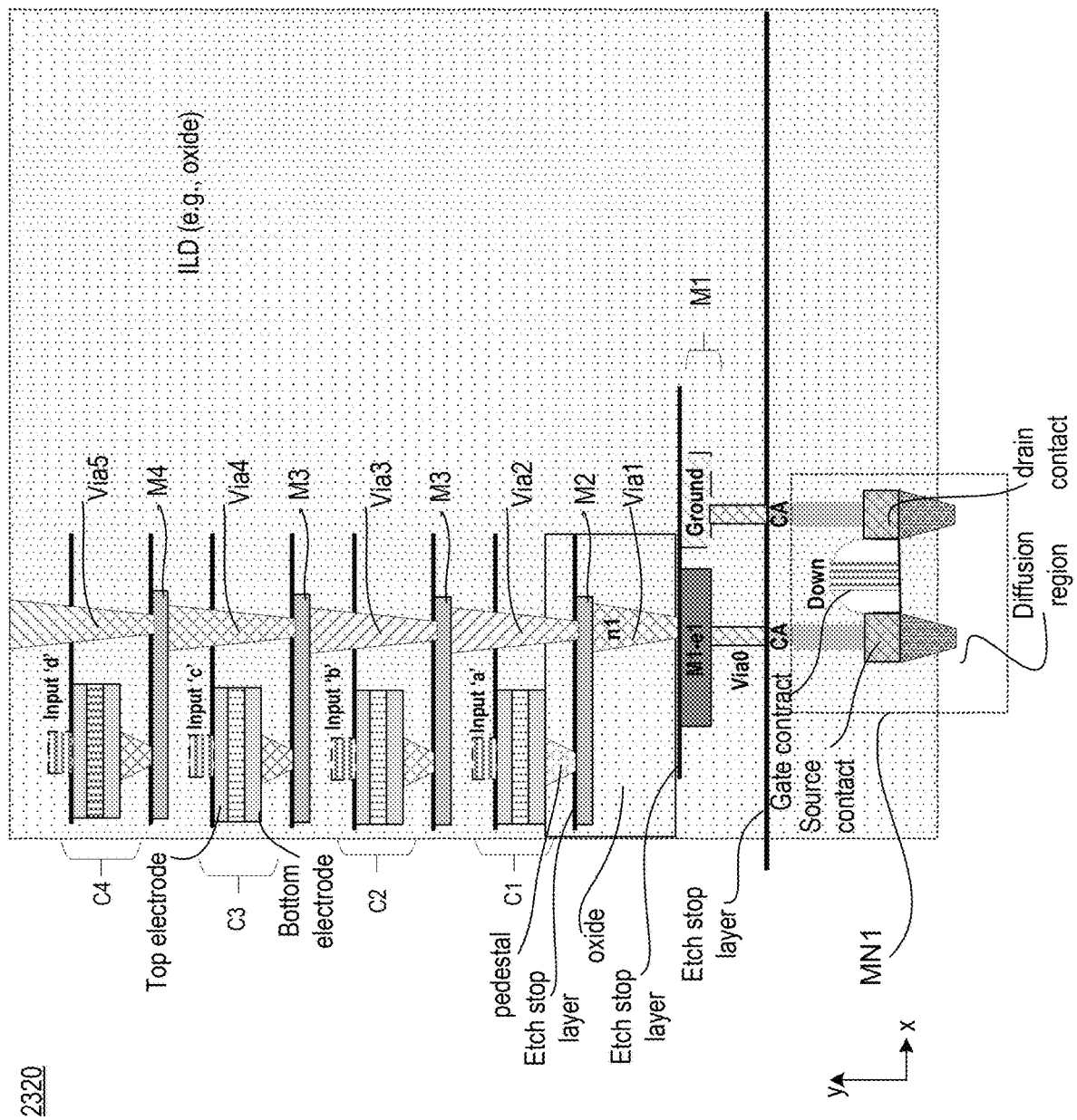
FIG. 23B illustrates a multi-input capacitive circuit with stacked planar capacitor structure, wherein the multi-input capacitive circuit includes a pull-down device, in accordance with some embodiments.

FIG. 23B illustrates multi-input capacitive circuit 2320 with stacked planar capacitor structure, wherein the multi-input capacitive circuit includes a pull-down device, in accordance with some embodiments. Multi-input capacitive circuit 2320 is like multi-input capacitive circuit 2300, but with pull-down device MN1. Here, pull-up device MP1 is removed from the summing node.

Figure 24A:
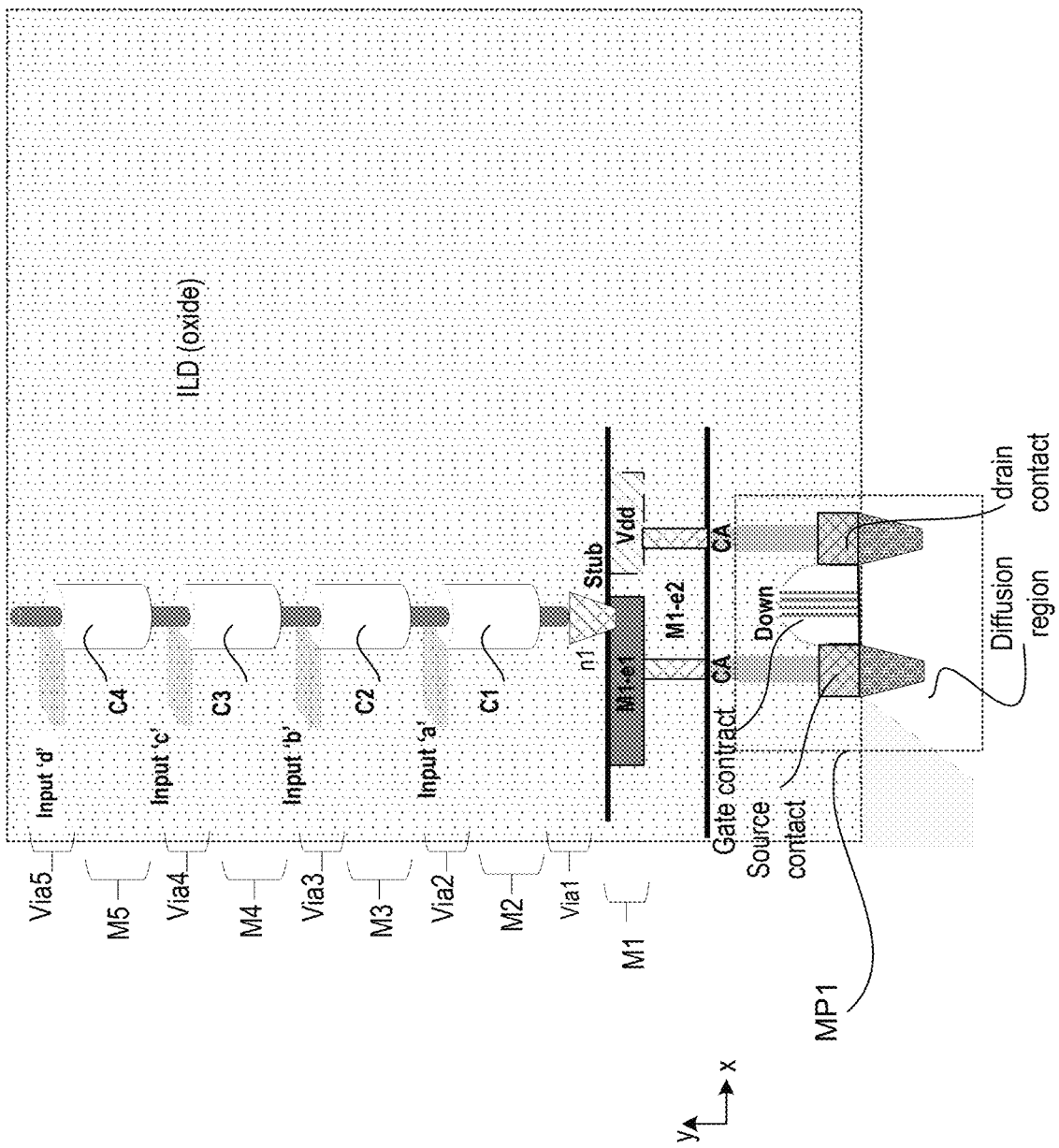
FIG. 24A illustrates a multi-input capacitive circuit with stacked non-planar capacitor structure, wherein the multi-input capacitive circuit includes a pull-up device, in accordance with some embodiments.

FIG. 24A illustrates multi-input capacitive circuit 2400 with stacked non-planar capacitor structure wherein the multi-input capacitive circuit includes a pull-up device, in accordance with some embodiments. In this example, four capacitors are stacked. In some embodiments, a column of shared metal passes through the center of the capacitors, where the shared metal is the summing node n1 which is coupled to the stub and then to the source or drain terminals of the pull-up (MP1) transistor. Top electrode of each of the capacitor is partially adjacent to a respective input electrode. For example, the top electrode of capacitor C1 is coupled to input electrode 'a', the top electrode of capacitor C2 is coupled to input electrode 'b', the top electrode of capacitor C3 is coupled to input electrode 'c', and the top electrode of capacitor C4 is coupled to input electrode 'd'. In this instance, the capacitors are formed between regions reserved for Via1 through Via5 (e.g., between M1 through M6 layers). The capacitors here can be capacitors with linear dielectric or capacitors with paraelectric dielectric.

Figure 24B:
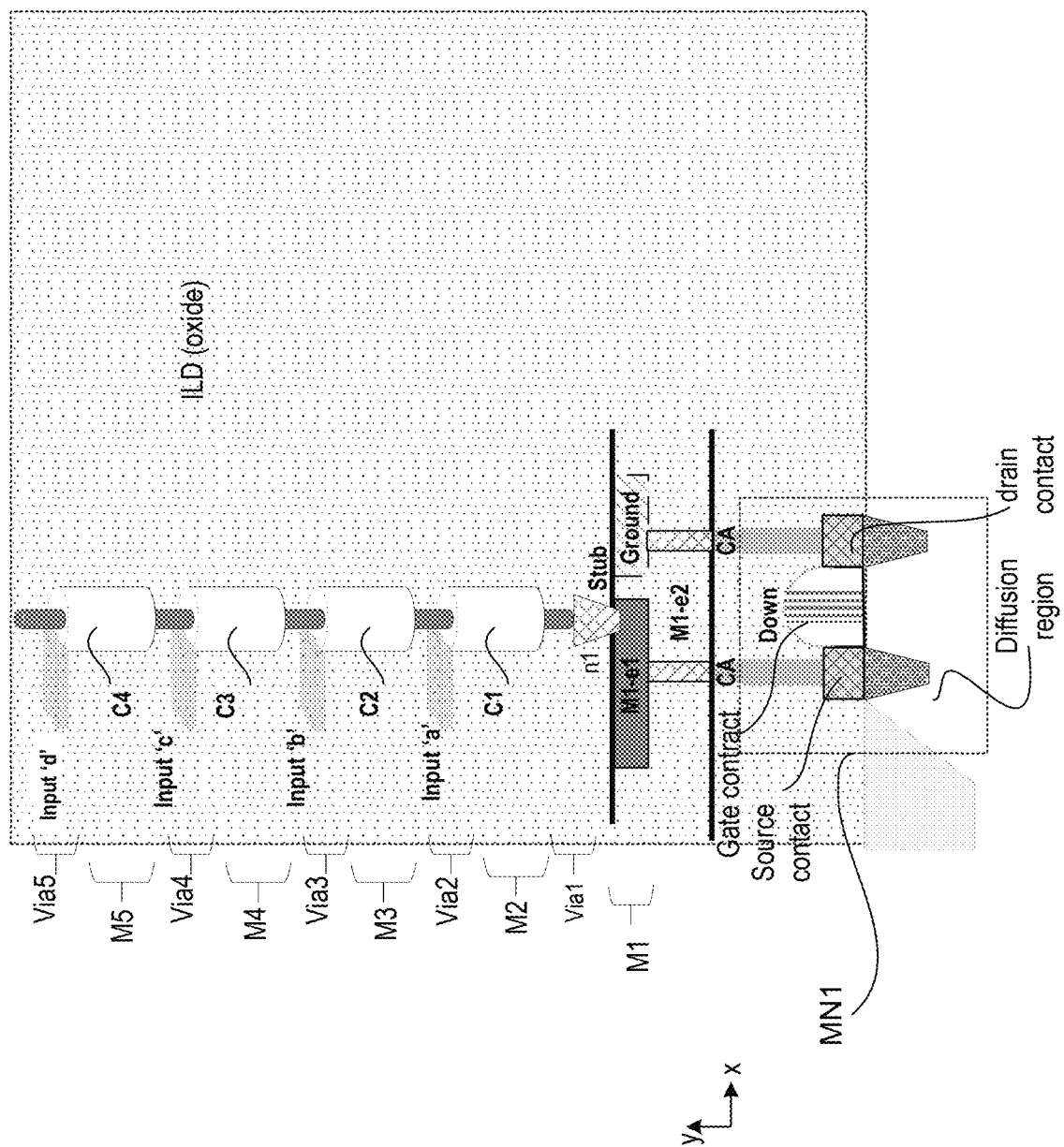
FIG. 24B illustrates a multi-input capacitive circuit with stacked non-planar capacitor structure, wherein the multi-input capacitive circuit includes a pull-up device, in accordance with some embodiments.

FIG. 24B illustrates multi-input capacitive circuit 2420 with stacked non-planar capacitor structure wherein the multi-input capacitive circuit includes a pull-down device, in accordance with some embodiments. Multi-input capacitive circuit 2420 is like multi-input capacitive circuit 2400, but with pull-down device MN1. Here, pull-up device MP1 is removed from the summing node. The capacitors here can comprise linear dielectric or paraelectric material.

Figures 25A, 25B:
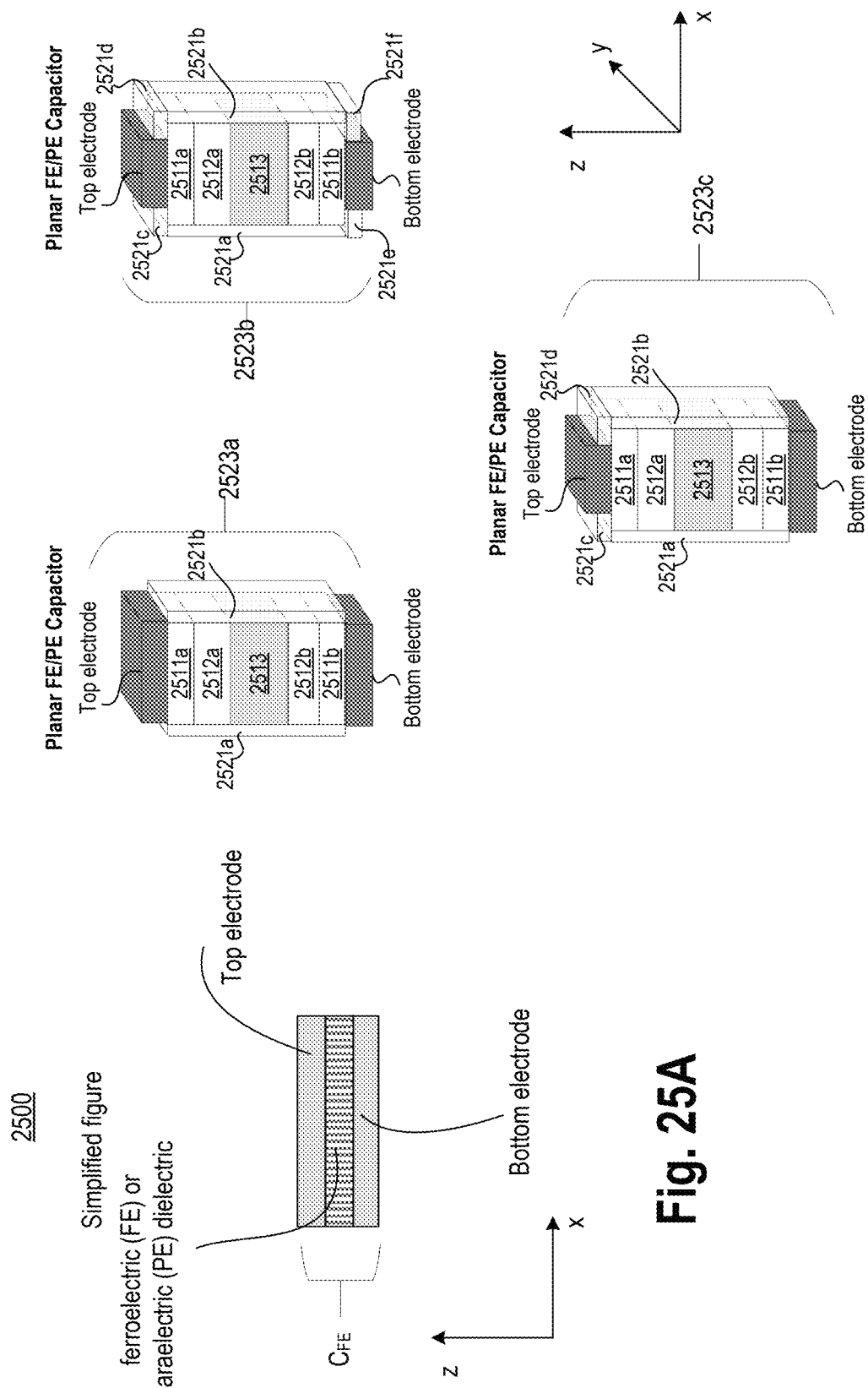
FIG. 25A illustrates a planar ferroelectric or paraelectric capacitor structure, in accordance with some embodiments.
FIG. 25B illustrates three planar ferroelectric or paraelectric capacitor structures, respectively, in accordance with some embodiments.

FIG. 25A illustrates planar ferroelectric or paraelectric capacitor structure 2500, in accordance with some embodiments. In some embodiments, capacitors for the multi-input capacitive structures are ferroelectric capacitors. These capacitors can take any planar form. One such simplified form is illustrated in FIG. 25A. Here, planar capacitor structure 2500 is a metal-insulator-metal (MIM) capacitor comprising a bottom electrode, a top electrode, and a ferroelectric dielectric between the top electrode and the bottom electrode as shown. In some embodiments, conductive oxide layer(s) are formed between the bottom electrode and the ferroelectric dielectric.

FIG. 25B illustrates three planar ferroelectric or paraelectric capacitor structures, respectively, in accordance with some embodiments. Here, any one of the three planar capacitor structures 2523a, 2523b, and 2523c is represented by the simplified planar capacitor structure 2500.

In some embodiments, planar capacitor 2523a incudes encapsulation portions 2521a and 2521b (also referred to as sidewall barrier seal) that are adjacent to the side walls of the plurality of layers of the planar capacitor. In some embodiments, planar capacitor 2523b incudes encapsulation portions 2521c and 2521d that are partially adjacent to sidewall barrier seal 2521a and 2521b, and refractive inter-metallic layers 2511a. In various embodiments, encapsulation portions 2521c and 2521d terminate into a via (not shown). The material for encapsulation portions 2521c and 2521d is same as those for sidewall barrier seal 2521a and 2521b. In some embodiments, the barrier material includes one or more of an oxide of: Ti, Al, or Mg.

In some embodiments, planar capacitor 2523c includes encapsulation portions 2521e and 2521f that are partially adjacent to sidewall barrier seal 2521a and 2521b, and refractive inter-metallic layers 2511b. In various embodiments, encapsulation portions 2521e and 2521f terminate into a via (not shown). The material for encapsulation portions 2521e and 2521f is same as those for sidewall barrier seal 2521a and 2521b. Material for 2512a and 2521b includes one or more of: Ti—Al—O, Al2O3, MgO, or nitride. Material for 2512a and 2521b is a sidewall barrier (e.g., insulative material) that protects the stack of layers from hydrogen and/or oxygen diffusion. In various embodiments, the sidewall barrier material is not an interlayer dielectric (ILD) material. In some embodiments, the lateral thickness (along x-axis) of the sidewall barrier seal 2521a/b (insulating material) is in a range of 0.1 nm to 20 nm. In some embodiments, sidewall barriers are in direct contact with ILD.

In some embodiments, planar capacitors 2523a, 2523b, and 2523c comprise a number of layers stacked together to form a planar capacitor. These layers may extend in an x-plane when the capacitor is a planar capacitor. In some embodiments, the stack of layers includes refractive inter-metallic 2511a/b as a barrier material; conductive oxides 2512a/b, and FE material 2513. FE material 2513 can be any of the FE materials discussed herein. In some embodiments, refractive inter-metallic 2511a/b are removed, and electrodes are in direct contact with conductive oxides 2512a/b.

In some embodiments, refractive inter-metallic 2511a/b maintains the FE properties of the FE capacitor. In the absence of refractive inter-metallic 2511a/b, the ferroelectric material 2513 of the capacitor may lose its potency. In some embodiments, refractive inter-metallic 2511a/b comprises Ti and Al (e.g., TiAl compound). In some embodiments, refractive inter-metallic 2511a/b comprises one or more of Ta, W, and/or Co. For example, refractive inter-metallic 2511a/b includes a lattice of Ta, W, and Co.

In some embodiments, refractive inter-metallic 2511a/b is part of a barrier layer which is a super lattice of a first material and a second material, wherein the first material includes Ti and Al (e.g., TiAl) and the second material includes Ta, W, and Co (e.g., layers of Ta, W, and Co together). In various embodiments, the lattice parameters of the barrier layer are matched with the lattice parameters of the conductive oxides and/or FE material 2513.

In some embodiments, refractive inter-metallic 2511a/b includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti-(45-48)Al-(1-10)M (at. X trace amount %), with M being at least one element from: V, Cr, Mn, Nb, Ta, W, and Mo, and with trace amounts of 0.1% to 5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta), or combined properties. Additions such as Si, B, and Mg can markedly enhance other properties. In some embodiments, barrier layer 2511a is coupled to a top electrode. In some embodiments, sidewall barrier seal 2521a/b (insulating material) is placed around layers 2511a, 2512a, 2513, 2512b, and 2511b along while the top and bottom surfaces of 2511a and 2511b are exposed for coupling to metal layers, vias, or a metallic pedestal.

In some embodiments, conductive oxide layer(s) are formed between the top electrode and the ferroelectric dielectric. Examples of conductive oxides include: $IrO_2$, $RuO_2$, $PdO_2$, $OsO_2$, or $ReO_3$. In some examples, conductive oxides are of the form A2O3 (e.g., In2O3, Fe2O3) and ABO3 type, where 'A' is a rare earth element and B is Mn.

Any suitable conductive material may be used for the top electrode and the bottom electrode. For example, the material or the electrode may include one or more of: Cu, Al, Ag, Au, W, or Co. In some embodiments, the thickness along the z-axis of the top electrode and bottom electrode is in a range of 1 nm to 30 nm. In some embodiments, the thickness along the z-axis of the dielectric is in a range of 1 nm to 30 nm. In some embodiments, the thickness along the z-axis of the conductive oxide is in a range of 1 nm to 30 nm.

Figure 26A:
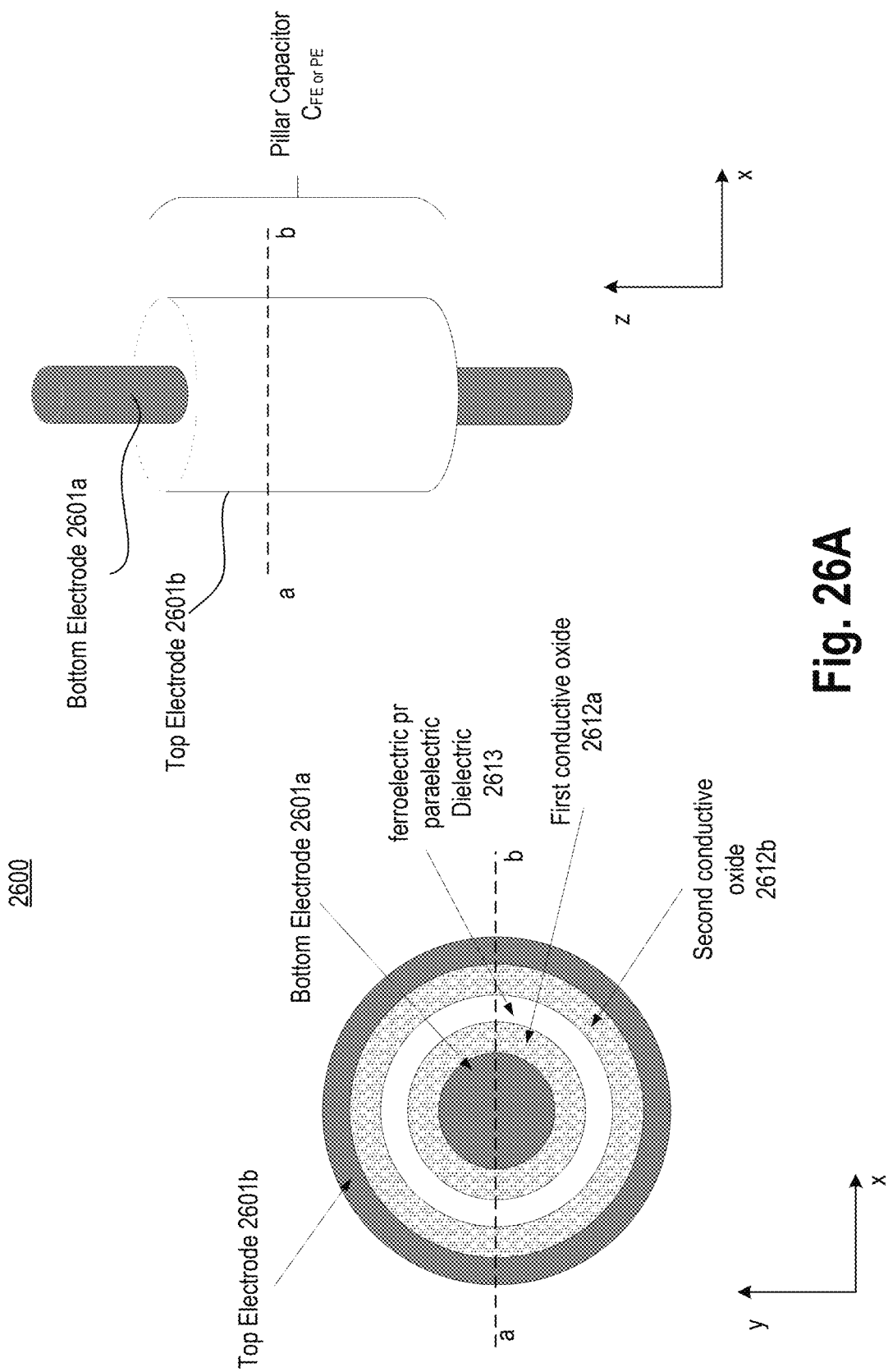
FIG. 26A illustrates a non-planar ferroelectric or paraelectric capacitor structure, in accordance with some embodiments.

FIG. 26A illustrates non-planar ferroelectric or paraelectric capacitor structure 2600, in accordance with some embodiments. In some embodiments, non-planar capacitor structure 2600 is rectangular in shape. Taking the cylindrical shaped case for example, in some embodiments, the layers of non-planar capacitor structure 2600 from the center going outwards include bottom electrode 2601a, first conductive oxide 2612a, ferroelectric dielectric material 2613, second conductive oxide 2612b, and top electrode 2601b. A cross-sectional view along the "ab" dashed line is illustrated in the middle of FIG. 26A. In some embodiments, conducting oxides are removed and the ferroelectric dielectric is directly connected to top electrode 2601b and bottom electrodes 2601a. In some embodiments, ferroelectric dielectric material 2613 can include any suitable dielectric, where the thickness of dielectric film is a range of 1 nm to 20 nm. In some embodiments, ferroelectric dielectric material 2613 include any one of the materials discussed herein for ferro-electrics.

In some embodiments, first conductive oxide 2612a is conformally deposited over bottom electrode 2601a. In some embodiments, dielectric material 2613 is conformally deposited over first conductive oxide 2612a. In some embodiments, second conductive oxide 2612b is conformally deposited over dielectric material 2613. In some embodiments, top electrode 2601b is conformally deposited over second conductive oxide 2612b. In some embodiments, bottom electrode 2601a is in the center while top electrode 2601b is on an outer circumference of non-planar capacitor structure 2600.

In some embodiments, material for bottom electrode 2601a may include one or more of: Cu, Al, Ag, Au, W, or Co, or their alloys. In some embodiments, material for first conductive oxide 2612a include: $IrO_2$, $RuO_2$, $PdO_2$, $OsO_2$, or ReO$_3$. In some examples, conductive oxides are of the form A2O3 (e.g., In2O3, Fe2O3) and ABO3 type, where 'A' is a rare earth element and B is Mn. In some embodiments, material for second conductive oxide 2612b may be same as the material for first conductive oxide 2612a. In some embodiments, material for top electrode 2601b may include one or more of: Cu, Al, Ag, Au, W, or Co, or their alloys.

In some embodiments, a first refractive inter-metallic layer (not shown) is formed between dielectric material 2613 and first conductive oxide 2612a. In some embodiments, a second refractive inter-metallic layer (not shown) is formed between dielectric capacitor material 2613 and second conductive oxide 2612b. In these cases, the first and second refractive inter-metallic layers are directly adjacent to their respective conductive oxide layers and to dielectric capacitor material 2613. In some embodiments, refractive inter-metallic maintains the capacitive properties of the dielectric capacitor material 2613. In some embodiments, refractive inter-metallic comprises Ti and Al (e.g., TiAl compound). In some embodiments, refractive inter-metallic comprises one or more of Ta, W, and/or Co.

For example, refractive inter-metallic includes a lattice of Ta, W, and Co. In some embodiments, refractive inter-metallic includes one of: Ti—Al such as Ti3Al, TiAl, TiAl3; Ni—Al such as Ni3Al, NiAl3, NiAl; Ni—Ti, Ni—Ga, Ni2MnGa; FeGa, Fe3Ga; borides, carbides, or nitrides. In some embodiments, TiAl material comprises Ti—(45-48) Al—(1-10)M (at. X trace amount %), with M being at least one element from: V, Cr, Mn, Nb, Ta, W, and Mo, and with trace amounts of 0.1% to 5% of Si, B, and/or Mg. In some embodiments, TiAl is a single-phase alloy γ(TiAl). In some embodiments, TiAl is a two-phase alloy γ(TiAl)+α2(Ti3Al). Single-phase γ alloys contain third alloying elements such as Nb or Ta that promote strengthening and additionally enhance oxidation resistance. The role of the third alloying elements in the two-phase alloys is to raise ductility (V, Cr, Mn), oxidation resistance (Nb, Ta) or combined properties. Additions such as Si, B and Mg can markedly enhance other properties. The thicknesses of the layers of capacitor 2600 in the x-axis are in the range of 1 nm to 30 nm. In some embodiment, refractive inter-metallic layers are not used for non-planar capacitor structure 2600.

Figure 26B:
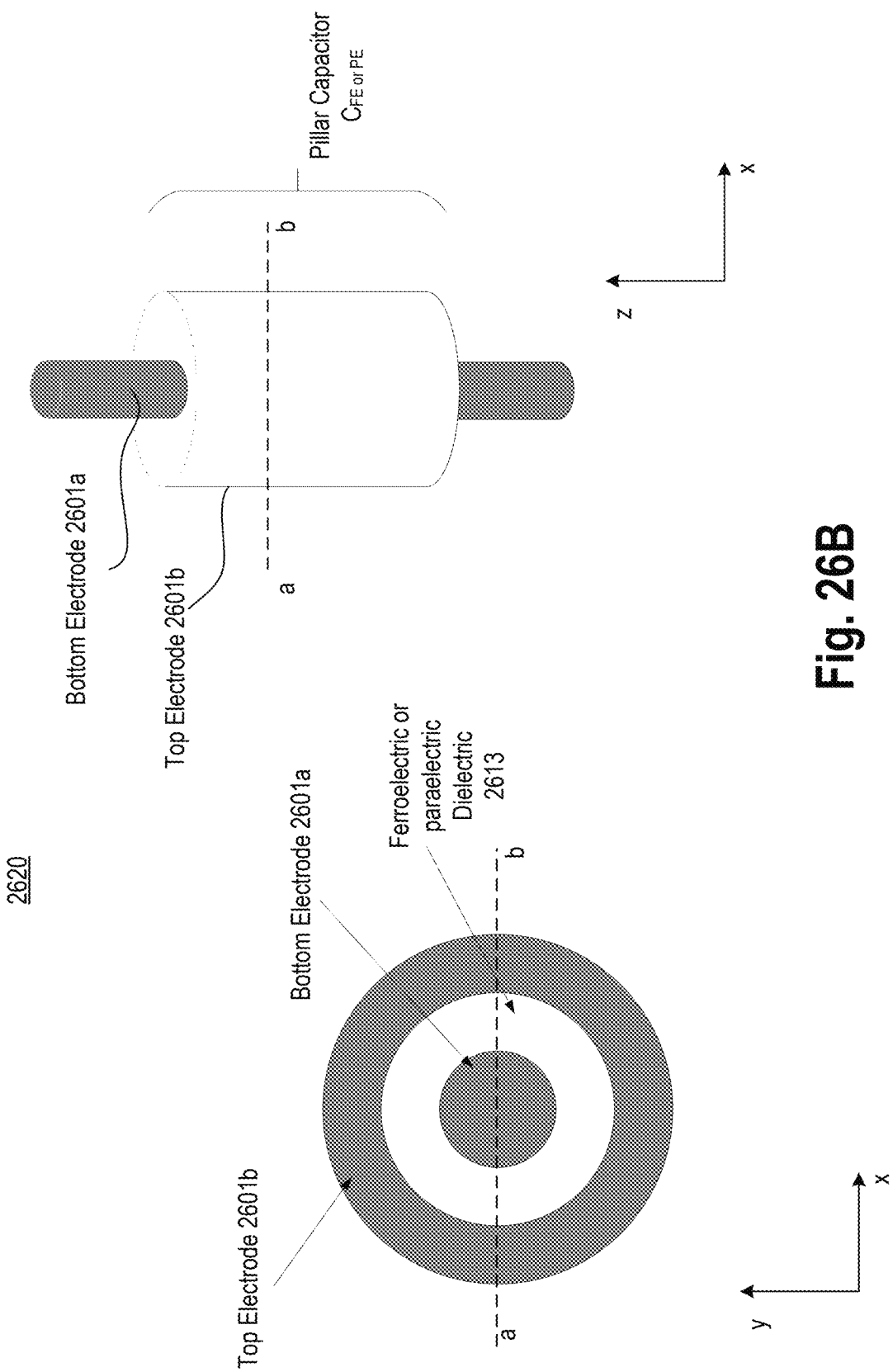
FIG. 26B illustrates a non-planar ferroelectric or paraelectric capacitor structure without conductive oxides, in accordance with some embodiments.

FIG. 26B illustrates non-planar ferroelectric or paraelectric capacitor structure 2620 without conductive oxides, in accordance with some embodiments. Compared to non-planar capacitor structure 2600, here first conductive oxide 2612a and second conductive oxide 2612b are removed and ferroelectric material 2613 is adjacent to top electrode 2601b and bottom electrode 2601a as shown.

Figure 27:
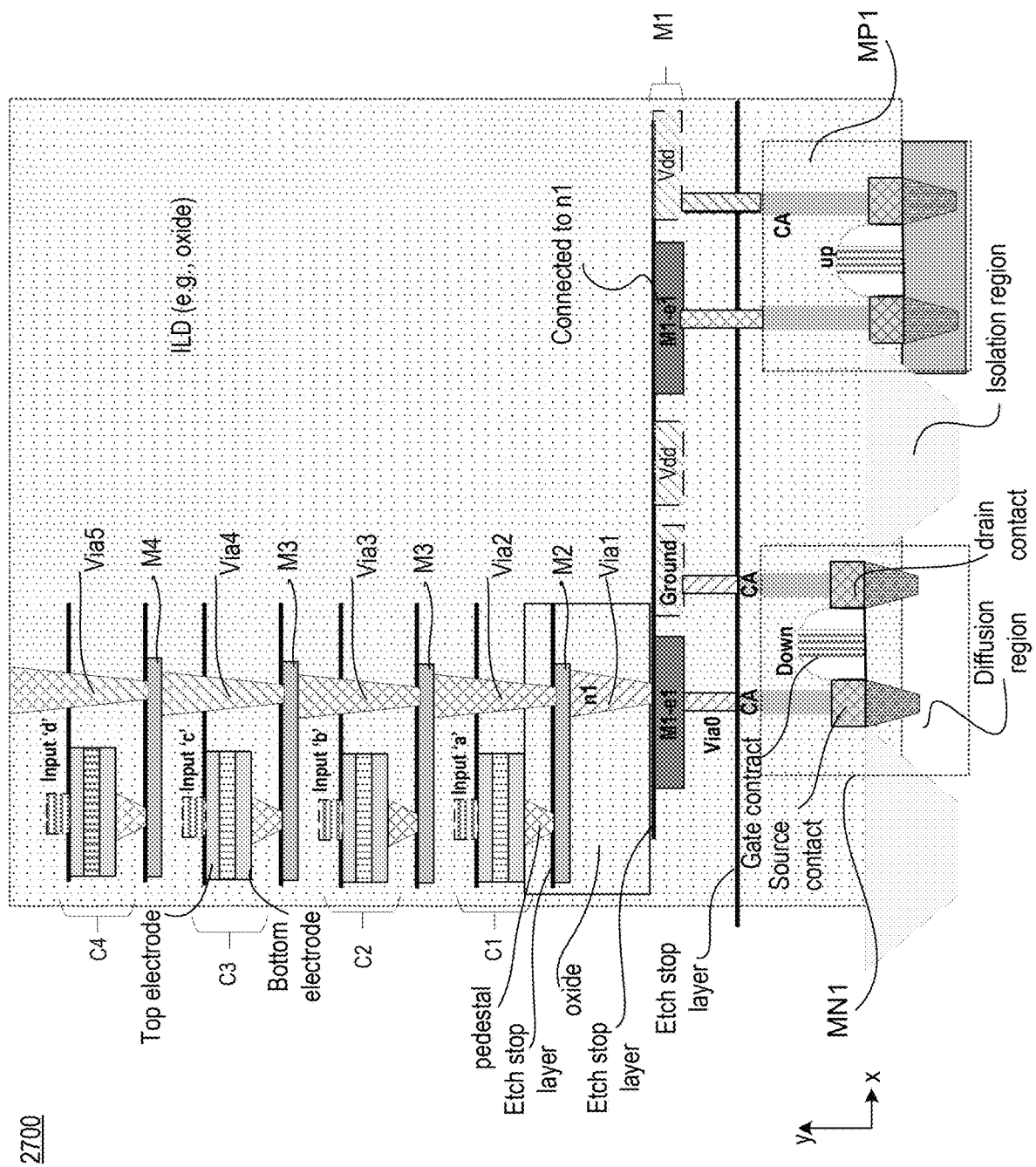
FIG. 27 illustrates a multi-input capacitive circuit with stacked planar ferroelectric or paraelectric capacitor structure, wherein the multi-input capacitive circuit includes a pull-up device and a pull-down device, in accordance with some embodiments.

FIG. 27 illustrates multi-input capacitive circuit 2700 with stacked planar ferroelectric or paraelectric capacitor structures, wherein the multi-input capacitive circuit includes a pull-up device and a pull-down device, in accordance with some embodiments. In this example, two transistors are shown, each controlled by its respective Up or Down controls on its gate terminal. The source and drain terminals of each transistor is coupled to respective contacts (CA). Etch stop layer is used in the fabrication of vias (via0) to connect the source or drain of the transistors to summing node n1 on metal-1 (M1) layer. Another etch stop layer is formed over M1 layer to fabricate vias (via1) to couple to respective M1 layers. In some embodiments, metal-2 (M2) is deposited over vias (via1). M2 layer is then polished. In some embodiments, the ferroelectric capacitor can be moved further up in the stack, where the capacitor level processing is done between different layers.

In some embodiments, oxide is deposited over the etch stop layer. Thereafter, dry, or wet etching is performed to form holes for pedestals. The holes are filled with metal and land on the respective M2 layers. Fabrication processes such as interlayer dielectric (ILD) oxide deposition followed by ILD etch (to form holes for the pedestals), deposition of metal into the holes, and subsequent polishing of the surface are used to prepare for post pedestal fabrication.

A number of fabrication processes of deposition, lithography, and etching takes place to form the stack of layers for the planar capacitor. In some embodiments, the ferroelectric dielectric capacitors are formed in a backend of the die. In some embodiments, deposition of ILD is followed by surface polish. In some embodiments, a metal layer is formed over top electrode of each capacitor to connect to a respective input. For example, metal layer over the top electrode of capacitor C1 is connected to input 'a'. Metal layer over the top electrode of capacitor C2 is connected to input 'b'. Metal layer over the top electrode of capacitor C3 is connected to input 'c'. Metal layer over the top electrode of capacitor C4 is connected to input 'd'. The metal layers coupled to the bottom electrodes of capacitors C1, C2, C3, and C4 are coupled to summing node n1 through respective vias.

In this case, after polishing the surface, ILD is deposited, in accordance with some embodiments. Thereafter, holes are etched through the ILD to expose the top electrodes of the capacitors, in accordance with some embodiments. The holes are then filled with metal, in accordance with some embodiments. Followed by filling the holes, the top surface is polished, in accordance with some embodiments. As such, the capacitors are connected to input electrode (e.g., input 'a', input 'b', input 'c', and input 'd') and summing node n1 (through the pedestals), in accordance with some embodiments.

In some embodiments, ILD is deposited over the polished surface. Holes for via are then etched to contact the M2 layer, in accordance with some embodiments. The holes are filled with metal to form vias (via2), in accordance with some embodiments. The top surface is then polished, in accordance with some embodiments. In some embodiments, process of depositing metal over the vias (via2), depositing ILD, etching holes to form pedestals for the next capacitors of the stack, forming the capacitors, and then forming vias that contact the M3 layer are repeated. This process is repeated 'n' times for forming 'n' capacitors in a stack for 'n' number of inputs, in accordance with some embodiments.

In some embodiments, the bottom electrode of each capacitor is allowed to directly contact with the metal below. For example, the pedestals that connect to the top and bottom electrodes are removed. In this embodiment, the height of the stacked capacitors is lowered, and the fabrication process is simplified because the extra steps for forming the pedestals are removed.

In some embodiments, pedestals or vias are formed for both the top and bottom electrodes of the planar capacitors. In this embodiment, the height of the stacked capacitors is raised, and the fabrication process adds an additional step of forming a top pedestal or via which contacts with respective input electrodes (e.g., input 'a', input 'b', input 'c', and input 'd').

Figure 28:
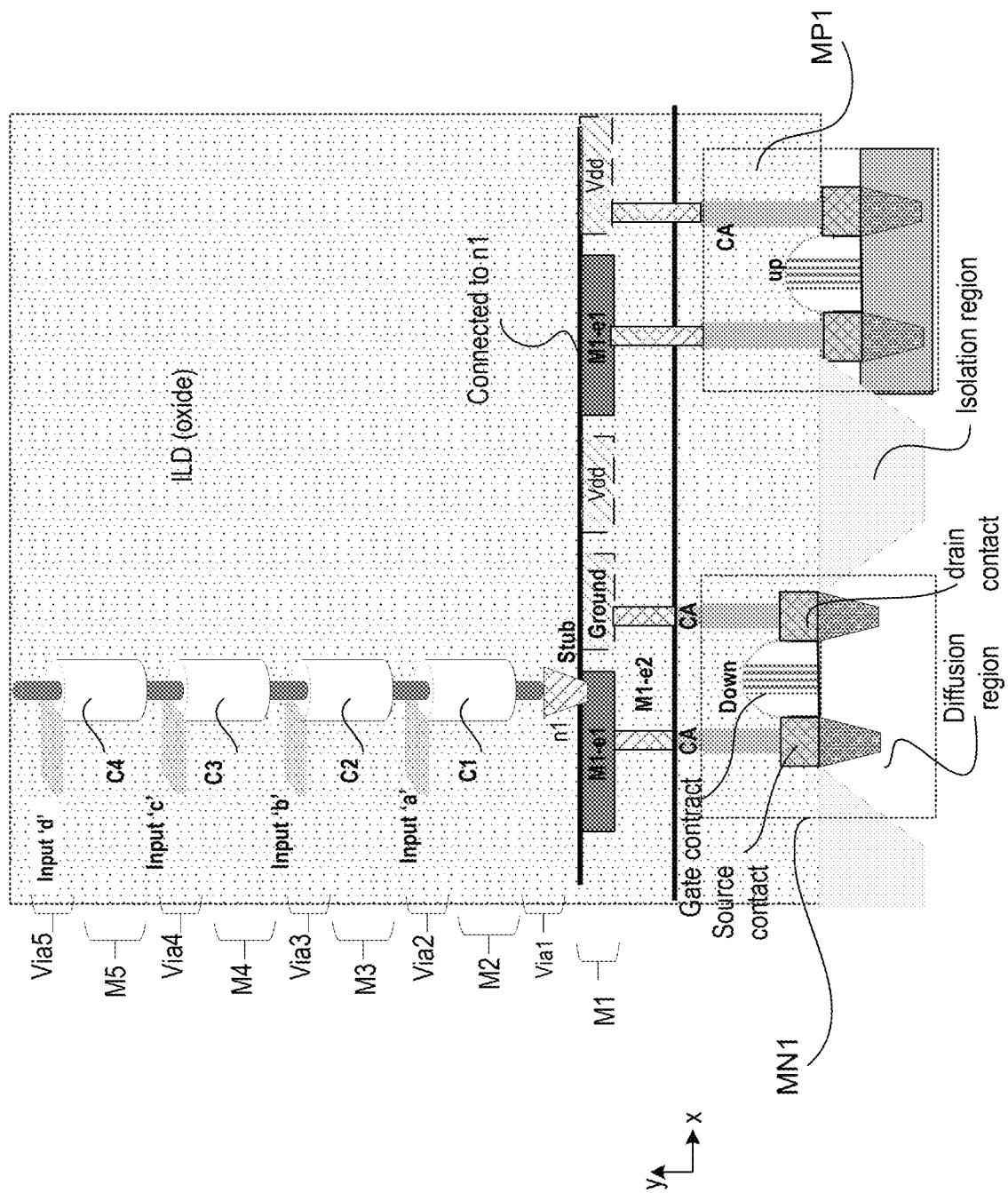
FIG. 28 illustrates a multi-input capacitive circuit with stacked non-planar ferroelectric or paraelectric capacitor structure wherein the multi-input capacitive circuit includes a pull-up device and a pull-down device, in accordance with some embodiments.

FIG. 28 illustrates multi-input capacitive circuit 2800 with stacked non-planar ferroelectric or paraelectric capacitor structure (e.g., structures of FIG. 26A or FIG. 26B), wherein the multi-input capacitive circuit includes a pull-down device and a pull-up device, in accordance with some embodiments. In this example four capacitors are stacked. In some embodiments, a column of shared metal passes through the center of the capacitors, where the shared metal is the summing node n1 which is coupled to the stub and then to the source or drain terminals of the pull-up (MP1) and pull-down (MN1) transistors. Top electrode of each of the capacitor is partially adjacent to a respective input electrode. For example, the top electrode of capacitor C1 is coupled to input electrode 'a', the top electrode of capacitor C2 is coupled to input electrode 'b', the top electrode of capacitor C3 is coupled to input electrode 'c', and the top electrode of capacitor C4 is coupled to input electrode 'd'. In this instance, the capacitors are formed between regions reserved for Vial through Via5 (e.g., between M1 through M6 layers).

Figure 29:
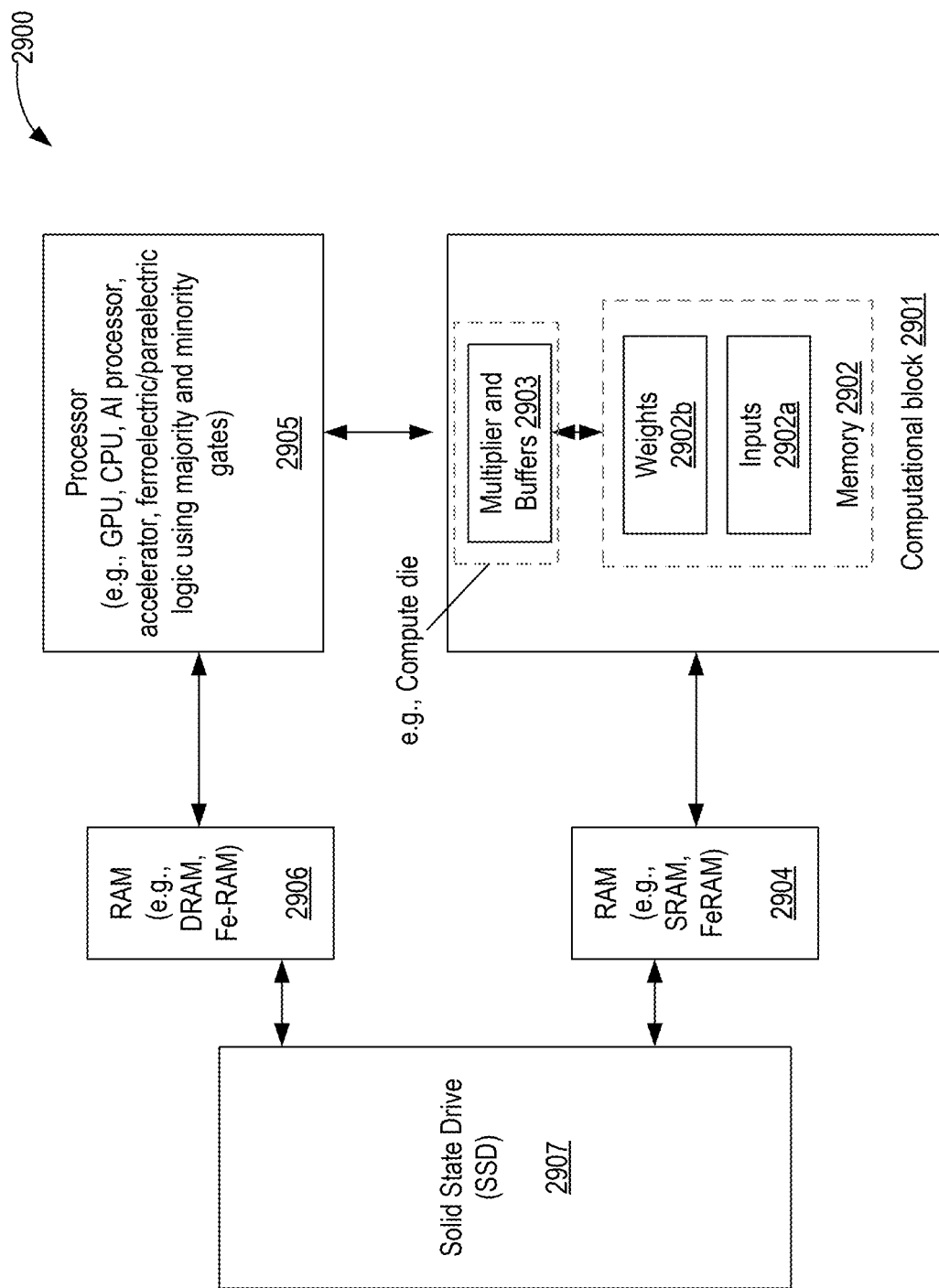
FIG. 29 illustrates a high-level architecture of an artificial intelligence (AI) machine comprising a compute die stacked with a memory die, wherein the compute die includes an asynchronous full-adder and/or an asynchronous half-adder, in accordance with some embodiments.

FIG. 29 illustrates a high-level architecture of an artificial intelligence (AI) machine 2900 comprising a compute die stacked with a memory die, wherein the compute die includes an asynchronous full-adder and/or an asynchronous half-adder, in accordance with some embodiments.

AI machine 2900 comprises computational block 2901 or processor having random-access memory (RAM) 2902 and multiplier and buffers 2903, first random-access memory 2904 (e.g., static RAM (SRAM), and ferroelectric or paraelectric RAM (FeRAM), ferroelectric or paraelectric static random-access memory (FeSRAM), main processor 2905, second random-access memory 2906 (dynamic RAM (DRAM), FeRAM), and solid-state memory or drive (SSD) 2907. In some embodiments, some or all components of AI machine 2900 are packaged in a single package forming a system-on-chip (SoC). The SoC can be configured as a logic-on-logic configuration, which can be in a 3D configuration or a 2.5D configuration.

In some embodiments, computational block 2901 is packaged in a single package and then coupled to processor 2905 and memories 2904, 2906, and 2907 on a printed circuit board (PCB). In some embodiments, computational block 2901 is configured as a logic-on-logic configuration, which can be in a 3D configuration or a 2.5D configuration. In some embodiments, computational block 2901 comprises a special purpose compute die 2903 or microprocessor. For example, compute die 2903 is a compute chiplet that performs a function of an accelerator or inference. In some embodiments, memory 2902 is DRAM which forms a special memory/cache for the special purpose compute die 2903. The DRAM can be embedded DRAM (eDRAM) such as 1T1C (one transistor and one capacitor) based memories. In some embodiments, RAM 2902 is ferroelectric or paraelectric RAM (Fe-RAM).

In some embodiments, compute die 2903 is specialized for applications such as Artificial Intelligence, graph processing, and algorithms for data processing. In some embodiments, compute die 2903 further has logic computational blocks, for example, for multipliers and buffers, a special data memory block (e.g., buffers) comprising DRAM, FeRAM, or a combination of them. In some embodiments, RAM 2902 has weights and inputs stored to improve the computational efficiency. The interconnects between processor 2905 (also referred to as special purpose processor), first RAM 2904, and compute die 2903 are optimized for high bandwidth and low latency. The architecture of FIG. 29 allows efficient packaging to lower the energy, power, or cost and provides for ultra-high bandwidth between RAM 2904 and compute chiplet 2903 of computational block 2901.

In some embodiments, RAM 2902 is partitioned to store input data (or data to be processed) 2902a and weight factors 2902b. In some embodiments, input data 2902a is stored in a separate memory (e.g., a separate memory die) and weight factors 2902b are stored in a separate memory (e.g., separate memory die).

In some embodiments, computational logic or compute chiplet 2903 comprises matrix multiplier, adder, concatenation logic, buffers, and combinational logic. In various embodiments, compute chiplet 2903 performs multiplication operation on inputs 2902a and weights 2902b. In some embodiments, weights 2902b are fixed weights. For example, processor 2905 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 2902. In various embodiments, the input data that is to be analyzed using a trained model is processed by computational block 2901 with computed weights 2902b to generate an output (e.g., a classification result).

In some embodiments, first RAM 2904 is ferroelectric or paraelectric based SRAM. For example, a six transistor (6T) SRAM bit-cells having ferroelectric or paraelectric transistors are used to implement a non-volatile FeSRAM. In some embodiments, SSD 2907 comprises NAND flash cells. In some embodiments, SSD 2907 comprises NOR flash cells. In some embodiments, SSD 2907 comprises multi-threshold NAND flash cells.

In various embodiments, the non-volatility of FeRAM is used to introduce new features such as security, functional safety, and faster reboot time of AI machine 2900. The non-volatile FeRAM is a low power RAM that provides fast access to data and weights. FeRAM 2904 can also serve as a fast storage for computational block 2901 (which can be an inference die or an accelerator), which typically has low capacity and fast access requirements.

In various embodiments, FeRAM (FeDRAM or FeSRAM) includes ferroelectric or paraelectric material. The ferroelectric or paraelectric material may be in a transistor gate stack or in a capacitor of the memory. The ferroelectric material can be any suitable low voltage FE material discussed with reference to various embodiments. While embodiments here are described with reference to ferroelectric material, the embodiments are applicable to any of the nonlinear polar materials described herein.

Figure 30:
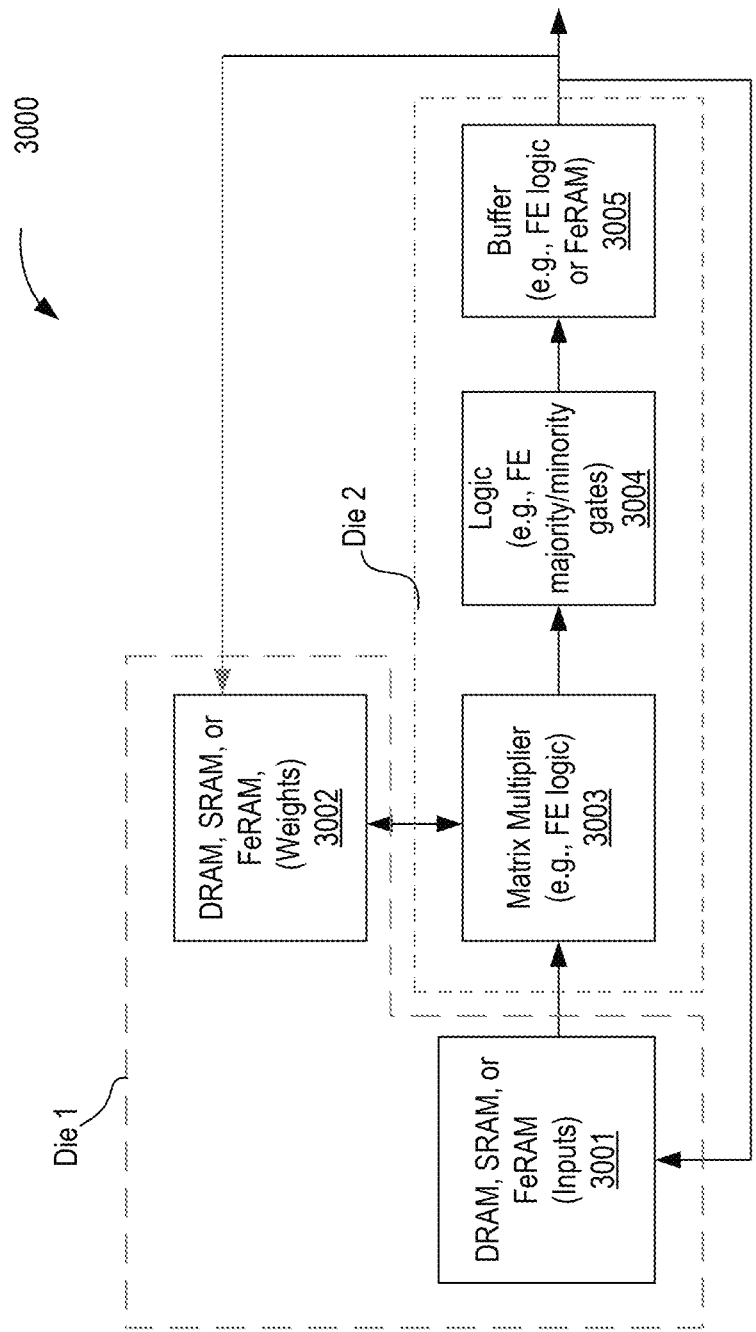
FIG. 30 illustrates an architecture of a computational block comprising a compute die stacked with a memory die, wherein the compute die includes an asynchronous full-adder and/or an asynchronous half-adder, in accordance with some embodiments.

FIG. 30 illustrates an architecture of a computational block 3000 comprising a compute die stacked with a memory die, wherein the compute die includes an asynchronous full-adder and/or an asynchronous half-adder, in accordance with some embodiments. The architecture of FIG. 30 illustrates an architecture for a special purpose compute die where RAM memory buffers for inputs and weights are split on die-1 and logic and optional memory buffers are split on die-2.

In some embodiments, memory die (e.g., Die 1) is positioned below a compute die (e.g., Die 2) such that a heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 3001 to store input data and a second die 3002 to store weight factors. In some embodiments, the memory die is a single die that is partitioned such that first partition 3001 of the memory die is used to store input data and second partition 3002 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 3001 and 3002, or memory dies 3001 and 3002 include one or more of: DRAM, FE-SRAM, FE-DRAM, SRAM, and/or MRAM. In some embodiments, the input data stored in memory partition or die 3001 is the data to be analyzed by a trained model with fixed weights stored in memory partition or die 3002.

In some embodiments, the compute die comprises ferroelectric or paraelectric logic (e.g., majority, minority, and/or threshold gates) to implement matrix multiplier 3003, logic 3004, and temporary buffer 3005. Matrix multiplier 3003 performs multiplication operation on input data 'X' and weights 'W' to generate an output 'Y'. This output may be further processed by logic 3004. In some embodiments, logic 3004 performs a threshold operation, pooling and drop out operations, and/or concatenation operations to complete the AI logic primitive functions.

In some embodiments, the output of logic 3004 (e.g., processed output 'Y') is temporarily stored in buffer 3005. In some embodiments, buffer 3005 is memory such as one or more of: DRAM, Fe-SRAM, Fe-DRAM, MRAM, resistive RAM (Re-RAM) and/or SRAM. In some embodiments, buffer 3005 is part of the memory die (e.g., Die 1). In some embodiments, buffer 3005 performs the function of a re-timer. In some embodiments, the output of buffer 3005 (e.g., processed output 'Y') is used to modify the weights in memory partition or die 3002. In one such embodiment, computational block 3000 not only operates as an inference circuitry, but also as a training circuitry to train a model. In some embodiments, matrix multiplier 3003 includes an array of multiplier cells, wherein the DRAMs 3001 and 3002 include arrays of memory bit-cells, respectively, wherein each multiplier cell is coupled to a corresponding memory bit-cell of DRAM 3001 and/or DRAM 3002. In some embodiments, computational block 3000 comprises an interconnect fabric coupled to the array of multiplier cells such that each multiplier cell is coupled to the interconnect fabric.

Architecture 3000 provides reduced memory access for the compute die (e.g., die 2) by providing data locality for weights, inputs, and outputs. In one example, data from and to the AI computational blocks (e.g., matrix multiplier 3003) is locally processed within a same packaging unit. Architecture 3000 also segregates the memory and logic operations onto a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 31:
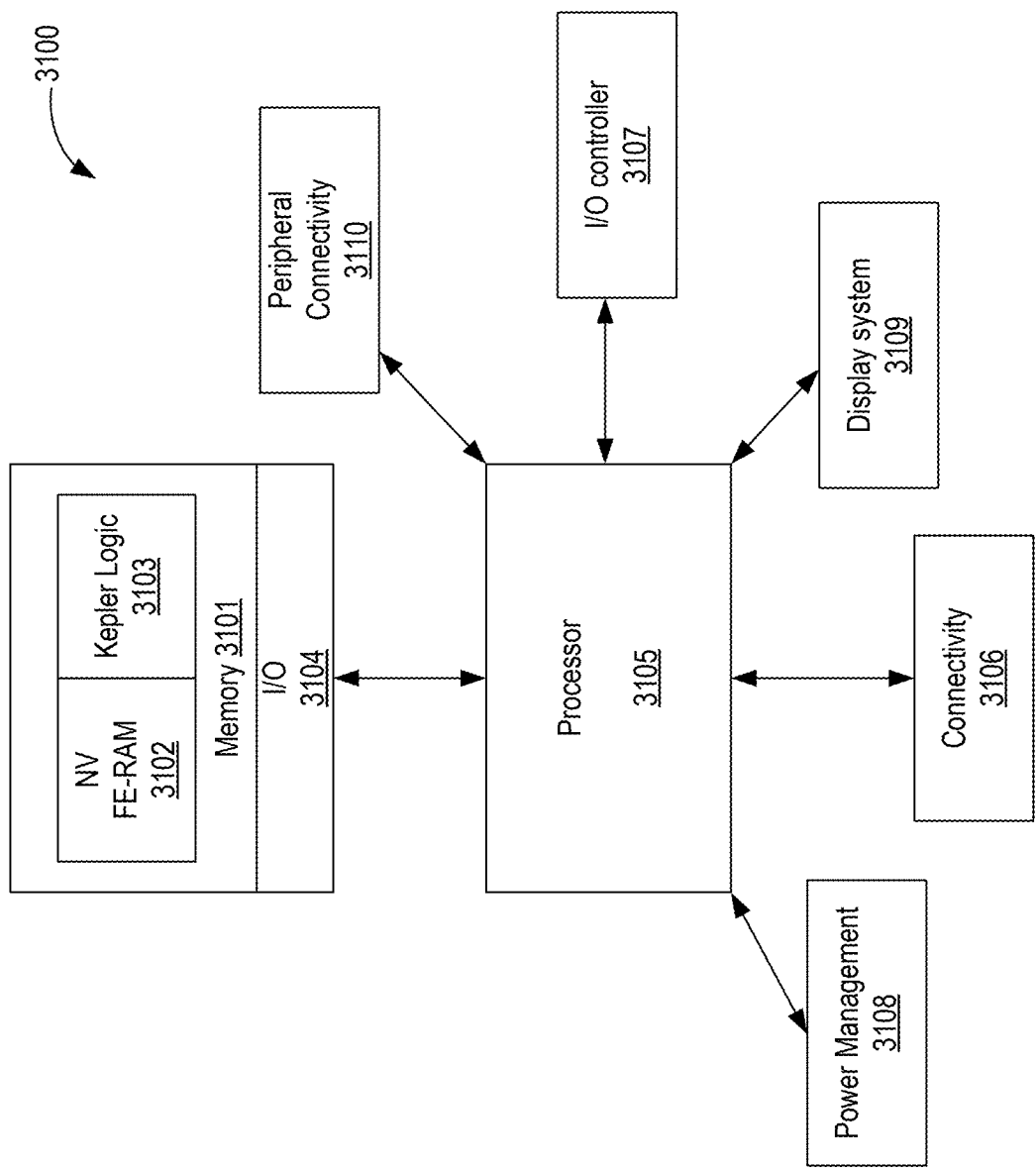
FIG. 31 illustrates a system-on-chip (SOC) that uses an asynchronous full-adder and/or an asynchronous half-adder, in accordance with some embodiments.

FIG. 31 illustrates a system-on-chip (SOC) 3100 that uses an asynchronous full-adder and/or an asynchronous half-adder, in accordance with some embodiments. SoC 3100 comprises memory 3101 having static random-access memory (SRAM) or FE based random-access memory FE-RAM, or any other suitable memory. The memory can be non-volatile (NV) or volatile memory. Memory 3101 may also comprise logic 3103 to control memory 3102. For example, write and read drivers are part of logic 3103. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 3104. The interface may be a double-data rate (DDR) compliant interface or any other suitable interface to communicate with a processor. Processor 3105 of SoC 3100 can be a single core or multiple core processor. Processor 3105 can be a general-purpose processor (CPU), a digital signal processor (DSP), or an Application Specific Integrated Circuit (ASIC) processor. In some embodiments, processor 3105 is an artificial intelligence (AI) processor (e.g., a dedicated AI processor, a graphics processor configured as an AI processor). In various embodiments, processor 3105 executes instructions that are stored in memory 3101.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 3105 may be coupled to a number of other chiplets that can be on the same die as SoC 3100 or on separate dies. These chiplets include connectivity circuitry 3106, I/O controller 3107, power management 3108, and display system 3109, and peripheral connectivity 3106.

Connectivity 3106 represents hardware devices and software components for communicating with other devices. Connectivity 3106 may support various connectivity circuitries and standards. For example, connectivity 3106 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 3106 may support non-cellular standards such as WiFi.

I/O controller 3107 represents hardware devices and software components related to interaction with a user. I/O controller 3107 is operable to manage hardware that is part of an audio subsystem and/or display subsystem. For example, input through a microphone or other audio device can provide input or commands for one or more applications or functions of SoC 3100. In some embodiments, I/O controller 3107 illustrates a connection point for additional devices that connect to SoC 3100 through which a user might interact with the system. For example, devices that can be attached to the SoC 3100 might include microphone devices, speaker or stereo systems, video systems or other display devices, keyboard or keypad devices, or other I/O devices for use with specific applications such as card readers or other devices.

Power management 3108 represents hardware or software that performs power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 3108 may accordingly put such logic into low power state without the worry of losing data. Power management may select a power state according to Advanced Configuration and Power Interface (ACPI) specification for one or all components of SoC 3100.

Display system 3109 represents hardware (e.g., display devices) and software (e.g., drivers) components that provide a visual and/or tactile display for a user to interact with the processor 3105. In some embodiments, display system 3109 includes a touch screen (or touch pad) device that provides both output and input to a user. Display system 3109 may include a display interface, which includes the particular screen or hardware device used to provide a display to a user. In some embodiments, the display interface includes logic separate from processor 3105 to perform at least some processing related to the display.

Peripheral connectivity 3110 may represent hardware devices and/or software devices for connecting to peripheral devices such as printers, chargers, cameras, etc. In some embodiments, peripheral connectivity 3110 may support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 3100 includes a coherent cache or memory-side buffer chiplet (not shown) which include ferroelectric or paraelectric memory. The coherent cache or memory-side buffer chiplet can be coupled to processor 3105 and/or memory 3101 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e., scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, a source, or a drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method of forming those structures, and method of operation of these structures.

Following examples are provided that illustrate the various embodiments. The examples can be combined with other examples. As such, various embodiments can be combined with other embodiments without changing the scope of the invention.

Example 1: An apparatus comprising: a plurality of asynchronous full-adders including: a first asynchronous full-adder; and a second asynchronous full-adder, wherein the first asynchronous full-adder comprises a first set of majority and/or minority gates, wherein the second asynchronous full-adder comprises a second set of majority and/or minority gates, wherein two carry outputs of the first asynchronous full-adder are received by two carry inputs of the second asynchronous full-adder, and wherein the first asynchronous full-adder receives an acknowledgement signal from the second asynchronous full-adder, wherein the acknowledgement signal is associated with the two carry outputs.

Example 2: The apparatus of example 1, wherein an individual asynchronous full-adder from the plurality of asynchronous full-adders receives individual sets of inputs.

Example 3: The apparatus of example 1, wherein the first asynchronous full-adder comprises: a first data channel comprising two first inputs and a first acknowledgement output; a second data channel comprising two second inputs and a second acknowledgement output; a third data channel comprising two carry inputs and a third acknowledgement output; a fourth data channel comprising the two carry outputs and a third acknowledgement input, wherein the third acknowledgement input provides the acknowledgement signal; and a fifth data channel comprising two sum outputs and a fourth acknowledgement input.

Example 4: The apparatus of example 3, wherein the first asynchronous full-adder comprises: a full-adder coupled to the first data channel, the second data channel, the third data channel, the fourth data channel, and the fifth data channel, wherein the full-adder comprises majority and/or minority gates some of which receive the two first inputs, the two second inputs, the two carry inputs, the third acknowledgement input, and the fourth acknowledgement input, and generate controls to control gates of transistors, wherein the transistors are coupled to generate the two carry outputs, the two sum outputs, the first acknowledgement output, the second acknowledgement output, and the third acknowledgement output.

Example 5: The apparatus of example 4, wherein the full-adder comprises: a first circuitry to generate a sum false output of the two sum outputs; a second circuitry to generate a sum true output of the two sum outputs; a third circuitry to generate a carry false output of the two carry outputs; a fourth circuitry to generate a carry true output of the two carry outputs; and a fifth circuitry to generate the first acknowledgment output, the second acknowledgement output, and the third acknowledgement output.

Example 6: The apparatus of example 5, wherein the first circuitry comprises: a p-type transistor coupled to a supply rail; a first n-type transistor coupled in series with the p-type transistor; and a 3-input minority gate having an output coupled to gate terminals of the p-type transistor and the first n-type transistor.

Example 7: The apparatus of example 6, wherein the 3-input minority gate includes: a first input to receive the fourth acknowledgement input; a second input to receive an enable signal; and a third input coupled to the output of the 3-input minority gate.

Example 8: The apparatus of example 6, wherein the first circuitry comprises: a second n-type transistor coupled in series with the first n-type transistor, and to a ground supply rail; and a first 5-input minority gate having an output that couples to a gate terminal of the second n-type transistor.

Example 9: The apparatus of example 8, wherein the first 5-input minority gate includes: a first input to receive a first false carry input of the two carry inputs; a second input to receive a first false input of the two first inputs; a third input to receive a first false input of the two second inputs; a fourth input coupled to the ground supply rail; and a fifth input coupled to the ground supply rail.

Example 10: The apparatus of example 6, wherein the first circuitry comprises: a third n-type transistor coupled in series with the first n-type transistor, and to a ground supply rail; and a second 5-input minority gate having an output that couples to a gate terminal of the third n-type transistor.

Example 11: The apparatus of example 10, wherein the second 5-input minority gate includes: a first input to receive a first false carry input of the two carry inputs; a second input to receive a first true input of the two first inputs; a third input to receive a first true input of the two second inputs; a fourth input coupled to the ground supply rail; and a fifth input coupled to the ground supply rail.

Example 12: The apparatus of example 6, wherein the first circuitry comprises: a fourth n-type transistor coupled in series with the first n-type transistor, and to a ground supply rail; and a third 5-input minority gate having an output that couples to a gate terminal of the fourth n-type transistor.

Example 13: The apparatus of example 12, wherein the third 5-input minority gate includes: a first input to receive a first true carry input of the two carry inputs; a second input to receive a first false input of the two first inputs; a third input to receive a first true input of the two second inputs; a fourth input coupled to the ground supply rail; and a fifth input coupled to the ground supply rail.

Example 14: The apparatus of example 6, wherein the first circuitry comprises: a fifth n-type transistor coupled in series with the first n-type transistor, and to a ground supply rail; and a fourth 5-input minority gate having an output that couples to a gate terminal of the fifth n-type transistor.

Example 15: The apparatus of example 14, wherein the fourth 5-input minority gate includes: a first input to receive a first true carry input of the two carry inputs; a second input to receive a first true input of the two first inputs; a third input to receive a first false input of the two second inputs; a fourth input coupled to the ground supply rail; and a fifth input coupled to the ground supply rail.

Example 16: The apparatus of example 6, wherein the first circuitry comprises an inverter coupled to the p-type transistor and the first n-type transistor, wherein an output of the inverter is the sum false output.

Example 17: The apparatus of example 1, wherein first set of majority and/or minority gates and the second set of majority and/or minority gates are implemented as CMOS gates, MESO gates, or quantum cellular automata.

Example 18: The apparatus of example 1, wherein the first set of majority and/or minority gates and the second set of majority and/or minority gates are implemented capacitive-input circuits.

Example 19: An apparatus comprising: a first asynchronous full-adder; and a second asynchronous full-adder, wherein the second asynchronous full-adder receives a pair of carry outputs from the first asynchronous full-adder, and wherein the first asynchronous full-adder receives an acknowledgement from the second asynchronous full-adder, wherein the first asynchronous full-adder comprises a first set of majority and/or minority gates, wherein the second asynchronous full-adder comprises a second set of majority and/or minority gates.

Example 20: A system comprising: a processor circuitry to execute one or more instructions; a memory to store the one or more instructions; and a communication interface to allow the processor circuitry to communicate with another device, wherein the processor circuitry includes an asynchronous carry-ripple full-adder which comprises: a first asynchronous full-adder; and a second asynchronous full-adder, wherein the second asynchronous full-adder receives a pair of carry outputs from the first asynchronous full-adder, and wherein the first asynchronous full-adder receives an acknowledgement from the second asynchronous full-adder, wherein the first asynchronous full-adder comprises a first set of majority and/or minority gates, wherein the second asynchronous full-adder comprises a second set of majority and/or minority gates.

Example 1a: An apparatus comprising: a first data channel comprising two first inputs and a first acknowledgement output; a second data channel comprising two second inputs and a second acknowledgement output; a third data channel comprising two carry inputs and a third acknowledgement output; a fourth data channel comprising two carry outputs and a third acknowledgement input; a fifth data channel comprising two sum outputs and a fourth acknowledgement input; and a full-adder coupled to the first data channel, the second data channel, the third data channel, the fourth data channel, and the fifth data channel, wherein the full-adder comprises majority and/or minority gates some of which receive the two first inputs, the two second inputs, the two carry inputs, the third acknowledgement input, and the fourth acknowledgement input, and generate controls to control gates of transistors, wherein the transistors are coupled to generate the two carry outputs, the two sum outputs, the first acknowledgement output, the second acknowledgement output, and the third acknowledgement output, wherein the full-adder comprises a circuitry to generate a sum false output of the two sum outputs.

Example 2a: The apparatus of example 1a, wherein the circuitry comprises: a p-type transistor coupled to a supply rail; a first n-type transistor coupled in series with the p-type transistor; and a 3-input minority gate having an output coupled to gate terminals of the p-type transistor and the first n-type transistor.

Example 3a: The apparatus of example 2a, wherein the 3-input minority gate includes: a first input to receive the fourth acknowledgement input; a second input to receive an enable signal; and a third input coupled to the output of the 3-input minority gate.

Example 4a: The apparatus of example 2a, wherein the circuitry comprises: a second n-type transistor coupled in series with the first n-type transistor, and to a ground supply rail; and a first 5-input minority gate having an output that couples to a gate terminal of the second n-type transistor.

Example 5a: The apparatus of example 4a, wherein the first 5-input minority gate includes: a first input to receive a first false carry input of the two carry inputs; a second input to receive a first false input of the two first inputs; a third input to receive a first false input of the two second inputs; a fourth input coupled to the ground supply rail; and a fifth input coupled to the ground supply rail.

Example 6a: The apparatus of example 2a, wherein the circuitry comprises: a third n-type transistor coupled in series with the first n-type transistor, and to a ground supply rail; and a second 5-input minority gate having an output that couples to a gate terminal of the third n-type transistor.

Example 7a: The apparatus of example 6, wherein the second 5-input minority gate includes: a first input to receive a first false carry input of the two carry inputs; a second input to receive a first true input of the two first inputs; a third input to receive a first true input of the two second inputs; a fourth input coupled to the ground supply rail; and a fifth input coupled to the ground supply rail.

Example 8a: The apparatus of example 2a, wherein the circuitry comprises: a fourth n-type transistor coupled in series with the first n-type transistor, and to a ground supply rail; and a third 5-input minority gate having an output that couples to a gate terminal of the fourth n-type transistor.

Example 9a: The apparatus of example 8a, wherein the third 5-input minority gate includes: a first input to receive a first true carry input of the two carry inputs; a second input to receive a first false input of the two first inputs; a third input to receive a first true input of the two second inputs; a fourth input coupled to the ground supply rail; and a fifth input coupled to the ground supply rail.

Example 10a: The apparatus of example 2a, wherein the circuitry comprises: a fifth n-type transistor coupled in series with the first n-type transistor, and to a ground supply rail; and a fourth 5-input minority gate having an output that couples to a gate terminal of the fifth n-type transistor.

Example 1a: The apparatus of example 10a, wherein the fourth 5-input minority gate includes: a first input to receive a first true carry input of the two carry inputs; a second input to receive a first true input of the two first inputs; a third input to receive a first false input of the two second inputs; a fourth input coupled to the ground supply rail; and a fifth input coupled to the ground supply rail.

Example 12a: The apparatus of example 1a, wherein the majority and/or minority gates are implemented as CMOS gates, MESO gates, or quantum cellular automata.

Example 13a: The apparatus of example 1a, wherein the majority and/or minority gates are implemented capacitive-input circuits.

Example 14a: The apparatus of example 2a, wherein the circuitry comprises an inverter coupled to the p-type transistor and the first n-type transistor, wherein an output of the inverter is the sum false output.

Example 15a: An apparatus comprising: a first circuitry comprising a minority gate that receives a sum acknowledgement input and an enable, and generates an output to control a p-type transistor and a first n-type transistor coupled in series, wherein the first circuitry includes an inverter coupled to the p-type transistor and the first n-type transistor, wherein an output of the inverter is a sum false output; and a second circuitry comprising a plurality of second n-type transistors coupled in parallel, wherein the plurality of second n-type transistors is coupled to the first n-type transistor in series.

Example 16a: The apparatus of example 15a, wherein an individual n-type transistor of the plurality of second n-type transistors is controlled by a majority gate according to a carry-in true input or a carry-in false input, a first true input or a first false input, and a second true input or a second false input, and a ground input.

Example 17a: The apparatus of example 16a, wherein the minority gate and the majority gate are implemented as CMOS gates, MESO gates, or quantum cellular automata, or wherein the minority gate and the majority gate are implemented capacitive-input circuits.

Example 18a: A system comprising: a processor circuitry to execute one or more instructions; a memory to store the one or more instructions; and a communication interface to allow the processor circuitry to communicate with another device, wherein the processor circuitry includes a full-adder which comprises: a first circuitry comprising a minority gate that receives a sum acknowledgement input and an enable, and generates an output to control a p-type transistor and a first n-type transistor coupled in series, wherein the first circuitry includes an inverter coupled to the p-type transistor and the first n-type transistor, wherein an output of the inverter is a sum true output; and a second circuitry comprising a plurality of second n-type transistors coupled in parallel, wherein the plurality of second n-type transistors is coupled to the first n-type transistor in series.

Example 19a: The system of example 18a, wherein an individual n-type transistor of the plurality of second n-type transistors is controlled by a majority gate according to a carry-in true input or a carry-in false input, a first true input or a first false input, and a second true input or a second false input, and a ground input.

Example 20a: The system of example 19a, wherein the minority gate and the majority gate are implemented as CMOS gates, MESO gates, or quantum cellular automata, or wherein the minority gate and the majority gate are implemented capacitive-input circuits.

Example 1b: An apparatus comprising: a first data channel comprising two first inputs and a first acknowledgement output; a second data channel comprising two second inputs and a second acknowledgement output; a third data channel comprising two carry inputs and a third acknowledgement output; a fourth data channel comprising two carry outputs and a third acknowledgement input; a fifth data channel comprising two sum outputs and a fourth acknowledgement input; and a full-adder coupled to the first data channel, the second data channel, the third data channel, the fourth data channel, and the fifth data channel, wherein the full-adder comprises majority and/or minority gates some of which receive the two first inputs, the two second inputs, the two carry inputs, the third acknowledgement input, and the fourth acknowledgement input, and generate controls to control gates of transistors, wherein the transistors are coupled to generate the two carry outputs, the two sum outputs, the first acknowledgement output, the second acknowledgement output, and the third acknowledgement output, wherein the full-adder comprises a circuitry to generate a carry false output of the two carry outputs.

Example 2b: The apparatus of example 1b, wherein the circuitry comprises: a p-type transistor coupled to a supply rail; a first n-type transistor coupled in series with the p-type transistor; and a 3-input minority gate having an output coupled to gate terminals of the p-type transistor and the first n-type transistor.

Example 3b: The apparatus of example 2b, wherein the 3-input minority gate includes: a first input to receive the third acknowledgement input; a second input to receive an enable signal; and a third input coupled to the output of the 3-input minority gate.

Example 4b: The apparatus of example 2b, wherein the circuitry comprises: a second n-type transistor coupled in series with the first n-type transistor, and to a ground supply rail; and a first 5-input minority gate having an output that couples to a gate terminal of the second n-type transistor.

Example 5b: The apparatus of example 4b, wherein the first 5-input minority gate includes: a first input to receive a first false carry input of the two carry inputs; a second input to receive a first false input of the two first inputs; a third input to receive a first true input of the two second inputs; a fourth input coupled to the ground supply rail; and a fifth input coupled to the ground supply rail.

Example 6b: The apparatus of example 2b, wherein the circuitry comprises: a third n-type transistor coupled in series with the first n-type transistor, and to a ground supply rail; and a second 5-input minority gate having an output that couples to a gate terminal of the third n-type transistor.

Example 7b: The apparatus of example 6b, wherein the second 5-input minority gate includes: a first input to receive a first false carry input of the two carry inputs; a second input to receive a first true input of the two first inputs; a third input to receive a first false input of the two second inputs; a fourth input coupled to the ground supply rail; and a fifth input coupled to the ground supply rail.

Example 8b: The apparatus of example 2b, wherein the circuitry comprises: a fourth n-type transistor coupled in series with the first n-type transistor, and to a ground supply rail; and a second 3-input minority gate having an output that couples to a gate terminal of the fourth n-type transistor.

Example 9b: The apparatus of example 8b, wherein the second 3-input minority gate includes: a first input to receive a first false input of the two first inputs; a second input to receive a first false input of the two second inputs; and a third input coupled to the ground supply rail.

Example 10b: The apparatus of example 1b, wherein the majority and/or minority gates are implemented as CMOS gates, MESO gates, or quantum cellular automata.

Example 11b: The apparatus of example 1b, wherein the majority and/or minority gates are implemented capacitive-input circuits.

Example 12b: The apparatus of example 2b, wherein the circuitry comprises an inverter coupled to the p-type transistor and the first n-type transistor, wherein an output of the inverter is the carry false output.

Example 13b: An apparatus comprising: a first circuitry comprising a minority gate that receives a carryout acknowledgement input and an enable, and generates an output to control a p-type transistor and a first n-type transistor coupled in series, wherein the first circuitry includes an inverter coupled to the p-type transistor and the first n-type transistor, wherein an output of the inverter is a carry false output; and a second circuitry comprising a plurality of second n-type transistors coupled in parallel, wherein the plurality of second n-type transistors is coupled to the first n-type transistor in series.

Example 14b: The apparatus of example 13b, wherein at least two individual n-type transistors of the plurality of second n-type transistors are controlled by a majority gate according to a carry-in false input, a first true input or a first false input, and a second true input or a second false input, and a ground input.

Example 15b: The apparatus of example 13b, wherein one individual n-type transistor of the plurality of second n-type transistors is controlled by a majority gate according to a first false input, a second false input, and a ground input.

Example 16b: The apparatus of example 14b, wherein the minority gate and the majority gate are implemented as CMOS gates, MESO gates, or quantum cellular automata, or wherein the minority gate and the majority gate are implemented capacitive-input circuits.

Example 17b: A system comprising: a processor circuitry to execute one or more instructions; a memory to store the one or more instructions; and a communication interface to allow the processor circuitry to communicate with another device, wherein the processor circuitry includes a full-adder which comprises: a first circuitry comprising a minority gate that receives a carryout acknowledgement input and an enable, and generates an output to control a p-type transistor and a first n-type transistor coupled in series, wherein the first circuitry includes an inverter coupled to the p-type transistor and the first n-type transistor, wherein an output of the inverter is a carry false output; and a second circuitry comprising a plurality of second n-type transistors coupled in parallel, wherein the plurality of second n-type transistors is coupled to the first n-type transistor in series.

Example 18b: The system of example 17b, wherein at least two individual n-type transistors of the plurality of second n-type transistors are controlled by a majority gate according to a carry-in false input, a first true input or a first false input, and a second true input or a second false input, and a ground input.

Example 19b: The system of example 17b, wherein one individual n-type transistor of the plurality of second n-type transistors is controlled by a majority gate according to a first false input, a second false input, and a ground input.

Example 20b: The system of example 18b, wherein the minority gate and the majority gate are implemented as CMOS gates, MESO gates, or quantum cellular automata, or wherein the minority gate and the majority gate are implemented capacitive-input circuits.

Example 1c: An apparatus comprising: a first data channel comprising two first inputs and a first acknowledgement output; a second data channel comprising two second inputs and a second acknowledgement output; a third data channel comprising two carry inputs and a third acknowledgement output; a fourth data channel comprising two carry outputs and a third acknowledgement input; a fifth data channel comprising two sum outputs and a fourth acknowledgement input; and a full-adder coupled to the first data channel, the second data channel, the third data channel, the fourth data channel, and the fifth data channel, wherein the full-adder comprises majority and/or minority gates some of which receive the two first inputs, the two second inputs, the two carry inputs, the third acknowledgement input, and the fourth acknowledgement input, and generate controls to control gates of transistors, wherein the transistors are coupled to generate the two carry outputs, the two sum outputs, the first acknowledgement output, the second acknowledgement output, and the third acknowledgement output, wherein the full-adder comprises a circuitry to generate a carry true output of the two carry outputs.

Example 2c: The apparatus of example 1c, wherein the circuitry comprises: a p-type transistor coupled to a supply rail; a first n-type transistor coupled in series with the p-type transistor; and a 3-input minority gate having an output coupled to gate terminals of the p-type transistor and the first n-type transistor.

Example 3c: The apparatus of example 2c, wherein the 3-input minority gate includes: a first input to receive the third acknowledgement input; a second input to receive an enable signal; and a third input coupled to the output of the 3-input minority gate.

Example 4c: The apparatus of example 2c, wherein the circuitry comprises: a second n-type transistor coupled in series with the first n-type transistor, and to a ground supply rail; and a first 5-input minority gate having an output that couples to a gate terminal of the second n-type transistor.

Example 5c: The apparatus of example 4c, wherein the first 5-input minority gate includes: a first input to receive a first true carry input of the two carry inputs; a second input to receive a first false input of the two first inputs; a third input to receive a first true input of the two second inputs; a fourth input coupled to the ground supply rail; and a fifth input coupled to the ground supply rail.

Example 6c: The apparatus of example 2c, wherein the circuitry comprises: a third n-type transistor coupled in series with the first n-type transistor, and to a ground supply rail; and a second 5-input minority gate having an output that couples to a gate terminal of the third n-type transistor.

Example 7c: The apparatus of example 6c, wherein the second 5-input minority gate includes: a first input to receive a first true carry input of the two carry inputs; a second input to receive a first true input of the two first inputs; a third input to receive a first false input of the two second inputs; a fourth input coupled to the ground supply rail; and a fifth input coupled to the ground supply rail.

Example 8c: The apparatus of example 2c, wherein the circuitry comprises: a fourth n-type transistor coupled in series with the first n-type transistor, and to a ground supply rail; and a second 3-input minority gate having an output that couples to a gate terminal of the fourth n-type transistor.

Example 9c: The apparatus of example 8c, wherein the second 3-input minority gate includes: a first input to receive a first true input of the two first inputs; a second input to receive a first true input of the two second inputs; and a third input coupled to the ground supply rail.

Example 10c: The apparatus of example 1c, wherein the majority and/or minority gates are implemented as CMOS gates, MESO gates, or quantum cellular automata.

Example 11c: The apparatus of example 1c, wherein the majority and/or minority gates are implemented capacitive-input circuits.

Example 12c: The apparatus of example 2c, wherein the circuitry comprises an inverter coupled to the p-type transistor and the first n-type transistor, wherein an output of the inverter is the carry true output.

Example 13c: An apparatus comprising: a first circuitry comprising a minority gate that receives a carryout acknowledgement input and an enable, and generates an output to control a p-type transistor and a first n-type transistor coupled in series, wherein the first circuitry includes an inverter coupled to the p-type transistor and the first n-type transistor, wherein an output of the inverter is a carry true output; and a second circuitry comprising a plurality of second n-type transistors coupled in parallel, wherein the plurality of second n-type transistors is coupled to the first n-type transistor in series.

Example 14c: The apparatus of example 13c, wherein at least two individual n-type transistors of the plurality of second n-type transistors are controlled by a majority gate according to a carry-in true input, a first true input or a first false input, and a second true input or a second false input, and a ground input.

Example 15c: The apparatus of example 13c, wherein one individual n-type transistor of the plurality of second n-type transistors is controlled by a majority gate according to a first true input, a second true input, and a ground input.

Example 16c: The apparatus of example 14c, wherein the minority gate and the majority gate are implemented as CMOS gates, MESO gates, or quantum cellular automata, or wherein the minority gate and the majority gate are implemented capacitive-input circuits.

Example 17c: A system comprising: a processor circuitry to execute one or more instructions; a memory to store the one or more instructions; and a communication interface to allow the processor circuitry to communicate with another device, wherein the processor circuitry includes a full-adder which comprises: a first circuitry comprising a minority gate that receives a carryout acknowledgement input and an enable, and generates an output to control a p-type transistor and a first n-type transistor coupled in series, wherein the first circuitry includes an inverter coupled to the p-type transistor and the first n-type transistor, wherein an output of the inverter is a carry true output; and a second circuitry comprising a plurality of second n-type transistors coupled in parallel, wherein the plurality of second n-type transistors is coupled to the first n-type transistor in series.

Example 18c: The system of example 17c, wherein at least two individual n-type transistors of the plurality of second n-type transistors are controlled by a majority gate according to a carry-in true input, a first true input or a first false input, and a second true input or a second false input, and a ground input.

Example 19c: The system of example 17c, wherein one individual n-type transistor of the plurality of second n-type transistors is controlled by a majority gate according to a first true input, a second true input, and a ground input.

Example 20c: The system of example 18c, wherein the minority gate and the majority gate are implemented as CMOS gates, MESO gates, or quantum cellular automata, or wherein the minority gate and the majority gate are implemented capacitive-input circuits.

Example 1d: An apparatus comprising: a first data channel comprising two first inputs and a first acknowledgement output; a second data channel comprising two second inputs and a second acknowledgement output; a third data channel comprising two carry inputs and a third acknowledgement output; a fourth data channel comprising two carry outputs and a third acknowledgement input; a fifth data channel comprising two sum outputs and a fourth acknowledgement input; and a full-adder coupled to the first data channel, the second data channel, the third data channel, the fourth data channel, and the fifth data channel, wherein the full-adder comprises majority and/or minority gates some of which receive the two first inputs, the two second inputs, the two carry inputs, the third acknowledgement input, and the fourth acknowledgement input, and generate controls to control gates of transistors, wherein the transistors are coupled to generate the two carry outputs, the two sum outputs, the first acknowledgement output, the second acknowledgement output, and the third acknowledgement output, wherein the full-adder comprises a circuitry to generate the first acknowledgement output, the second acknowledgement output, and the third acknowledgement output.

Example 2d: The apparatus of example 1d, wherein the circuitry comprises: a first 3-input minority gate which includes: a first input to receive a first false input of the two first inputs; a second input to receive a first true input of the two first inputs; and a third input coupled to a supply rail.

Example 3d: The apparatus of example 2d, wherein the circuitry comprises: a second 3-input minority gate which includes: a first input to receive a first true input of the two second inputs; a second input to receive a first true input of the two second inputs; and a third input coupled to the supply rail.

Example 4d: The apparatus of example 3d, wherein the circuitry comprises: a third 3-input minority gate which includes: a first input to receive a first false carry input of the two carry inputs; a second input to receive a first false input of the two first inputs; and a third input coupled to the supply rail.

Example 5d: The apparatus of example 4d, wherein the circuitry comprises: a first 5-input minority gate which includes: a first input to receive an inverted output of the first 3-input minority gate; a second input to receive an inverted output of the second 3-input minority gate; a third input to receive an inverted output of the third 3-input minority gate; a fourth input to receive an inverted output of the first 5-input minority gate; and a fifth input to receive an inverted output of the first 5-input minority gate.

Example 6d: The apparatus of example 5d, wherein the circuitry comprises: a fourth 3-input minority gate which includes: a first input to receive a sum false output of the two sum outputs; a second input to receive a sum true output of the two sum outputs; and a third input coupled to the supply rail.

Example 7d: The apparatus of example 6d, wherein the circuitry comprises: a fifth 3-input minority gate which includes: a first input to receive a carry false output of the two carry outputs; a second input to receive a carry true output of the two carry outputs; and a third input coupled to the supply rail.

Example 8d: The apparatus of example 7d, wherein the circuitry comprises: a second 5-input minority gate which includes: a first input to receive an inverted output of the fourth 3-input minority gate; a second input to receive the inverted output of the first 5-input minority gate; a third input to receive an inverted output of the fifth 3-input minority gate; a fourth input to receive an inverted output of the second 5-input minority gate; and a fifth input to receive an inverted output of the second 5-input minority gate.

Example 9d: The apparatus of example 8d, wherein the circuitry comprises: a NOR gate to receive a reset and the inverted output of the second 5-input minority gate, wherein an output of the NOR gate is used to generate the first acknowledgement output, the second acknowledgement output, and the third acknowledgement output.

Example 10d: The apparatus of example 1d, wherein the majority and/or minority gates are implemented as CMOS gates, MESO gates, or quantum cellular automata.

Example 11d: The apparatus of example 1d, wherein the majority and/or minority gates are implemented capacitive-input circuits.

Example 12d: An apparatus comprising: a plurality of minority gates to perform a minority function on a pair of inputs, carry inputs, sum outputs, and carry outputs; and a NOR gate coupled to a minority gate of the plurality of minority gates, wherein the NOR gate is to receive an output from the plurality of minority gates, wherein an output of the NOR gate includes acknowledgement signals for the pair of inputs and an acknowledgement signal associated with the carry inputs.

Example 13d: The apparatus of example 12d, wherein the NOR gate receives a reset input.

Example 14d: The apparatus of example 12d, wherein the plurality of minority gates is implemented as CMOS gates, MESO gates, or quantum cellular automata.

Example 15d: The apparatus of example 12d, wherein the plurality of minority gates is implemented capacitive-input circuits.

Example 16d: The apparatus of example 15d, wherein the capacitive-input circuits comprise capacitors having ferroelectric or paraelectric material.

Example 17d: A system comprising: a processor circuitry to execute one or more instructions; a memory to store the one or more instructions; and a communication interface to allow the processor circuitry to communicate with another device, wherein the processor circuitry includes a full-adder which comprises: a plurality of minority gates to perform a minority function on a pair of inputs, carry inputs, sum outputs, and carry outputs; and a NOR gate coupled to a minority gate of the plurality of minority gates, wherein the NOR gate is to receive an output from the plurality of minority gates, wherein an output of the NOR gate are acknowledgement signals for the pair of inputs and an acknowledgement signal associated with the carry inputs.

Example 18d: The system of example 17d, wherein the full-adder comprises a NOR gate that receives a reset input.

Example 19d: The system of example 17d, wherein the plurality of minority gates is implemented as CMOS gates, MESO gates, or quantum cellular automata.

Example 20d: The system of example 17d, wherein the plurality of minority gates is implemented capacitive-input circuits.

Example 1e: An apparatus comprising: a first data channel comprising two first inputs and a first acknowledgement output; a second data channel comprising two second inputs and a second acknowledgement output; a third data channel comprising two carry inputs and a third acknowledgement output; a fourth data channel comprising two carry outputs and a third acknowledgement input; a fifth data channel comprising two sum outputs and a fourth acknowledgement input; and a full-adder coupled to the first data channel, the second data channel, the third data channel, the fourth data channel, and the fifth data channel, wherein the full-adder comprises majority and/or minority gates some of which receive the two first inputs, the two second inputs, the two carry inputs, the third acknowledgement input, and the fourth acknowledgement input, and generate controls to control gates of transistors, wherein the transistors are coupled to generate the two carry outputs, the two sum outputs, the first acknowledgement output, the second acknowledgement output, and the third acknowledgement output.

Example 2e: The apparatus of example 1e, wherein the full-adder comprises a circuitry to generate a sum true output of the two sum outputs.

Example 3e: The apparatus of example 2e, wherein the circuitry comprises: a p-type transistor coupled to a supply rail; a first n-type transistor coupled in series with the p-type transistor; and a 3-input minority gate having an output coupled to gate terminals of the p-type transistor and the first n-type transistor.

Example 4e: The apparatus of example 3e, wherein the 3-input minority gate has: a first input to receive the fourth acknowledgement input; a second input to receive an enable signal; and a third input coupled to the output of the 3-input minority gate.

Example 5e: The apparatus of example 3e, wherein the circuitry comprises: a second n-type transistor coupled in series with the first n-type transistor, and to a ground supply rail; and a first 5-input minority gate having an output that couples to a gate terminal of the second n-type transistor.

Example 6e: The apparatus of example 5e, wherein the first 5-input minority gate includes: a first input to receive a first true carry input of the two carry inputs; a second input to receive a first false input of the two first inputs; a third input to receive a first false input of the two second inputs; a fourth input coupled to the ground supply rail; and a fifth input coupled to the ground supply rail.

Example 7e: The apparatus of example 3e, wherein the circuitry comprises: a third n-type transistor coupled in series with the first n-type transistor, and to a ground supply rail; and a second 5-input minority gate having an output that couples to a gate terminal of the third n-type transistor.

Example 8e: The apparatus of example 7e, wherein the second 5-input minority gate includes: a first input to receive a first true carry input of the two carry inputs; a second input to receive a first true input of the two first inputs; a third input to receive a first true input of the two second inputs; a fourth input coupled to the ground supply rail; and a fifth input coupled to the ground supply rail.

Example 9e: The apparatus of example 3e, wherein the circuitry comprises: a fourth n-type transistor coupled in series with the first n-type transistor, and to a ground supply rail; and a third 5-input minority gate having an output that couples to a gate terminal of the fourth n-type transistor.

Example 10e: The apparatus of example 9e, wherein the third 5-input minority gate includes: a first input to receive a first false carry input of the two carry inputs; a second input to receive a first false input of the two first inputs; a third input to receive a first true input of the two second inputs; a fourth input coupled to the ground supply rail; and a fifth input coupled to the ground supply rail.

Example 11e: The apparatus of example 3e, wherein the circuitry comprises: a fifth n-type transistor coupled in series with the first n-type transistor, and to a ground supply rail; and a fourth 5-input minority gate having an output that couples to a gate terminal of the fifth n-type transistor.

Example 12e: The apparatus of example 11e, wherein the fourth 5-input minority gate includes: a first input to receive a first false carry input of the two carry inputs; a second input to receive a first true input of the two first inputs; a third input to receive a first false input of the two second inputs; a fourth input coupled to the ground supply rail; and a fifth input coupled to the ground supply rail.

Example 13e: The apparatus of example 1e, wherein the majority and/or minority gates are implemented as CMOS gates, MESO gates, or quantum cellular automata.

Example 14e: The apparatus of example 1e, wherein the majority and/or minority gates are implemented capacitive-input circuits.

Example 15e: The apparatus of example 3e, wherein the circuitry comprises an inverter coupled to the p-type transistor and the first n-type transistor, wherein an output of the inverter is the sum true output.

Example 16e: An apparatus comprising: a first circuitry comprising a minority gate that receives a sum acknowledgement input and an enable, and generates an output to control a p-type transistor and a first n-type transistor coupled in series, wherein the first circuitry includes an inverter coupled to the p-type transistor and the first n-type transistor, wherein an output of the inverter is a sum true output; and a second circuitry comprising a plurality of second n-type transistors coupled in parallel, wherein the plurality of second n-type transistors are coupled to the first n-type transistor in series, wherein an individual n-type transistor of the plurality of second n-type transistors is controlled by a majority gate according to a carry-in true input or a carry-in false input, a first true input or a first false input, and a second true input or a second false input.

Example 17e: The apparatus of example 16e, wherein the minority gate and the majority gate are implemented as CMOS gates, MESO gates, or quantum cellular automata.

Example 18e: The apparatus of example 16e, wherein the minority gate and the majority gate are implemented capacitive-input circuits.

Example 19e: A system comprising: a processor circuitry to execute one or more instructions; a memory to store the one or more instructions; and a communication interface to allow the processor circuitry to communicate with another device, wherein the processor circuitry includes a full-adder which comprises: a first circuitry comprising a minority gate that receives a sum acknowledgement input and an enable, and generates an output to control a p-type transistor and a first n-type transistor coupled in series, wherein the first circuitry includes an inverter coupled to the p-type transistor and the first n-type transistor, wherein an output of the inverter is a sum true output; and a second circuitry comprising a plurality of second n-type transistors coupled in parallel, wherein the plurality of second n-type transistors are coupled to the first n-type transistor in series, wherein an individual n-type transistor of the plurality of second n-type transistors is controlled by a majority gate according to a carry-in true input or a carry-in false input, a first true input or a first false input, and a second true input or a second false input.

Example 20e: The system of example 19e, wherein the minority gate and the majority gate are implemented as CMOS gates, MESO gates, or quantum cellular automata, or wherein the minority gate and the majority gate are implemented capacitive-input circuits.

Example 1f: An apparatus comprising an asynchronous adder having capacitive input circuits, wherein the capacitive input circuits include capacitors having non-linear polar material. In some embodiments, the non-linear polar material includes one of ferroelectric material or paraelectric material.

Example 2f: The apparatus of example 1f, wherein the ferroelectric material includes one or more of: bismuth ferrite (BFO) or BFO with a first doping material where in the first doping material is one of lanthanum or elements from lanthanide series of periodic table; lead zirconium titanate (PZT) or PZT with a second doping material, wherein the second doping material is one of La or Nb; a relaxor ferroelectric which includes one of lead magnesium niobate (PMN), lead magnesium niobate-lead titanate (PMN-PT), lead lanthanum zirconate titanate (PLZT), lead scandium niobate (PSN), barium titanium-bismuth zinc niobium tantalum (BT-BZNT), or barium titanium-barium strontium titanium (BT-BST); a perovskite which includes one of: BaTiO3, PbTiO3, KNbO3, or NaTaO3; a hexagonal ferroelectric which includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), zirconium (Zr), aluminum (Al), silicon (Si), their oxides, or their alloyed oxides; hafnium oxides as Hf(1-x)ExOy. where E can be Al, Ca, Ce, Dy, Er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, lithium iron tantalum oxy fluoride, barium strontium niobate, sodium barium niobate, or potassium strontium niobate; or an improper ferroelectric which includes one of: [PTO/STO]n or [LAO/STO]n, where 'n' is between 1 and 100.

Example 3f: The apparatus of example 1f, wherein the paraelectric material includes one or more of: SrTiO3, Ba(x)Sr(y)TiO3 (where x is -0.5, and y is 0.95), HfZrO2, Hf—Si—O, BaTiO3, La-substituted PbTiO3, lead zirconate titanate, or PMN-PT (lead magnesium niobate-lead titanate) based relaxor ferroelectrics.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first data channel comprising two first inputs and a first acknowledgement output;
   a second data channel comprising two second inputs and a second acknowledgement output;
   a third data channel comprising two carry inputs and a third acknowledgement output;
   a fourth data channel comprising two carry outputs and a third acknowledgement input;
   a fifth data channel comprising two sum outputs and a fourth acknowledgement input; and
   a full-adder coupled to the first data channel, the second data channel, the third data channel, the fourth data channel, and the fifth data channel, wherein the full-adder comprises majority and/or minority gates some of which receive the two first inputs, the two second inputs, the two carry inputs, the third acknowledgement input, and the fourth acknowledgement input, and generate controls to control gates of transistors, wherein the transistors are coupled to generate the two carry outputs, the two sum outputs, the first acknowledgement output, the second acknowledgement output, and the third acknowledgement output, and wherein the full-adder comprises a circuitry to generate a sum false output of the two sum outputs.

2. The apparatus of claim 1, wherein the circuitry comprises:
   a p-type transistor coupled to a supply rail;
   a first n-type transistor coupled in series with the p-type transistor; and
   a 3-input minority gate having an output coupled to gate terminals of the p-type transistor and the first n-type transistor.

3. The apparatus of claim 2, wherein the 3-input minority gate includes:
   a first input to receive the fourth acknowledgement input;
   a second input to receive an enable signal; and
   a third input coupled to the output of the 3-input minority gate.

4. The apparatus of claim 2, wherein the circuitry comprises:
   a second n-type transistor coupled in series with the first n-type transistor, and to a ground supply rail; and
   a first 5-input majority gate having an output that couples to a gate terminal of the second n-type transistor.

5. The apparatus of claim 4, wherein the first 5-input majority gate includes:
   a first input to receive a first false carry input of the two carry inputs;
   a second input to receive a first false input of the two first inputs;
   a third input to receive a first false input of the two second inputs;
   a fourth input coupled to the ground supply rail; and
   a fifth input coupled to the ground supply rail.

6. The apparatus of claim 2, wherein the circuitry comprises:
   a third n-type transistor coupled in series with the first n-type transistor, and to a ground supply rail; and
   a second 5-input majority gate having an output that couples to a gate terminal of the third n-type transistor.

7. The apparatus of claim 6, wherein the second 5-input majority gate includes:
   a first input to receive a first false carry input of the two carry inputs;
   a second input to receive a first true input of the two first inputs;
   a third input to receive a first true input of the two second inputs;
   a fourth input coupled to the ground supply rail; and
   a fifth input coupled to the ground supply rail.

8. The apparatus of claim 2, wherein the circuitry comprises:
   a fourth n-type transistor coupled in series with the first n-type transistor, and to a ground supply rail; and
   a third 5-input majority gate having an output that couples to a gate terminal of the fourth n-type transistor.

9. The apparatus of claim 8, wherein the third 5-input majority gate includes:
   a first input to receive a first true carry input of the two carry inputs;
   a second input to receive a first false input of the two first inputs;
   a third input to receive a first true input of the two second inputs;
   a fourth input coupled to the ground supply rail; and
   a fifth input coupled to the ground supply rail.

10. The apparatus of claim 2, wherein the circuitry comprises:
    a fifth n-type transistor coupled in series with the first n-type transistor, and to a ground supply rail; and
    a fourth 5-input majority gate having an output that couples to a gate terminal of the fifth n-type transistor.

11. The apparatus of claim 10, wherein the fourth 5-input majority gate includes:
    a first input to receive a first true carry input of the two carry inputs;
    a second input to receive a first true input of the two first inputs;

a third input to receive a first false input of the two second inputs;
a fourth input coupled to the ground supply rail; and
a fifth input coupled to the ground supply rail.

12. The apparatus of claim 1, wherein the majority and/or minority gates are implemented as CMOS gates, MESO gates, or quantum cellular automata.

13. The apparatus of claim 1, wherein the majority and/or minority gates are implemented capacitive-input circuits.

14. The apparatus of claim 2, wherein the circuitry comprises an inverter coupled to the p-type transistor and the first n-type transistor, and wherein an output of the inverter is the sum false output.

* * * * *